(12) United States Patent
Funahashi

(10) Patent No.: US 12,102,007 B2
(45) Date of Patent: Sep. 24, 2024

(54) THERMOELECTRIC CONVERSION MODULE

(71) Applicant: NATIONAL INSTITUTE OF ADVANCED INDUSTRIAL SCIENCE AND TECHNOLOGY, Tokyo (JP)

(72) Inventor: Ryoji Funahashi, Ikeda (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 42 days.

(21) Appl. No.: 17/759,843

(22) PCT Filed: Jan. 26, 2021

(86) PCT No.: PCT/JP2021/002616
§ 371 (c)(1),
(2) Date: Jul. 29, 2022

(87) PCT Pub. No.: WO2021/153550
PCT Pub. Date: Aug. 5, 2021

(65) Prior Publication Data
US 2023/0157174 A1     May 18, 2023

(30) Foreign Application Priority Data

Jan. 31, 2020   (JP) ................... 2020-014964

(51) Int. Cl.
*H10N 10/817*    (2023.01)
*H10N 10/01*     (2023.01)
(Continued)

(52) U.S. Cl.
CPC ........... *H10N 10/817* (2023.02); *H10N 10/01* (2023.02); *H10N 10/17* (2023.02); *H10N 10/853* (2023.02)

(58) Field of Classification Search
CPC .... H01N 10/817; H01N 10/17; H01N 10/653; H01N 10/01
See application file for complete search history.

(56) References Cited

U.S. PATENT DOCUMENTS

2007/0125412 A1   6/2007  Funahashi
2012/0174955 A1*  7/2012  Hwang ................. H10N 10/17
                                                136/203
(Continued)

FOREIGN PATENT DOCUMENTS

JP    11-274577 A    10/1999
JP    2005-019713 A   1/2005
(Continued)

OTHER PUBLICATIONS

International Search Report in PCT/JP2021/002616 issued Apr. 27, 2021.
(Continued)

*Primary Examiner* — Jayne L Mershon
(74) *Attorney, Agent, or Firm* — Knobbe, Martens, Olson & Bear, LLP

(57) ABSTRACT

This thermoelectric conversion module is formed by electrically connecting, by a conductive member, one end of an n-type thermoelectric conversion element having a negative Seebeck coefficient and having a half-Heusler structure to one end of a p-type thermoelectric conversion element containing an oxide having a positive Seebeck coefficient at a temperature of 25° C. or higher. The conductive member is connected to the n-type thermoelectric conversion element and the p-type thermoelectric conversion element through a connection layer containing a conductive metal comprising silver, and the connection layer is characterized by further containing an oxide to reduce the bond resistance between (Continued)

the n-type thermoelectric conversion element and/or the p-type thermoelectric conversion element.

20 Claims, 14 Drawing Sheets

(51) Int. Cl.
*H10N 10/17* (2023.01)
*H10N 10/853* (2023.01)

(56) References Cited

U.S. PATENT DOCUMENTS

| | | | |
|---|---|---|---|
| 2013/0256608 A1 | 10/2013 | Funahashi et al. | |
| 2015/0035137 A1 | 2/2015 | Nishimoto et al. | |
| 2017/0125658 A1* | 5/2017 | Funahashi | B23K 35/3601 |
| 2021/0175401 A1* | 6/2021 | Arai | H10N 10/01 |

FOREIGN PATENT DOCUMENTS

| | | | |
|---|---|---|---|
| JP | 2005019713 | * | 1/2005 |
| JP | 4595123 | * | 12/2010 |
| JP | 2012-124243 A | | 6/2012 |
| JP | 2013-168431 A | | 8/2013 |
| JP | 2015-115539 A | | 6/2015 |
| JP | 2016-157843 A | | 9/2016 |
| JP | 2016157843 | * | 9/2016 |
| JP | 2019-102808 A | | 6/2019 |
| WO | WO 2005/036661 A1 | | 4/2005 |
| WO | WO 2005/064698 A1 | | 7/2005 |
| WO | WO 2015/174462 A1 | | 11/2015 |

OTHER PUBLICATIONS

Funahashi, Ryoji, et.al., "An Oxide Single Crystal with High Thermoelectric Performance in Air," Jpn. J. Appl. Phys. 39, L1127-11129 (2000).

Funahashi, Ryoji, et.al., "Thermoelectric properties of $Bi_2Sr_2Co_2O_x$ polycrystalline materials", Appl. Phys. Lett., vol. 76, No. 17, pp. 2385-2387 (2000).

Funahashi, Ryoji, et.al., "$Ca_{2.7}Bi_{0.3}Co_4O_9/La_{0.9}Bi_{0.1}NiO_3$ thermoelectric devices with high output power density", Appl. Phys. Lett., vol. 85, No. 6, pp. 1036-1038 (2004).

Urata, Saori, "Power Generation of a p-Type $Ca_3Co_4O_9$/n-Type $CaMnO_3$ Module", Intl. J. Appl. Ceram. Technol., vol. 4, No. 6, pp. 535-540 (2007).

Sakurada, S., et.al., "Effect of Ti substitution on the thermoelectric properties of (Zr,Hf)NiSn half-Heusler compounds", Appl. Phys. Lett., vol. 86, No. 8, pp. 082105-1-082105-3 (2005).

Bartholome, Killian, et.al., "Thermoelectric Modules Based on Half-Heusler Materials Produced in Large Quantities", J. Elec. Mater., vol. 43, No. 6, pp. 1775-1781 (2014).

Extended European Search Report issued for counterpart European Patent Application No. 21746927.9, issued on Dec. 8, 2023.

Zillmann, D. et al., "Thermoelectric Generators Fabricated from Large-Scale-Produced Zr-/Hf-Based Half-Heusler Compounds Using Ag Sinter Bonding", Journal of Electronic Materials, 2019. vol. 48, No. 9, pp. 5363-5374.

* cited by examiner (a)

(b)

Content of $Ag_2O$ in p-type and n-type silver pastes [wt%]

Content of $TiO_2$ in p-type and n-type silver pastes [wt%]

Content of $TiO_2$ in p-type silver paste [wt%]

Content of $Ca_{2.7}Bi_{0.3}Co_4O_9$ in p-type silver paste [wt%]

THERMOELECTRIC CONVERSION MODULE

TECHNICAL FIELD

The present invention relates to a thermoelectric conversion module, and particularly to a thermoelectric conversion module that operates in a wide temperature range from room temperature to about 500° C.

BACKGROUND ART

In our country, the effective energy yield from primary supply energy is about 30%, and about 70% of the energy is discarded as heat into the atmosphere. Heat generated by combustion in factories, waste incineration plants, and the like is also discarded in the atmosphere without being converted into other energy. As described above, human beings wastefully discard a great amount of thermal energy to acquire only a small amount of energy by acts such as combustion of fossil energy.

For improvement in energy efficiency, it is effective to use thermal energy to be discarded in the atmosphere. For this purpose, thermoelectric conversion, which directly converts thermal energy into electric energy, is considered to be an effective means. The thermoelectric conversion utilizes the Seebeck effect, and is an energy conversion method in which a temperature difference between both ends of a thermoelectric conversion material generates a potential difference to generate power.

The power generation using such thermoelectric conversion, that is, the thermoelectric power generation generates electricity only by disposing one end of a thermoelectric conversion material in a high-temperature portion generated by exhaust heat, disposing the other end in the atmosphere or a water-cooled low-temperature portion, and connecting an external resistor to both the ends, and requires no movable device, such as a motor or a turbine, required for general power generation. Therefore, the thermoelectric power generation is inexpensive and usable for a long period of time, discharges no gas due to combustion or the like, and can continuously generate power until the thermoelectric conversion module deteriorates. In addition, since the thermoelectric power generation can generate power at a high power density, the power generator (module) itself can be reduced in size and weight, and can also be used as a mobile power source of mobile phones, notebook personal computers, and the like.

As described above, the thermoelectric power generation is expected to play a part in solving an energy problem that will be concerned in the future, but in order to realize the thermoelectric power generation, a thermoelectric conversion module is required that includes a thermoelectric conversion material having high conversion efficiency, excellent heat resistance, excellent chemical durability, and the like. The thermoelectric conversion module is a power generator in which one or a plurality of p-type thermoelectric conversion materials and one or a plurality of n-type thermoelectric conversion materials are alternately connected in series. However, the development of the thermoelectric conversion module is currently behind the development of the thermoelectric conversion material itself because of difficulty in electrical, chemical, and mechanical bond in a good state between a thermoelectric element (p-type thermoelectric conversion element or n-type thermoelectric conversion element) and an electrode.

As substances that exhibit excellent thermoelectric performance in the high-temperature air, $CoO_2$-based layered oxides such as $Ca_3Co_4O_9$ and $Bi_2Sr_2Co_2O_9$ have been reported (see Non-Patent Documents 1 and 2). These materials are p-type thermoelectric conversion materials.

In order to achieve high efficiency of the thermoelectric conversion module, not only a p-type thermoelectric conversion material but also a high-performance n-type thermoelectric conversion material are required. Thermoelectric conversion modules have been manufactured in which $CaMnO_3$ or $LaNiO_3$ is used as an n-type thermoelectric conversion material having durability even at a high temperature (see Non-Patent Documents 3 and 4). In a thermoelectric conversion module in which an oxide such as $CaMnO_3$ or $LaNiO_3$ is used as an n-type thermoelectric conversion element, the thermoelectric conversion element and a conductive member are bonded together using a conductive paste containing silver, gold, or platinum as a conductive material. However, the power generation performance of such an n-type thermoelectric conversion material is lower than that of a p-type thermoelectric conversion material, and as a result, the module has low power generation efficiency.

As n-type thermoelectric conversion materials that exhibit good thermoelectric conversion performance in the air and have excellent oxidation resistance at room temperature to a high temperature of about 600° C., silicides such as $Mn_3Si_4Al_2$ (see Patent Document 1) and half-Heusler alloys such as TiNiSn and ZrNiSn (see Non-Patent Document 5) have been reported.

Among the above-described thermoelectric conversion materials, half-Heusler alloy thermoelectric conversion materials including TiNiSn or ZrNiSn are materials that exhibit good thermoelectric conversion performance and oxidation resistance even in the air in a temperature range from room temperature to about 500° C.

In thermoelectric conversion modules in which these thermoelectric conversion materials are used as an n-type thermoelectric conversion material, an n-type thermoelectric conversion element and a conductive member are bonded together by copper brazing in vacuum. The output of the thermoelectric conversion module measured in vacuum is 2 $W/cm^2$.

PRIOR ART DOCUMENTS

Patent Documents

Patent Document 1: Japanese Patent Laid-open Publication No. 2012-124243
Patent Document 2: International Publication No. WO 2005/036661
Patent Document 3: International Publication No. WO 2015/174462

Non-Patent Documents

Non-Patent Document 1: R. Funahashi et. al., Jpn. J. Appl. Phys. 39, L1127 (2000).
Non-Patent Document 2: R. Funahashi et. al., Appl. Phys. Lett., Vol. 76, No. 17, pp. 2385 (2000).
Non-Patent Document 3: R. Funahashi et. al., Appl. Phys. Lett., Vol. 85, No. 6, pp. 1036 (2004).
Non-Patent Document 4: S. Urata et. al., Intl. J. Appl. Ceram. Tech., Vol. 4, No. 6, pp. 535 (2007).

Non-Patent Document 5: S. Sakurada et. al., Appl. Phys. Lett., Vol. 86, No. 8, 082105 (2005).

Non-Patent Document 6: K. Bartholome et. al., J. Elec. Mater., Vol. 43, No. 6, pp. 1775 (2014).

SUMMARY OF THE INVENTION

Problems to be Solved by the Invention

However, in a conventional thermoelectric conversion module, a metal material accompanied by melting such as soldering or brazing is used in a connection layer to bond a thermoelectric conversion element and a conductive member together. Solder generally includes an alloy material that melts at 450° C. or lower, and cannot be used in the case of using a thermoelectric module at 500° C. because melting occurs. Brazing generally uses an alloy, called a "brazing material", having a higher melting temperature than solder. The melting point of the brazing material is to be lower than that of the material to be bonded.

As thermoelectric conversion materials having high durability at a high temperature of 500° C., oxide materials, half-Heusler alloys, and silicide materials are known. An electrode material connecting a p-type thermoelectric conversion element and an n-type thermoelectric conversion element in which such a material is used is also to be free of deterioration, such as oxidation, at a high temperature. Therefore, a noble metal such as gold or platinum, or silver can be used, and silver is preferably used in consideration of economic efficiency and the like. As a result, in the case of forming a bond using silver solder, an alloy having a lower melting point than silver is to be used, and a metal such as zinc, copper, or cadmium is generally added to the silver solder. Adding these metals facilitates oxidation at 500° C., leading to difficulty in stable long-term thermoelectric power generation. Therefore, it has been required that a thermoelectric conversion module is used in vacuum or in an inert gas.

In order to achieve low bond resistance between a thermoelectric conversion material and an electrode and achieve strong bond strength against thermal stress with a temperature difference, it is effective to use a bonding material having a composition suitable for the components of the thermoelectric conversion material and the electrode. What can be added for optimizing the composition is a metal because the brazing material is an alloy, and it is difficult to prepare a uniform alloy in an arbitrary solid solution range with addition of an additive. Therefore, optimization of the bonding material is difficult. Furthermore, in brazing, each bond is formed using a burner, and therefore brazing is not suitable for mass production of thermoelectric conversion modules having a large number of bonding portions.

Therefore, the present invention has been made in view of the above circumstances, and an object of the present invention is to provide a thermoelectric conversion module that can maintain excellent performance for a long period of time with almost no decrease in output using a bonding material capable of exhibiting good thermoelectric conversion performance in a temperature range from about 50° C. to about 500° C.

Means for Solving the Problem

The present invention is a thermoelectric conversion module including an n-type thermoelectric conversion element having a half-Heusler structure with a negative Seebeck coefficient, a p-type thermoelectric conversion element including an oxide having a positive Seebeck coefficient at a temperature of 25° C. or higher, a conductive member connecting one end of the n-type thermoelectric conversion element and one end of the p-type thermoelectric conversion element electrically, a connection layer that includes a conductive metal including silver and is interposed between the n-type thermoelectric conversion element and the conductive member, and a connection layer that includes a conductive metal including silver and is interposed between the p-type thermoelectric conversion element and the conductive member, wherein the conductive member is connected to the n-type thermoelectric conversion element via the connection layer interposed between the n-type thermoelectric conversion element and the conductive member and is connected to the p-type thermoelectric conversion element via the connection layer interposed between the p-type thermoelectric conversion element and the conductive member, and the connection layer interposed between the n-type thermoelectric conversion element and the conductive member and/or the connection layer interposed between the p-type thermoelectric conversion element and the conductive member further include an oxide so as to reduce a bond resistance between the n-type thermoelectric conversion element and the connection layer interposed between the n-type thermoelectric conversion element and the conductive member and/or between the p-type thermoelectric conversion element and the connection layer interposed between the p-type thermoelectric conversion element and the conductive member.

According to an embodiment of the present invention (configuration 1), the thermoelectric conversion module includes an n-type thermoelectric conversion element that is represented by $A_xB_y$NiSn (A is Ti or Zr, B is at least one of Hf or Zr when A is Ti, and is at least one of Hf or Ti when A is Zr, and $0.5 \le x \le 1$ and $0 \le y \le 0.5$) and has a half-Heusler structure with a negative Seebeck coefficient, a p-type thermoelectric conversion element that has one end connected to one end of the n-type thermoelectric conversion element, is represented by $Ca_{3-j}Bi_jCo_4O_9$ ($0 \le j \le 0.5$) or $Bi_{2.0+k}M_{2.0+m}Co_2O_9$ (M is at least one of Ca or Sr, $-0.2 \le k \le 0.2$, and $-0.2 \le m \le 0.2$), and includes an oxide having a positive Seebeck coefficient at a temperature of 25° C. or higher, and a conductive member that is connected to the one end of the n-type thermoelectric conversion element and the one end of the p-type thermoelectric conversion element with a silver paste, and the silver paste has a resistivity of 2.60 μΩcm to 13.0 μΩcm as measured with a four probe method.

(Configuration 2) In the configuration 1, the silver paste includes an additive including at least one of silver oxide or titanium oxide, or including the oxide used in the p-type thermoelectric conversion element.

(Configuration 3) In the configuration 1 or 2, the silver paste includes a first silver paste and a second silver paste. The first silver paste is disposed between the one end of the n-type thermoelectric conversion element and the conductive member. The second silver paste is disposed between the one end of the p-type thermoelectric conversion element and the conductive member. The first silver paste includes an additive including at least one of titanium oxide or silver oxide. The second silver paste includes an additive including at least one of titanium oxide or silver oxide, or including the oxide used in the p-type thermoelectric conversion element.

(Configuration 4) In the configuration 3, the second silver paste includes an additive different from the additive included in the first silver paste. (Configuration 5) In the configuration 3, the second silver paste includes the same additive as the first silver paste.

(Configuration 6) In any one of the configurations 3 to 5, the conductive member includes gold, silver, or platinum.

(Configuration 7) In any one of the configurations 1 to 6, a plane, in the p-type thermoelectric conversion element, parallel to a surface in contact with the conductive member has a larger area than a plane, in the n-type thermoelectric conversion element, parallel to a surface in contact with the conductive member.

According to the above, excellent performance can be maintained for a long period of time with almost no decrease in output.

EMBODIMENTS OF THE INVENTION

Figure 1:
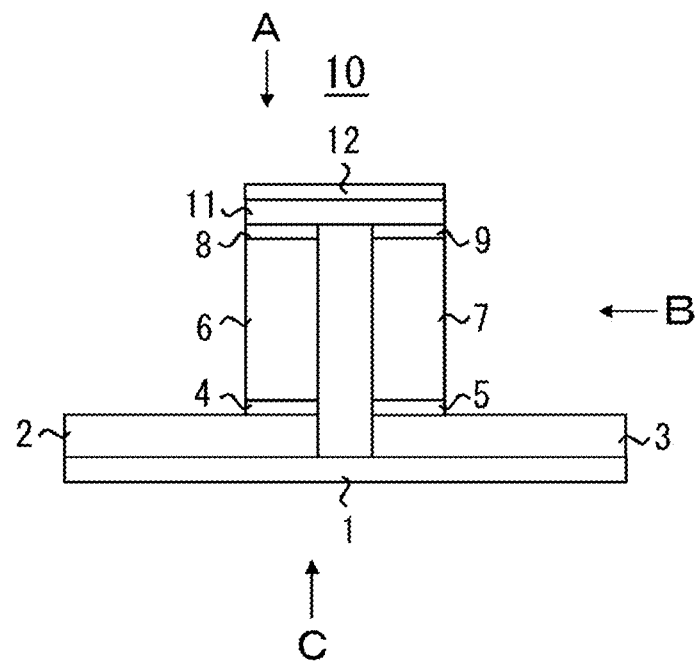
FIG. 1 is a schematic view of a thermoelectric conversion module according to an embodiment of the present invention.
Figure 2:
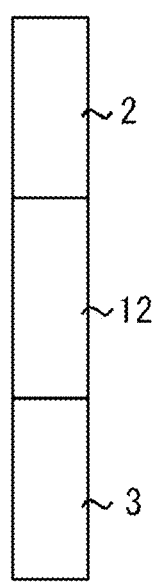
FIG. 2 is a top view of the thermoelectric conversion module viewed from a direction A illustrated in FIG. 1.
Figure 3:
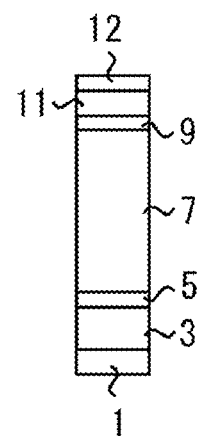
FIG. 3 is a side view of the thermoelectric conversion module viewed from a direction B illustrated in FIG. 1.
Figure 4:
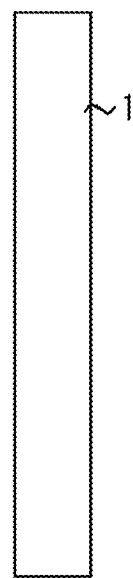
FIG. 4 is a bottom view of the thermoelectric conversion module viewed from a direction C illustrated in FIG. 1.

FIG. 1 is a schematic view of a thermoelectric conversion module according to an embodiment of the present invention. FIG. 2 is a top view of the thermoelectric conversion module viewed from the direction A illustrated in FIG. 1. FIG. 3 is a side view of the thermoelectric conversion module viewed from the direction B illustrated in FIG. 1. FIG. 4 is a bottom view of the thermoelectric conversion module viewed from the direction C illustrated in FIG. 1.

With reference to FIGS. 1 to 4, a thermoelectric conversion module 10 according to an embodiment of the present invention includes insulating substrates 1 and 12, conductive members 2, 3, and 11, connection layers (conductive pastes) 4, 5, 8, and 9, an n-type thermoelectric conversion element 6, and a p-type thermoelectric conversion element 7. The insulating substrates 1 and 12 are electrically insulated (the same applies hereinafter).

The conductive members 2 and 3 are disposed on the insulating substrate 1 in contact with the insulating substrate 1. In this case, the conductive members 2 and 3 are disposed at a predetermined interval from each other. The connection layer (conductive paste) 4 is disposed between the conductive member 2 and the n-type thermoelectric conversion element 6 in contact with the conductive member 2 and the n-type thermoelectric conversion element 6. The connection layer (conductive paste) 5 is disposed between the conductive member 3 and the p-type thermoelectric conversion element 7 in contact with the conductive member 3 and the p-type thermoelectric conversion element 7.

The n-type thermoelectric conversion element 6 is disposed between the connection layer (conductive paste) 4 and the connection layer (conductive paste) 8 in contact with the connection layers (conductive pastes) 4 and 8. The p-type thermoelectric conversion element 7 is disposed between the connection layer (conductive paste) 5 and the connection layer (conductive paste) 9 in contact with the connection layers (conductive pastes) 5 and 9. The connection layer (conductive paste) 8 is disposed between the n-type thermoelectric conversion element 6 and the conductive member 11 in contact with the n-type thermoelectric conversion element 6 and the conductive member 11.

The connection layer (conductive paste) 9 is disposed between the p-type thermoelectric conversion element 7 and the conductive member 11 in contact with the p-type thermoelectric conversion element 7 and the conductive member 11. The conductive member 11 is disposed between the connection layers (conductive pastes) 8 and 9 and the insulating substrate 12 in contact with the connection layers (conductive pastes) 8 and 9 and the insulating substrate 12.

As a result of disposing the conductive members 2, 3, and 11, the connection layers (conductive pastes) 4, 5, 8, and 9, the n-type thermoelectric conversion element 6, and the p-type thermoelectric conversion element 7 as described above, one end of the n-type thermoelectric conversion element 6 and one end of the p-type thermoelectric conversion element 7 are electrically connected to each other via the connection layers (conductive pastes) 8 and 9 and the conductive member 11, the other end of the n-type thermoelectric conversion element 6 is electrically connected to the conductive member 2 via the connection layer (conductive paste) 4, and the other end of the p-type thermoelectric conversion element 7 is electrically connected to the conductive member 3 via the connection layer (conductive paste) 5. That is, the n-type thermoelectric conversion element 6 and the p-type thermoelectric conversion element 7 are electrically connected in series between the conductive member 2 and the conductive member 3.

Each of the insulating substrates 1 and 12 includes an oxide ceramic, a nitride ceramic, or carbide ceramic. For example, each of the insulating substrates 1 and 12 includes any one of aluminum oxide, zirconium oxide, titanium oxide, magnesium oxide, silicon oxide, silicon nitride, aluminum nitride, titanium nitride, and silicon carbide.

Each of the insulating substrates 1 and 12 is not limited to the above materials, and is generally to be any insulating material that does not, for example, melt and break at a temperature higher than the usable range of the thermoelectric conversion module 10 (for example, at about 800° C. in a case where the usable range of the thermoelectric conversion module 10 has an upper limit of 500° C.), is chemically stable and unreactive with the thermoelectric conversion element and the conductive member, and has high thermal conductivity.

By using a substrate having high thermal conductivity as the insulating substrates 1 and 12, the temperature of the high-temperature portions of the n-type thermoelectric conversion element 6 and the p-type thermoelectric conversion element 7 can be brought close to the temperature of the high-temperature heat source to increase the temperature difference, and thus the power output of the thermoelectric conversion module 10 can be improved.

The shapes of the insulating substrates 1 and 12 are not particularly limited, and are to be determined according to the shapes, the sizes, and the like of the high-temperature portion and the low-temperature portion of the thermoelectric conversion module 10. However, in consideration of heat transfer at the high-temperature portion and heat radiation at the low-temperature portion in the thermoelectric conversion module 10, the insulating substrates 1 and 12 preferably have a thickness as thin as possible, and the thickness is most preferably, for example, about 0.1 to 5 mm.

In the thermoelectric conversion module 10, the n-type thermoelectric conversion element 6 and the p-type thermoelectric conversion element 7 may be covered with the insulating substrate 12 having the same dimension as the conductive member 11, instead of covering the n-type thermoelectric conversion element 6 and the p-type thermoelectric conversion element 7 with one insulating substrate having a larger area than the region where the n-type thermoelectric conversion element 6 and the p-type thermoelectric conversion element 7 are disposed.

Each of the connection layers (conductive pastes) 4, 5, 8, and 9 includes any one of a conductive paste including silver, a conductive paste including silver and silver oxide, a conductive paste including silver and titanium oxide, and a conductive paste including silver, silver oxide, and titanium oxide.

Here, the reason why silver oxide or titanium oxide is added to the conductive paste including silver will be described. First, in a case where the conductive paste including silver is solidified to form a bond between the thermoelectric conversion element and silver, a Schottky barrier is formed because the electronic energy states of the thermoelectric conversion element and silver are different from each other (the Fermi levels are different from each other). For this reason, the electric resistance (bond resistance) at the bonding interface increases, leading to an increase in the internal resistance of the thermoelectric conversion module. Therefore, in order to moderate the difference between the Fermi levels, the Fermi level of the conductive paste disposed between the electrode and the thermoelectric conversion element is brought close to the thermoelectric conversion element side Fermi level to reduce the bond resistance. Note that a half-Heusler alloy used in a thermoelectric conversion element also has a surface covered with an oxide film, and it has been found that also in the case of such a half-Heusler alloy, the bond resistance can be reduced by adding a specific metal oxide to the conductive paste. This case will be described in Examples below.

In addition, in a case where the conductive paste including silver forms a bond with the thermoelectric conversion element, the conductive paste enters the uneven portion of the surface of the thermoelectric conversion element, and mechanical bond due to the anchor effect can be obtained after solidification. At the same time, a chemical bond is also obtained in which a metal atom in the thermoelectric conversion element and a silver atom in the conductive paste are bonded together via oxygen. To achieve this state, oxide species that form a strong bond between a metal element in the thermoelectric conversion element and silver in the conductive paste are searched from transition metal oxides that can desorb oxygen by heating or the like, and the composite amount of each oxide species is searched. This case will be also described in Examples below.

The connection layers (conductive pastes) 4 and 8 include a conductive paste for connection of the n-type thermoelectric conversion element 6 to the conductive members 2 and 11 respectively, and the connection layers (conductive pastes) 5 and 9 include a conductive paste for connection of the p-type thermoelectric conversion element 7 to the conductive members 3 and 11 respectively, and therefore the connection layers (conductive pastes) 4 and 8 may include a conductive paste different from the connection layers (conductive pastes) 5 and 9. The connection layers (conductive pastes) 5 and 9 may include a conductive paste including an oxide powder having the same crystal structure as the p-type thermoelectric conversion element 7, and silver.

The conductive metal blended in the conductive paste is only silver, and is usually blended in powder form in the conductive paste. The diameter of the silver powder is not particularly limited, but is 100 μm or less, preferably 50 μm or less, and more preferably 10 μm or less. The silver powder is generally sintered by heating at about 300° C. to 600° C., and the electric resistance is reduced. Also in the case of using a silver paste including such a silver powder in the thermoelectric conversion module, the silver powder is preferably sintered to obtain low electric resistance, but the silver powder is not necessarily to be sintered as long as the electric resistance can be reduced to a required electric resistance without sintering the silver powder. The silver in the silver paste used in Examples described below is sintered at 300° C. or higher. However, the sintering start temperature of the silver may depend on the additive in an embodiment of the present invention and the addition amount of the additive.

The silver oxide blended in the conductive paste is disilver monoxide ($Ag_2O$), and the titanium oxide blended in the conductive paste is any one of titanium dioxide ($TiO_2$), titanium trioxide ($Ti_2O_3$), and titanium monoxide ($TiO$).

Titanium oxide heated in the air becomes titanium dioxide, and therefore titanium dioxide is preferably used in the preparation stage of the conductive paste.

In the case of using each titanium oxide singly, the blending amount of titanium oxide is 0.1 to 10 wt %, and more preferably 0.1 to 6 wt % based on 100 wt % of the conductive paste in a wet state. In the case of using each silver oxide singly, the blending amount of silver oxide is 0.2 to 10 wt %, and more preferably 0.2 to 8 wt % based on 100 wt % of the conductive paste in a wet state. In the case of adding both silver oxide and titanium oxide, the blending amount of each of silver oxide and titanium oxide is 0.5 to 5 wt %, and more preferably 0.5 to 2 wt %.

The silver oxide described above is usually blended in powder form in the conductive paste. The particle size of the silver oxide is not particularly limited, but is 100 μm or less, preferably 50 μm or less, and more preferably 15 μm or less. The particle size of the titanium oxide is also not particularly limited, but is 100 μm or less, preferably 50 μm or less, and more preferably 15 μm or less.

The oxide powder blended in the conductive paste used for connection of the p-type thermoelectric conversion element 7 is not particularly limited as long as the oxide powder has the same crystal structure as the p-type thermoelectric conversion element 7. The oxide powder is to include $Ca_{3-j}Bi_jCo_4O_9$ ($0 \leq j \leq 0.5$) or $Bi_{2.0+k}M_{2.0+m}Co_2O_9$ (M is at least one of Ca or Sr, $-0.2 \leq k \leq 0.2$, and $-0.2 \leq m \leq 0.2$), and preferably has the same composition as the p-type thermoelectric conversion element 7.

The particle size of the oxide powder blended in the conductive paste used for connection of the p-type thermoelectric conversion element 7 is not particularly limited, but is 100 μm or less, preferably 50 μm or less, and more preferably 30 μm or less.

The blending amount of the oxide powder blended in the conductive paste used for connection of the p-type thermoelectric conversion element 7 is 0.1 to 10 wt %, preferably 1 to 8 wt %, and more preferably 3 to 6 wt % based on 100 wt % of the conductive paste in a wet state.

The connection layers (conductive pastes) 4, 5, 8, and 9 may include a glass powder (frit) component, a resin component, a solvent component, and the like other than silver, silver oxide, titanium oxide, and an oxide having the same crystal structure as the p-type thermoelectric conversion element 7 described above.

The glass powder is a component that mainly exhibits a bonding force when the conductive paste is applied to the connection portion and heated. The glass powder generally softens at a temperature of about 450° C. to 700° C. and then solidifies to exhibit a bonding force. Such a glass powder is to be appropriately selected for use from glass components blended in known conductive pastes. For example, bismuth borosilicate glass and lead borosilicate glass can be used. In consideration of environmental and health aspects, lead-free glass components are preferably used. The glass powder in the silver paste used in Examples described below has a softening temperature of about 500° C. However, the softening temperature of the glass may depend on the additive and the addition amount of the additive.

The resin component imparts appropriate dispersibility, thixotropy, viscosity properties, and the like to the conductive paste. Examples of the usable resin component include ethyl cellulose, hydroxyethyl cellulose, methyl cellulose, nitrocellulose, ethyl cellulose derivatives, acrylic resins, butyral resins, alkyd phenol resins, epoxy resins, and wood rosins.

The solvent component is to be a substance that can uniformly disperse all of the above-described components, has an appropriate viscosity so as, for example, not to drip during and after application, and is decomposed or dissipated by heating and is liquid at room temperature. Examples of the usable solvent component include toluene, cyclohexane, isopropyl alcohol, diethylene glycol acetate monobutyl ether (butyl carbitol acetate), and terpineol.

The blending ratio of each of these components is not limited, and is to be appropriately determined according to the intended conductivity, thermal expansion coefficient, bonding force, viscosity properties, and the like. The content of the glass component can be, for example, about 0.5 to 50 wt % based on 100 wt % of silver, and may be outside this range.

The content of the resin component is also not particularly limited, and is to be appropriately determined within a range in which appropriate workability or adhesiveness can be exhibited. The content can be, for example, about 0.5 to 50 wt % based on 100 wt % of silver, and may be outside this range. The content of the solvent component can be about 10 to 100 wt % based on 100 wt % of silver, and may be outside this range.

Furthermore, the connection layers (conductive pastes) 4, 5, 8, and 9 may include a plasticizer, a lubricant, an antioxidant, a viscosity modifier, and the like blended in a known conductive paste.

The method for adjusting the connection layers (conductive pastes) 4, 5, 8, and 9 is not particularly limited, and examples of the method include a method in which at least one of silver, silver oxide, titanium oxide, or an oxide having the same crystal structure as the p-type thermoelectric conversion element 7 is mixed, then another component is added, and the resulting mixture is kneaded, and a method in which at least one of silver oxide, titanium oxide, or an oxide having the same crystal structure as the p-type thermoelectric conversion element 7 is kneaded with a commercially available paste including silver.

Except for a case where an oxide having the same crystal structure as the p-type thermoelectric conversion element 7 is included, the connection layers (conductive pastes) 4, 5, 8, and 9 can also be used when any of the n-type thermoelectric conversion element including an alloy having a half-Heusler structure and the p-type thermoelectric conversion element including an oxide is connected to the conductive member.

Meanwhile, the connection layers (conductive pastes) 4, 5, 8, and 9 including an oxide having the same crystal structure as the p-type thermoelectric conversion element 7 can be used when the p-type thermoelectric conversion element including an oxide is connected to the conductive member.

By bonding the thermoelectric conversion element to the conductive member using the connection layers (conductive pastes) 4, 5, 8, and 9, sufficient bonding strength in addition to appropriate conductivity can be imparted to the bonding portion of the thermoelectric conversion element. Even when power generation at a high temperature is repeated, separation does not occur, or the components included in the connection layers (conductive pastes) 4, 5, 8, and 9 do not diffuse into the thermoelectric conversion material widely, and good thermoelectric conversion performance can be maintained for a long period of time.

The conductive members 2, 3, and 11 are to include a material having a sufficiently lower electric resistance value than the n-type thermoelectric conversion element 6 and the p-type thermoelectric conversion element 7. The conductive members 2, 3, and 11 preferably have a sheet shape because higher thermal conduction is preferable and a shape is preferable such that the connection surfaces of the n-type thermoelectric conversion element 6 and the p-type thermoelectric conversion element 7 are covered. As the conductive members 2, 3, and 11, a metal thin film (or a metal layer) formed on one surface of an insulating ceramic substrate or the like, a conductive ceramic substrate, and a metal plate (or a metal substrate) can be used.

Among them, as the metal in the conductive metal layer or the conductive metal substrate, a metal is to be used that is not oxidized or melted at the operating temperature of the thermoelectric conversion module 10, and in consideration of stability at high temperature, for example, a noble metal can be used, or a metallic material can be used that includes, for example, an alloy including a noble metal at a content of about 30 wt % or more, and preferably about 70 wt % or more. Examples of the noble metal include silver, gold, platinum, and palladium. As the conductive metal disposed on the low temperature side during thermoelectric power generation, a base metal also can be used other than the above-described noble metals. Examples of the base metal include copper, iron, titanium, and aluminum.

As the conductive ceramic, a material is preferable that does not deteriorate in the air at a high temperature of about 500° C. and can maintain low electric resistance over a long period of time. As the conductive ceramic, for example, an oxide sintered body can be used that has a low electric resistivity. Examples of such an oxide sintered body include $LaNiO_3$ and $RuO_3$.

The oxide sintered body is manufactured as follows. The raw material substances are mixed and fired so as to have the same elemental component ratio as that in the intended oxide, and thus the oxide sintered body can be manufactured. The oxide sintered body can be generally manufactured with a solid phase reaction method.

The firing temperature and the firing time are to be set to the conditions under which the intended oxide is formed, and are not particularly limited. For example, the firing time is about 10 to 40 hours in a temperature range of about 700 to 1,000° C.

In the case of using a carbonate, an organic compound, or the like as the raw material substance, the raw material substance is preferably decomposed in advance by calcination before firing and then fired to form the intended oxide. For example, in the case of using a carbonate as the raw material substance, the carbonate is to be calcined at about 700 to 900° C. for about 10 hours, and then fired under the above-described conditions.

The firing means is not particularly limited, and any means such as an electric heating furnace or a gas heating furnace can be used. The firing atmosphere is usually to be an oxidizing atmosphere. Examples of the oxidizing atmosphere include an oxygen flow and an air atmosphere. In the case of a raw material substance containing a sufficient amount of oxygen, the raw material substance can be fired, for example, in an inert atmosphere.

For preparing the intended oxide with a solid phase reaction method, the raw material powder is preferably fired as a press-molded body in order to efficiently progress the solid phase reaction. The obtained sintered body is processed and molded by cutting, grinding, and polishing into a conductive member to be supplied to the thermoelectric conversion module 10.

The dimensions of the conductive members 2, 3, and 11 are to be determined according to the thermoelectric conversion elements (the n-type thermoelectric conversion element 6 and the p-type thermoelectric conversion element 7), the amount of power generation, and the like, and it is preferable to widely cover the connection surfaces of the thermoelectric conversion elements (the n-type thermoelectric conversion element 6 and the p-type thermoelectric conversion element 7).

In the case of imparting conductivity to the surface of an insulating ceramic, an insulating ceramic that is not oxidized even in the air at a high temperature of about 500° C. is combined with a conductive material. For example, as the insulating ceramic, a substrate can be used that includes an oxide ceramic such as alumina or a nitride ceramic such as aluminum nitride. The metal coating formed on the insulating ceramic is, for example, coating with a noble metal or an alloy of a noble metal. The noble metal is, for example, silver, gold, or platinum. The metal coating is to be formed with a method such as a vapor deposition method for coating with a noble metal or an alloy of a noble metal or a method in which a conductive paste including a noble metal (or coating with an alloy) is applied.

As the conductive members 2, 3, and 11, materials having low electric resistance are preferable in order to increase the output from the thermoelectric conversion module 10, and from the viewpoint of workability, sheet-shaped metals are preferable that are materials flexible and less likely to break, and silver sheets are particularly preferable from the viewpoint of price, electric resistivity, and thermal conductivity.

The length, the width, the thickness, and the like of the conductive members 2, 3, and 11 are to be appropriately set according to the size, the electric resistivity, the thermal conductivity, and the like of the thermoelectric conversion elements (the n-type thermoelectric conversion element 6 and the p-type thermoelectric conversion element 7). The thickness is preferably as small as possible because the thermal conduction is to be high in order to efficiently transfer heat from the heat source to the high-temperature portions of the thermoelectric conversion elements (the n-type thermoelectric conversion element 6 and the p-type thermoelectric conversion element 7) and in order to efficiently dissipate heat from the low-temperature portions. For example, it is particularly preferable to use a silver sheet having a thickness of about 0.01 to 3 mm as the conductive members 2, 3, and 11.

The n-type thermoelectric conversion element 6 is represented by the following formula (1) and includes an alloy having a half-Heusler structure having a negative Seebeck coefficient.

$$A_xB_yNiSn \qquad (1)$$

[In the formula (1), A is Ti or Zr, B is at least one of Hf or Zr when A is Ti, and is at least one of Hf or Ti when A is Zr, and $0.5 \leq x \leq 1$ and $0.0 \leq y \leq 0.5$.]

More specifically, the n-type thermoelectric conversion element 6 is represented by any one of the following formulae (2) to (7) and includes an alloy having a half-Heusler structure having a negative Seebeck coefficient.

$$Ti_{1-a}Hf_aNiSn \quad (2)$$

[In the formula (2), $0.0 \le a \le 0.5$.]

$$Ti_{1-b}Zr_bNiSn \quad (3)$$

[In the formula (3), $0.0 \le b \le 0.5$.]

$$Zr_{1-c}Hf_cNiSn \quad (4)$$

[In the formula (4), $0.0 \le c \le 0.5$.]

$$Zr_{1-d}Ti_dNiSn \quad (5)$$

[In the formula (5), $0.0 \le d \le 0.5$.]

$$Zr_{1-e-f}Ti_eHf_fNiSn \quad (6)$$

[In the formula (6), $0.0 \le e \le 0.25$ and $0.0 \le f \le 0.25$.]

$$Ti_{1-g-h}Zr_gHf_hNiSn \quad (7)$$

[In the formula (7), $0.0 \le g \le 0.25$ and $0.0 \le h \le 0.25$.]

The alloy having a half-Heusler structure represented by any of the formulae (2) to (7) has a negative Seebeck coefficient in a temperature range of 25° C. to 500° C., and has excellent oxidation resistance in the air in a temperature range of 500° C. or lower.

The alloy having a half-Heusler structure represented by any of the formulae (2) to (7) has an electric resistivity of 5 mΩ·cm or less in a temperature range of 100° C. to 500° C.

Therefore, the alloy having a half-Heusler structure represented by any of the formulae (2) to (7) can exhibit excellent thermoelectric conversion performance as a material of the n-type thermoelectric conversion element 6 in the above-described temperature range.

Figure 5:
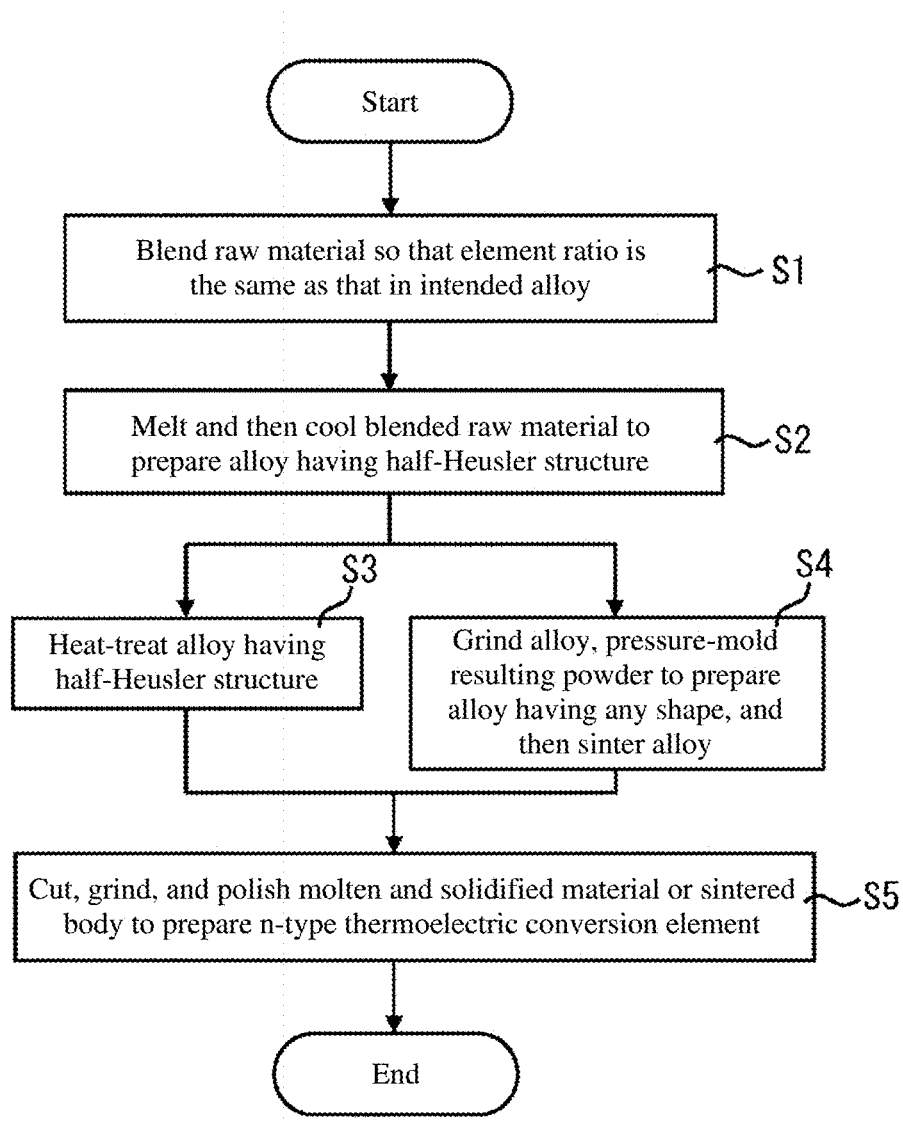
FIG. 5 is a process chart showing a method for manufacturing an n-type thermoelectric conversion element.

FIG. 5 is a process chart showing a method for manufacturing the n-type thermoelectric conversion element 6. With reference to FIG. 5, when manufacture of the n-type thermoelectric conversion element 6 is started, a raw material is blended so that the element ratio is the same as that in the intended alloy (step S1). As the raw material, a single metal, an intermetallic compound or solid solution including a plurality of component elements, and a composite (alloy or the like) of an intermetallic compound (or solid solution) can be used.

After the step S1, the blended raw material is melted and then cooled to prepare an alloy having a half-Heusler structure (step S2). The method for melting the raw material is not particularly limited, and for example, arc melting and induction heating can be used. The melting temperature is higher than the melting points of the raw material phase and the generated phase. The atmosphere at the time of melting is preferably a non-oxidizing atmosphere such as an atmosphere of an inert gas such as helium or argon, a reduced pressure atmosphere, or vacuum in order to avoid oxidation of the raw material.

After the step S2, the alloy having a half-Heusler structure is heat-treated (step S3). The heat treatment condition depends on the kind, the amount, and the like of the metal element included in the alloy. For example, the alloy is preferably heat-treated at a temperature of about 1,000 to 1,300° C. By heat-treating an alloy having a half-Heusler structure, a further uniform alloy can be prepared, and the performance as a thermoelectric conversion material can be improved.

After the step S2, instead of the step S3, an alloy having a half-Heusler structure is ground, the resulting powder is pressure-molded to prepare an alloy having an any shape, and then the alloy is sintered (step S4). By uniaxial pressing during heating, such as hot pressing or electric current sintering (that is, spark plasma sintering (SPS)), at the time of firing, a sintered body having a high sintered density can be obtained, so that a sintered body having a low electric resistivity and a high breaking strength can be obtained. In addition, the solid phase reaction is promoted, and a further uniform sintered body can be obtained in a short time. The atmosphere at the time of sintering is preferably a non-oxidizing atmosphere in order to avoid oxidation of the alloy having a half-Heusler structure.

After the step S3 or step S4, the molten and solidified material or the sintered body is cut, ground, and polished to prepare an n-type thermoelectric conversion element 6 (step S5). The size of the n-type thermoelectric conversion element 6 is to be determined according to the size of the thermoelectric conversion module 10, the amount of power generation, and the like, and is generally to be a quadrangular prism having a side of about 0.5 to 30 mm and a length of about 0.5 to 100 mm, or a cylinder having a diameter of about 0.5 to 30 mm and a length of about 0.5 to 100 mm. Upon completion of the step S5, the manufacture of the n-type thermoelectric conversion element 6 is completed.

In the process chart shown in FIG. 5, at the stage of pressure-molding the powder before sintering in the step S4, the powder may be molded so as to obtain the final shape and the final dimension of the n-type thermoelectric conversion element 6, and then sintered without executing the step S5 after the step S4.

In the process chart shown in FIG. 5, in the case of manufacturing the n-type thermoelectric conversion element 6 with the steps S1, S2, S3, and S5, the step S3 may be not executed.

The p-type thermoelectric conversion element 7 is represented by the following formula (8) or (9), and includes an oxide having a positive Seebeck coefficient at a temperature of 25° C. or higher.

$$Ca_{3-j}Bi_jCo_4O_9 \quad (8)$$

[In the formula (8), $0.0 \le j \le 0.5$.]

$$Bi_{2.0+k}M_{2.0+m}Co_2O_9 \quad (9)$$

[In the formula (9), M represents at least one element of Ca or Sr, and $-0.2 \le k \le 0.2$ and $-0.2 \le m \le 0.2$.]

The oxide represented by the formula (8) has a structure obtained by alternately stacking $CoO_2$ layers in which six oxygen elements (O) are octahedrally coordinated to one cobalt element (Co) and the octahedrons are two-dimensionally arranged so as to share the sides, and layers having a rock salt structure with a composition ratio of $(Ca,Bi)_2CoO_3$ including Ca, Bi, Co, and O.

The oxide represented by the formula (9) has a structure obtained by alternately stacking $CoO_2$ layers in which six oxygen elements (O) are octahedrally coordinated to one cobalt element (Co) and the octahedrons are two-dimensionally arranged so as to share the sides, and layers having a rock salt structure with a composition ratio of $Bi_2M_2O_4$ including Bi, M, and O.

Both oxides have a positive Seebeck coefficient in a temperature range of 25° C. to 700° C., and have excellent oxidation resistance in the air. The oxides have an electric resistivity of 15 mΩ·cm or less in a temperature range of 100° C. to 700° C. Therefore, the oxide represented by the formula (8) or (9) can exhibit excellent thermoelectric conversion performance as a material of the p-type thermoelectric conversion element 7 in the above-described temperature range.

The oxide represented by the formula (8) or (9) is manufactured with a known method such as a single crystal manufacturing method, a powder manufacturing method, or a thin film manufacturing method.

Examples of the single crystal manufacturing method include a flux method, a zone melting method, a pulling method, and a glass annealing method with a glass precursor as an intermediate. Examples of the powder manufacturing method include a solid phase reaction method and a sol-gel method. Examples of the thin film manufacturing method include a sputtering method, a laser ablation method, and a chemical vapor deposition method.

Among the above-described manufacturing methods, the method for manufacturing an oxide with a solid phase reaction method will be described in more detail. The oxide represented by the formula (8) or (9) is manufactured by mixing and firing raw material substances so as to obtain the same elemental component ratio as that in the intended oxide.

The firing temperature and the firing time are to be set to the conditions under which the intended oxide is formed, and are not particularly limited. For example, firing is to be performed for about 10 to 40 hours in a temperature range of about 700 to 1,000° C.

In the case of using a carbonate, an organic compound, or the like as the raw material substance, the raw material substance is preferably decomposed in advance by calcination before firing and then fired to form the intended oxide. For example, in the case of using a carbonate as the raw material substance, the carbonate is to be calcined at about 700 to 900° C. for about 10 hours, and then fired under the above-described conditions.

The firing atmosphere is usually to be an oxidizing atmosphere such as an oxygen flow or an air atmosphere, but in the case of a raw material substance containing a sufficient amount of oxygen, the raw material substance may be fired, for example, in an inert atmosphere. The amount of oxygen in the oxide to be generated can be controlled by the oxygen partial pressure, the firing temperature, the firing time, and the like at the time of firing, and the oxygen ratio in the formula (8) or (9) can be increased as the oxygen partial pressure is higher.

For preparing the intended oxide with a solid phase reaction method, the raw material powder is preferably fired as a press-molded body in order to efficiently progress the solid phase reaction. The obtained sintered body is processed and molded by cutting, grinding, and polishing into a p-type thermoelectric conversion element 7 to be supplied to the thermoelectric conversion module 10.

The size of the p-type thermoelectric conversion element 7 is to be determined according to the size of the thermoelectric conversion module 10, the amount of power generation, and the like, and is generally to be a quadrangular prism having a side of the cross section of about 0.5 to 30 mm and a length of about 0.5 to 100 mm, or a cylinder having a diameter of about 0.5 to 30 mm and a length of about 0.5 to 100 mm.

Alternatively, in order to obtain a required shape without processing and molding after firing, at the stage of pressure-molding the powder before sintering, the powder may be molded in advance into a shape and a dimension such that the element shape can be obtained after sintering, and sintered.

The raw material substance is not particularly limited as long as an oxide can be formed by firing the raw material, and examples of the usable raw material substance include single metals, oxides, and various compounds (such as carbonates). As a Ca source and a Co source, an alkoxide compound can be used. Examples of the alkoxide compound as a Ca source include calcium oxide (CaO), calcium chloride (CaCl$_2$), calcium carbonate (CaCO$_3$), calcium nitrate (Ca(NO$_3$)$_2$), calcium hydroxide (Ca(OH)$_2$), dimethoxycalcium (Ca(OCH$_3$)$_2$), diethoxycalcium (Ca(OC$_2$H$_5$)$_2$), and dipropoxy calcium (Ca(OC$_3$H$_7$)$_2$).

Examples of the alkoxide compound as a Co source include cobalt oxide (CoO, Co$_2$O$_3$, Co$_3$O$_4$), cobalt chloride (CoCl$_2$), cobalt carbonate (CoCO$_3$), cobalt nitrate (Co(NO$_3$)$_2$), cobalt hydroxide (Co(OH)$_2$), and dipropoxy cobalt (Co(OC$_3$H$_7$)$_2$).

Also as a source of another element of the p-type thermoelectric conversion element 7, an element single body, an oxide, a chloride, a carbonate, a nitrate, a hydroxide, an alkoxide compound, and the like can be similarly used.

As a Ca source and a Co source, a compound may be used that includes two or more kinds of constituent elements of the composite oxide constituting the p-type thermoelectric conversion element 7. Also as a source of another element, a compound may be used that includes two or more kinds of constituent elements of the composite oxide constituting the p-type thermoelectric conversion element 7.

Figure 6:
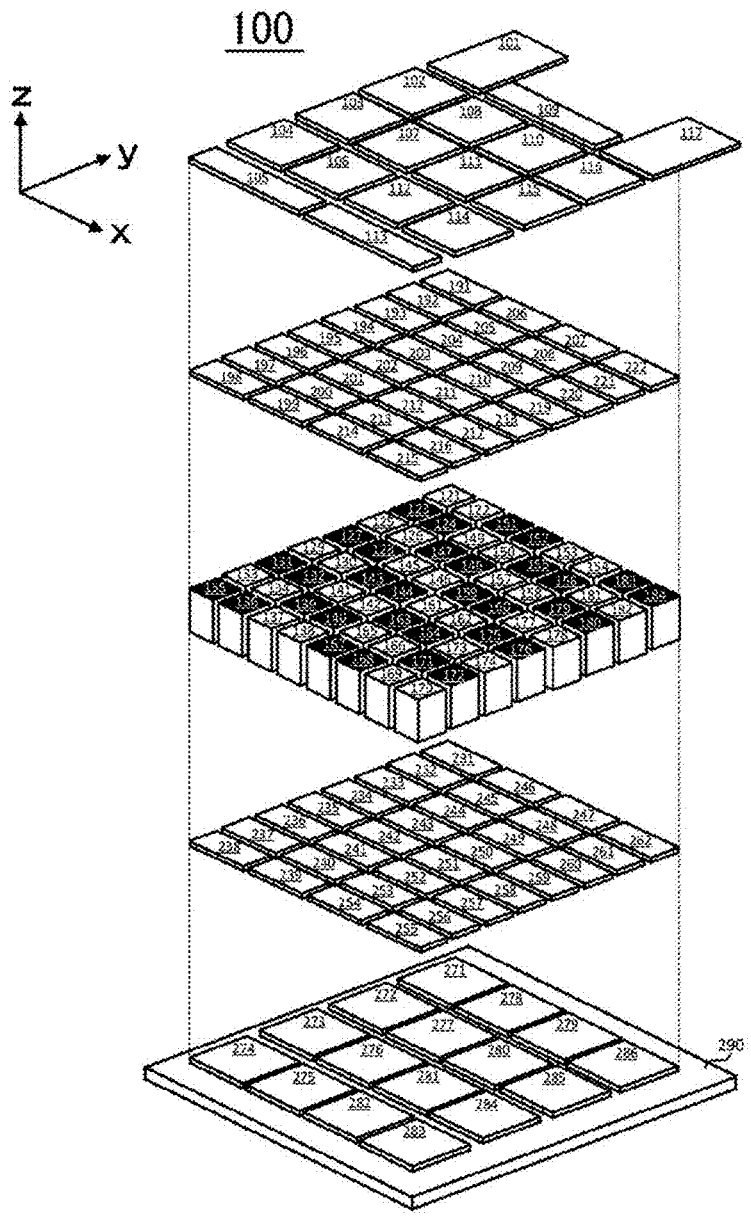
FIG. 6 is an exploded perspective view of another thermoelectric conversion module according to an embodiment of the present invention.

FIG. 6 is an exploded perspective view of another thermoelectric conversion module according to an embodiment of the present invention. A thermoelectric conversion module according to an embodiment of the present invention may be a thermoelectric conversion module 100 shown in FIG. 6.

With reference to FIG. 6, the thermoelectric conversion module 100 includes extraction electrodes 101 and 117, conductive members 102 to 116 and 271 to 286, p-type thermoelectric conversion elements 121, 122, 125, 126, 129, 130, 133, 134, 137, 138, 141, 142, 145, 146, 149, 150, 153, 154, 157, 158, 161, 162, 165, 166, 169, 170, 173, 174, 177, 178, 181, and 182, n-type thermoelectric conversion elements 123, 124, 127, 128, 131, 132, 135, 136, 139, 140, 143, 144, 147, 148, 151, 152, 155, 156, 159, 160, 163, 164, 167, 168, 171, 172, 175, 176, 179, 180, 183, and 184, connection layers 191 to 222 and 231 to 262, and insulating substrate 290. The insulating substrate 290 is electrically insulated (the same applies hereinafter).

The conductive members 102 to 116 are denoted by "conductive members 101+i (i=1 to 15)", and the conductive members 271 to 286 are denoted by "conductive members 270+j (j=1 to 16)".

The p-type thermoelectric conversion elements 121, 122, 125, 126, 129, 130, 133, 134, 137, 138, 141, 142, 145, 146, 149, 150, 153, 154, 157, 158, 161, 162, 165, 166, 169, 170, 173, 174, 177, 178, 181, and 182 are denoted by "p-type thermoelectric conversion elements 120+4k−3 and 120+4k−2 (k=1 to 16)", and the n-type thermoelectric conversion elements 123, 124, 127, 128, 131, 132, 135, 136, 139, 140, 143, 144, 147, 148, 151, 152, 155, 156, 159, 160, 163, 164, 167, 168, 171, 172, 175, 176, 179, 180, 183, and 184 are denoted by "n-type thermoelectric conversion elements 122+4k−3 and 122+4k−2 (k=1 to 16)".

The connection layers 191 to 222 are denoted by "connection layers 190+2k−1 and 190+2k (k=1 to 16)", and the connection layers 231 to 262 are denoted by "connection layers 230+2k−1 and 230+2k (k=1 to 16)".

The p-type thermoelectric conversion elements 120+4k−3 and 120+4k−2 (k=1 to 16) and the n-type thermoelectric conversion elements 122+4k−3 and 122+4k−2 (k=1 to 16) are disposed, for example, in a grid pattern.

In this case, the p-type thermoelectric conversion elements 121, 122, 125, 126, 129, 130, 133, 134, 137, 138, 141, 142, 145, 146, 149, 150, 153, 154, 157, 158, 161, 162, 165, 166, 169, 170, 173, 174, 177, 178, 181, and 182 are divided into pairs of two p-type thermoelectric conversion elements 120+4k−3 and 120+4k−2 (k=1 to 16).

The n-type thermoelectric conversion elements 123, 124, 127, 128, 131, 132, 135, 136, 139, 140, 143, 144, 147, 148, 151, 152, 155, 156, 159, 160, 163, 164, 167, 168, 171, 172, 175, 176, 179, 180, 183, and 184 are divided into pairs of two n-type thermoelectric conversion elements 122+4k−3 and 122+4k−2 (k=1 to 16).

Two p-type thermoelectric conversion elements 120+4k−3 and 120+4k−2 are regarded to be one set of p-type thermoelectric conversion elements, and two n-type thermoelectric conversion elements 122+4k−3 and 122+4k−2 are regarded to be one set of n-type thermoelectric conversion elements. In an x-y plane, the p-type thermoelectric conversion elements 120+4k−3 and 120+4k−2 (k=1 to 16) and the n-type thermoelectric conversion elements 122+4k−3 and 122+4k−2 (k=1 to 16) are disposed so that the sets of p-type thermoelectric conversion elements and the sets of n-type thermoelectric conversion elements are alternately disposed.

The connection layers 190+2k−1 (k=1 to 16) are provided corresponding to the respective two p-type thermoelectric conversion elements 120+4k−3 and 120+4k−2 (k=1 to 16), and are attached to one ends of the respective two p-type thermoelectric conversion elements 120+4k−3 and 120+4k−2 (k=1 to 16) in the length direction (z-axis direction).

The connection layers 190+2k (k=1 to 16) are provided corresponding to the respective two n-type thermoelectric conversion elements 122+4k−3 and 122+4k−2 (k=1 to 16), and are attached to one ends of the respective two n-type thermoelectric conversion elements 122+4k−3 and 122+4k−2 (k=1 to 16) in the length direction (z-axis direction).

The connection layers 230+2k−1 (k=1 to 16) are provided corresponding to the respective two p-type thermoelectric conversion elements 120+4k−3 and 120+4k−2, and are attached to the other ends of the respective two p-type thermoelectric conversion elements 120+4k−3 and 120+4k−2 in the length direction (z-axis direction).

The connection layers 230+2k (k=1 to 16) are provided corresponding to the respective two n-type thermoelectric conversion elements 122+4k−3 and 122+4k−2 (k=1 to 16), and are attached to the other ends of the respective two n-type thermoelectric conversion elements 122+4k−3 and 122+4k−2 (k=1 to 16) in the length direction (z-axis direction).

The extraction electrode 101 has a part attached to the connection layer 191. The conductive members 101+k (k=1 to 15) are attached to the respective connection layers 190+2k (k=1 to 15) and 190+2k−1 (k=2 to 16). The extraction electrode 117 has a part attached to the connection layer 222.

The conductive members 270+k (k=1 to 16) are disposed on the insulating substrate 290, for example, in a grid pattern in the x-y plane. The conductive members 270+k (k=1 to 16) are attached to the respective connection layers 230+2k−1 and 230+2k (k=1 to 16).

As described above, thermoelectric conversion module 100 has a configuration in which thermoelectric conversion element units 1 each including two p-type thermoelectric conversion elements electrically connected in parallel and thermoelectric conversion element units 2 each including two n-type thermoelectric conversion elements electrically connected in parallel are alternately disposed between the extraction electrode 101 and the extraction electrode 117, and thus electrically connected in series between the extraction electrode 101 and the extraction electrode 117.

Each of the conductive members 102 to 116 and 271 to 286 includes the same material as the above-described conductive members 2, 3, and 11.

Each of the n-type thermoelectric conversion elements 123, 124, 127, 128, 131, 132, 135, 136, 139, 140, 143, 144, 147, 148, 151, 152, 155, 156, 159, 160, 163, 164, 167, 168, 171, 172, 175, 176, 179, 180, 183, and 184 includes the same material as the above-described n-type thermoelectric conversion element 6, and is manufactured with the same method as the n-type thermoelectric conversion element 6.

Each of the p-type thermoelectric conversion elements 121, 122, 125, 126, 129, 130, 133, 134, 137, 138, 141, 142, 145, 146, 149, 150, 153, 154, 157, 158, 161, 162, 165, 166, 169, 170, 173, 174, 177, 178, 181, and 182 includes the same material as the above-described p-type thermoelectric conversion element 7, and is manufactured with the same method as the p-type thermoelectric conversion element 7.

Each of the connection layers 191, 193, 195, 197, 199, 201, 203, 205, 207, 209, 211, 213, 215, 217, 219, 221, 231, 233, 235, 237, 239, 241, 243, 245, 247, 249, 251, 253, 255, 257, 259, and 261 includes the same material as the above-described connection layers 5 and 9. Each of the connection layers 192, 194, 196, 198, 200, 202, 204, 206, 208, 210, 212, 214, 216, 218, 220, 222, 232, 234, 236, 238, 240, 242, 244, 246, 248, 250, 252, 254, 256, 258, 260, and 262 includes the same material as the above-described connection layers 4 and 8.

Figure 7:
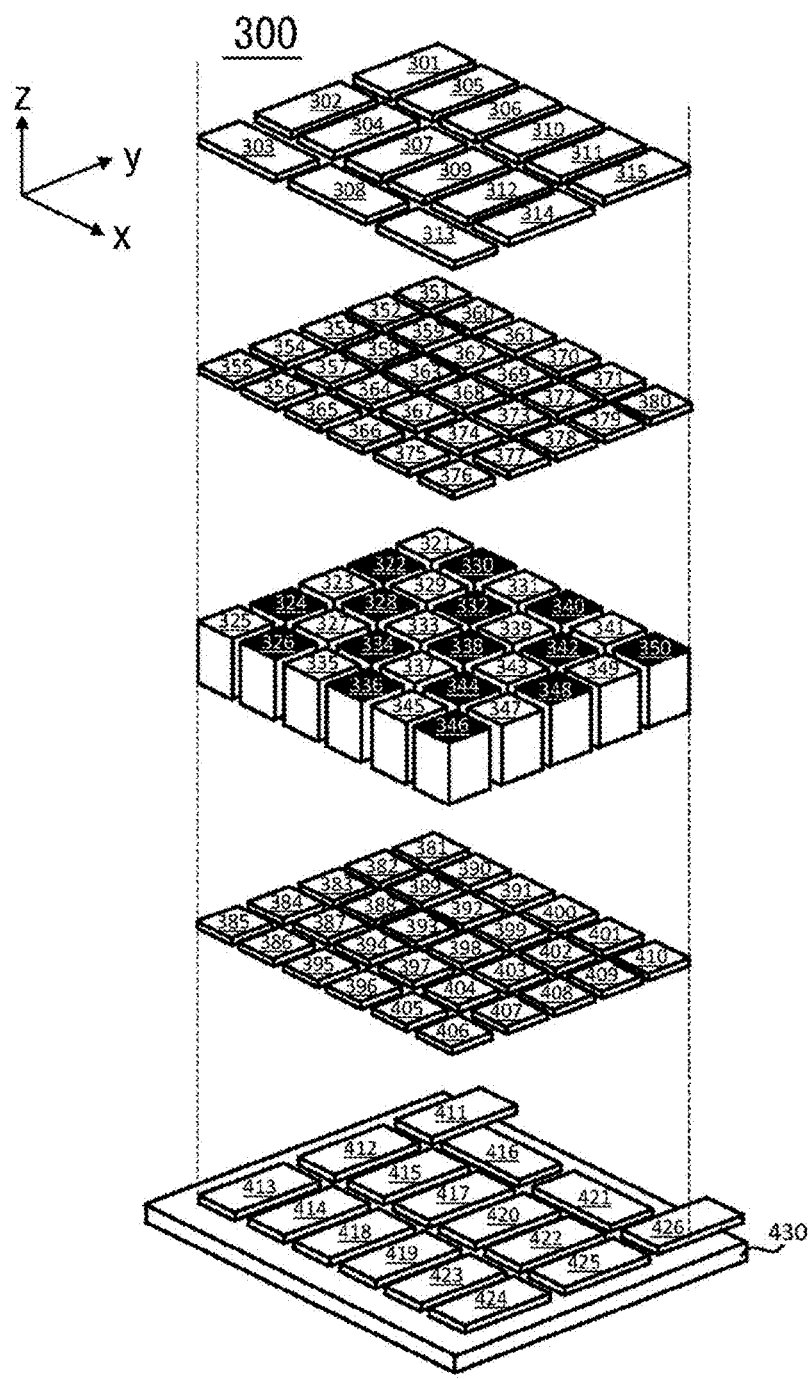
FIG. 7 is an exploded perspective view of still another thermoelectric conversion module according to an embodiment of the present invention.

FIG. 7 is an exploded perspective view of still another thermoelectric conversion module according to an embodiment of the present invention. A thermoelectric conversion module according to an embodiment of the present invention may be a thermoelectric conversion module 300 shown in FIG. 7.

With reference to FIG. 7, the thermoelectric conversion module 300 includes conductive members 301 to 315 and 412 to 425, p-type thermoelectric conversion elements 321, 323, 325, 327, 329, 331, 333, 335, 337, 339, 341, 343, 345, 347, and 349, n-type thermoelectric conversion elements 322, 324, 326, 328, 330, 332, 334, 336, 338, 340, 342, 344, 346, 348, and 350, connection layers 351 to 410, extraction electrodes 411 and 426, and insulating substrate 430. The insulating substrate 430 is electrically insulated (the same applies hereinafter).

The conductive members 301 to 315 are denoted by "conductive members 300+i (i=1 to 15)", and the conductive members 412 to 425 are denoted by "conductive members 411+j (j=1 to 14)".

The p-type thermoelectric conversion elements 321, 323, 325, 327, 329, 331, 333, 335, 337, 339, 341, 343, 345, 347, and 349 are denoted by "p-type thermoelectric conversion elements 320+2m−1 (m=1 to 15)", and the n-type thermoelectric conversion elements 322, 324, 326, 328, 330, 332, 334, 336, 338, 340, 342, 344, 346, 348, and 350 are denoted by "n-type thermoelectric conversion elements 320+2m (m=1 to 15)".

The connection layers 351 to 410 are denoted by "connection layers 350+n (n=1 to 60)".

The p-type thermoelectric conversion elements 320+2m−1 (m=1 to 15) and the n-type thermoelectric conversion elements 320+2m (m=1 to 15) are disposed, for example, in a grid pattern in an x-y plane. In this case, the p-type thermoelectric conversion elements 320+2m−1 (m=1 to 15) and the n-type thermoelectric conversion elements 320+2m (m=1 to 15) are disposed so that the conductivity types of adjacent thermoelectric conversion elements are different.

The connection layers 350+n (n=1, 3, 5, 7, 9, 11, 13, 15, 17, 19, 21, 23, 25, 27, and 29) are provided corresponding to the respective p-type thermoelectric conversion elements $320+2m-1$ (m=1 to 15), and are attached to one ends of the respective p-type thermoelectric conversion elements $320+2m-1$ (m=1, 3, 5, 7, 9, 11, 13, and 15) in the length direction (z-axis direction).

The connection layers $350+n$ (n=2, 4, 6, 8, 10, 12, 14, 16, 18, 20, 22, 24, 26, 28, and 30) are provided corresponding to the respective n-type thermoelectric conversion elements $320+2m$ (m=1 to 15), and are attached to one ends of the respective n-type thermoelectric conversion elements $320+2m$ (m=1 to 15) in the length direction (z-axis direction).

The connection layers $350+n$ (n=31, 33, 35, 37, 39, 41, 43, 45, 47, 49, 51, 53, 55, 57, and 59) are provided corresponding to the respective p-type thermoelectric conversion elements $320+2m-1$ (m=1 to 15), and are attached to the other ends of the respective p-type thermoelectric conversion elements $320+2m-1$ (m=1 to 15) in the length direction (z-axis direction).

The connection layers $350+n$ (n=32, 34, 36, 38, 40, 42, 44, 46, 48, 50, 52, 54, 56, 58, and 60) are provided corresponding to the respective n-type thermoelectric conversion elements $320+2m$ (m=1 to 15), and are attached to the other ends of the respective n-type thermoelectric conversion elements $320+2m$ (m=1 to 15) in the length direction (z-axis direction).

The connection layers $300+i$ (i=1 to 15) are attached to the respective connection layers $350+n$ and $351+n$ (n=1, 3, 5, 7, 9, 11, 13, 15, 17, 19, 21, 23, 25, 27, and 29).

The extraction electrodes 411 and 426 and the conductive members 412 to 425 are disposed on the insulating substrate 430. The extraction electrode 411 has a part attached to the connection layer 381. The conductive members $411+j$ (j=1 to 14) are attached to the respective connection layers $350+n$ and $351+n$ (n=32, 34, 36, 38, 40, 42, 44, 46, 48, 50, 52, 54, 56, and 58). The extraction electrode 426 has a part attached to the connection layer 410.

Each of the conductive members 301 to 315 and 412 to 425 includes the same material as the above-described conductive members 2, 3, and 11.

Each of the n-type thermoelectric conversion elements 322, 324, 326, 328, 330, 332, 334, 336, 338, 340, 342, 344, 346, 348, and 350 includes the same material as the above-described n-type thermoelectric conversion element 6, and is manufactured with the same method as the n-type thermoelectric conversion element 6.

Each of the p-type thermoelectric conversion elements 321, 323, 325, 327, 329, 331, 333, 335, 337, 339, 341, 343, 345, 347, and 349 includes the same material as the above-described p-type thermoelectric conversion element 7, and is manufactured with the same method as the p-type thermoelectric conversion element 7.

Each of the connection layers 351, 353, 355, 357, 359, 361, 363, 365, 367, 369, 371, 373, 375, 377, 379, 381, 383, 385, 387, 389, 391, 393, 395, 397, 399, 401, 403, 405, 407, and 409 includes the same material as the above-described connection layers 5 and 9.

Each of the connection layers 352, 354, 356, 358, 360, 362, 364, 366, 368, 370, 372, 374, 376, 378, 380, 382, 384, 386, 388, 390, 392, 394, 396, 398, 400, 402, 404, 406, 408, and 410 includes the same material as the above-described connection layers 4 and 8.

The thermoelectric conversion module 300 has a configuration in which the p-type thermoelectric conversion elements 321, 323, 325, 327, 329, 331, 333, 335, 337, 339, 341, 343, 345, 347, and 349 and the n-type thermoelectric conversion elements 322, 324, 326, 328, 330, 332, 334, 336, 338, 340, 342, 344, 346, 348, and 350 are electrically connected in series between the extraction electrodes 411 and 426.

In the above description, the method for applying the connection layers 4, 5, 8, 9, 191 to 222, 231 to 262, and 351 to 310 is not particularly limited, but in order to make the thickness constant, a normal printing technique such as screen printing is preferably used. The coating thickness is also not particularly limited, but in order to maintain good bonding strength, heat transfer, and electric resistance, the coating thickness is preferably to be determined so as to be 5 to 80 μm after solidification, and more preferably 10 to 50 μm after solidification.

As described above, the thermoelectric conversion module according to an embodiment of the present invention has a configuration in which the p-type thermoelectric conversion element and the n-type thermoelectric conversion element are electrically connected in series between the two extraction electrodes with various methods.

EXAMPLES

Hereinafter, a thermoelectric conversion module according to an embodiment of the present invention will be described in detail using Examples.

[Examples of Thermoelectric Conversion Element]

Examples 1 to 37

The following method was used to prepare an n-type thermoelectric conversion material having a composition formula represented by $Ti_{0.75}Hf_{0.25}NiSn$ in Example 1. First, granular metallic titanium (Ti), metallic hafnium (Hf), metallic nickel (Ni), and metallic tin (Sn) were weighed so that the ratio of the number of moles is Ti:Hf:Ni Sn=0.75:0.25:1:1, and completely melted by arc melting to obtain a mother alloy. Next, the mother alloy was ground into a powder using a zirconia mortar and pestle.

This powder was put in an amount of 34 g into a carbon mold having a diameter of 30 mm, and fired with an electric current sintering method in vacuum under a uniaxial pressure of 30 MPa at 1,080° C. for 5 minutes. The resulting disk-shaped electrically-sintered body having a diameter of about 30 mm was polished so as to have a thickness of 5 mm, and then cut so that the size of the pressed surface was 3.5 mm×3.5 mm, and thus a rectangular parallelepiped n-type thermoelectric conversion material was obtained that had a length, corresponding to the thickness direction of the disk, of 5 mm.

Also in Examples 2 to 37, an n-type thermoelectric conversion material was obtained by manufacturing and processing and molding under the above-described firing condition with the above-described procedure except that the element ratio was varied so as to obtain the composition shown in Table 1-1 or Table 1-2.

Comparative Example 1

The following method was used to prepare an n-type thermoelectric conversion material having a composition formula represented by $CaMn_{0.98}Mo_{0.02}O_3$. First, calcium carbonate ($CaCO_3$), manganese oxide ($Mn_2O_3$), and molybdenum oxide ($MoO_3$) were weighed so that the ratio of the number of moles is Ca:Mn:Mo=1:0.98:0.02, and sufficiently mixed.

The obtained mixture was put into an alumina crucible and fired in the air at 800° C. for 10 hours, and the obtained fired product was sufficiently mixed using an agate mortar and pestle. The resulting powder was processed and molded into a disk shape having a diameter of 20 mm and a thickness of about 2 to 10 mm, and the molded body was placed on an alumina boat and fired in the air at 1,300° C. for 20 hours. Next, the obtained sintered body was ground using an agate mortar and pestle.

The obtained powder was processed and molded into a disk shape having a diameter of 40 mm and a thickness of 7 mm, and sintered in the air at 1,300° C. for 20 hours. The obtained sintered body was ground and cut to obtain a rectangular parallelepiped having a size of the processed surface of 3.5 mm×3.5 mm and a length corresponding to the thickness direction of 5 mm, and thus an n-type thermoelectric conversion material was obtained.

Test Example 1

The following test was performed on the n-type thermoelectric conversion elements obtained in Examples 1 to 37 and Comparative Example 1 to calculate ZT values.

The ZT value is calculated by the following formula.

$$ZT = S^2 T/\rho\kappa \qquad (10)$$

In the formula (10), S represents the Seebeck coefficient, T represents the measured temperature (absolute temperature), ρ represents the electric resistivity, and κ represents the thermal conductivity.

The Seebeck coefficient Z was measured as follows. A thermocouple having a diameter of 0.1 mm and including platinum and platinum-rhodium alloy (R-type thermocouple) was attached to both surfaces of an n-type thermoelectric conversion material having an area of 3.5 mm×3.5 mm using a silver paste. The n-type thermoelectric conversion material was placed in a tubular furnace and heated at 100 to 700° C.

Thereafter, air was blown to one surface of the n-type thermoelectric conversion element to which the thermocouple was attached, and thus the one surface of the n-type thermoelectric conversion element was cooled to generate a temperature difference between both the surfaces of the n-type thermoelectric conversion element. The temperature difference and the thermoelectromotive force (voltage) generated at both ends of the n-type thermoelectric conversion element were measured using the thermocouple. The thermoelectromotive force was measured using the platinum wire of the thermocouple.

The temperature difference was changed between about 1 to 7° C., and the temperature difference and the thermoelectromotive force were measured for 3 to 7 different points. The data of the measured temperature difference and thermoelectromotive force were plotted with a horizontal axis as the temperature difference and a vertical axis as the thermoelectromotive force, and linearly approximated with the least squares method, and the slope of the straight line was calculated as the Seebeck coefficient S.

The electric resistivity was measured with a DC four-terminal method. A platinum wire having a diameter of 0.05 mm was attached to both surfaces of the n-type thermoelectric conversion material having an area of 3.5 mm×3.5 mm with a silver paste and used as a current lead wire through which a direct current was passed during measurement. In addition, two platinum wires having a diameter of 0.05 mm were attached to both the surfaces of the n-type thermoelectric conversion material having an area of 3.5 mm×3.5 mm using a silver paste so that the two platinum wires were parallel at an interval of about 2 to 3 mm in a state of straddling the width (3.5 mm) of the n-type thermoelectric conversion material, and the two platinum wires were used as voltage lead wires for measurement of the voltage generated by passing current during the measurement.

Then, the sample was placed in a tubular furnace, and a current of about 0.05 to 100 mA was passed through the sample at a constant time interval or at a constant temperature interval while the temperature was increased in the air, and the voltage at this time was measured. The measured voltage, the current passed through the sample, and the sample shape were used to calculate the electric resistivity of the sample by the following formula.

$$\rho = (V \times S_S)/(I \times L) \qquad (11)$$

In the formula (11), V represents the measured voltage, $S_S$ represents the cross-sectional area of the sample (3.5 mm×3.5 mm in this test), I represents the passed current, and L represents the distance between the voltage lead wires (about 2 to 3 mm in this test).

The specific heat capacity $C_p$ at room temperature and the thermal diffusivity α up to 500° C. were measured in vacuum with a laser flash method. The density d of the sample was measured with the Archimedes method using water. Then, the thermal conductivity κ was calculated by the following formula.

$$\kappa = C_p \times \alpha \times d \qquad (12)$$

After the Seebeck coefficient S, the electric resistivity ρ, and the thermal conductivity κ were calculated, the calculated Seebeck coefficient S, electric resistivity ρ, thermal conductivity κ, and the measured temperature T (absolute temperature) were substituted in the formula (10) to calculate the thermoelectric figure of merit ZT.

Table 1-1 shows the Seebeck coefficient S, the electric resistivity ρ, the thermal conductivity κ, and the thermoelectric figure of merit ZT at 500° C. in Examples 1 to 31. In addition, Table 1-2 shows the Seebeck coefficient S, the electric resistivity ρ, the thermal conductivity κ, and the thermoelectric figure of merit ZT at 500° C. in Examples 32 to 37. Furthermore, Table 1-3 shows the Seebeck coefficient S, the electric resistivity ρ, the thermal conductivity κ, and the thermoelectric figure of merit ZT at 500° C. in Comparative Example 1.

TABLE 1-1

| Example | Composition | Seebeck coefficient μV/K | Electric resistivity mΩcm | Thermal conductivity W/mK | Thermoelectric figure of merit ZT |
|---|---|---|---|---|---|
| 1 | $Ti_{0.75}Hf_{0.25}NiSn$ | −138 | 1.04 | 4.93 | 0.29 |
| 2 | TiNiSn | −131 | 1.15 | 5.02 | 0.23 |
| 3 | $Ti_{0.9}Hf_{0.1}NiSn$ | −140 | 1.11 | 4.98 | 0.27 |
| 4 | $Ti_{0.8}Hf_{0.2}NiSn$ | −136 | 1.07 | 4.99 | 0.27 |
| 5 | $Ti_{0.7}Hf_{0.3}NiSn$ | −125 | 1.04 | 4.84 | 0.24 |

TABLE 1-1-continued

| Example | Composition | Seebeck coefficient μV/K | Electric resistivity mΩcm | Thermal conductivity W/mK | Thermoelectric figure of merit ZT |
|---|---|---|---|---|---|
| 6 | $Ti_{0.5}Hf_{0.5}NiSn$ | −112 | 1.07 | 4.72 | 0.19 |
| 7 | $Ti_{0.9}Zr_{0.1}NiSn$ | −136 | 1.15 | 4.82 | 0.26 |
| 8 | $Ti_{0.8}Zr_{0.2}NiSn$ | −135 | 1.18 | 4.79 | 0.25 |
| 9 | $Ti_{0.7}Zr_{0.3}NiSn$ | −136 | 1.24 | 4.83 | 0.24 |
| 10 | $Ti_{0.5}Zr_{0.5}NiSn$ | −129 | 1.19 | 4.78 | 0.23 |
| 11 | $Zr_{0.9}Hf_{0.1}NiSn$ | −152 | 1.30 | 4.68 | 0.29 |
| 12 | $Zr_{0.8}Hf_{0.2}NiSn$ | −157 | 1.42 | 4.55 | 0.29 |
| 13 | $Zr_{0.7}Hf_{0.3}NiSn$ | −149 | 1.44 | 4.49 | 0.27 |
| 14 | $Zr_{0.5}Hf_{0.5}NiSn$ | −135 | 1.41 | 4.57 | 0.22 |
| 15 | $Zr_{0.9}Ti_{0.1}NiSn$ | −139 | 1.16 | 4.52 | 0.28 |
| 16 | $Zr_{0.8}Ti_{0.2}NiSn$ | −141 | 1.19 | 4.62 | 0.28 |
| 17 | $Zr_{0.7}Ti_{0.3}NiSn$ | −132 | 1.24 | 4.69 | 0.23 |
| 18 | $Zr_{0.5}Ti_{0.5}NiSn$ | −129 | 1.35 | 4.66 | 0.20 |
| 19 | $Zr_{0.9}Ti_{0.05}Hf_{0.05}NiSn$ | −151 | 1.45 | 4.61 | 0.26 |
| 20 | $Zr_{0.8}Ti_{0.1}Hf_{0.1}NiSn$ | −142 | 1.41 | 4.58 | 0.24 |
| 21 | $Zr_{0.7}Ti_{0.15}Hf_{0.15}NiSn$ | −138 | 1.37 | 4.60 | 0.23 |
| 22 | $Zr_{0.5}Ti_{0.25}Hf_{0.25}NiSn$ | −133 | 1.29 | 4.71 | 0.23 |
| 23 | $Zr_{0.8}Ti_{0.15}Hf_{0.05}NiSn$ | −136 | 1.28 | 4.74 | 0.24 |
| 24 | $Zr_{0.8}Ti_{0.05}Hf_{0.15}NiSn$ | −131 | 1.26 | 4.75 | 0.22 |
| 25 | $Zr_{0.7}Ti_{0.2}Hf_{0.1}NiSn$ | −129 | 1.17 | 4.81 | 0.23 |
| 26 | $Zr_{0.7}Ti_{0.1}Hf_{0.2}NiSn$ | −128 | 1.14 | 4.83 | 0.23 |
| 27 | $Zr_{0.6}Ti_{0.25}Hf_{0.15}NiSn$ | −125 | 1.19 | 4.78 | 0.21 |
| 28 | $Ti_{0.9}Zr_{0.05}Hf_{0.05}NiSn$ | −139 | 1.29 | 4.62 | 0.25 |
| 29 | $Ti_{0.8}Zr_{0.1}Hf_{0.1}NiSn$ | −147 | 1.37 | 4.52 | 0.27 |
| 30 | $Ti_{0.7}Zr_{0.15}Hf_{0.15}NiSn$ | −135 | 1.02 | 4.66 | 0.30 |
| 31 | $Ti_{0.5}Zr_{0.25}Hf_{0.25}NiSn$ | −122 | 0.94 | 4.87 | 0.25 |

TABLE 1-2

| Example | Composition | Seebeck coefficient μV/K | Electric resistivity mΩcm | Thermal conductivity W/mK | Thermoelectric figure of merit ZT |
|---|---|---|---|---|---|
| 32 | $Ti_{0.8}Zr_{0.15}Hf_{0.05}NiSn$ | −141 | 1.17 | 4.76 | 0.28 |
| 33 | $Ti_{0.8}Zr_{0.05}Hf_{0.15}NiSn$ | −152 | 1.38 | 4.52 | 0.29 |
| 34 | $Ti_{0.7}Zr_{0.2}Hf_{0.1}NiSn$ | −137 | 1.09 | 4.92 | 0.27 |
| 35 | $Ti_{0.7}Zr_{0.1}Hf_{0.2}NiSn$ | −149 | 1.42 | 4.66 | 0.26 |
| 36 | $Ti_{0.6}Zr_{0.25}Hf_{0.15}NiSn$ | −129 | 0.98 | 5.03 | 0.26 |
| 37 | $Ti_{0.6}Zr_{0.15}Hf_{0.25}NiSn$ | −132 | 1.00 | 4.99 | 0.27 |

TABLE 1-3

| Comparative Example | Composition | Seebeck coefficient μV/K | Electric resistivity mΩcm | Thermal conductivity W/mK | Thermoelectric figure of merit ZT |
|---|---|---|---|---|---|
| 1 | $CaMn_{0.98}Mo_{0.02}O_3$ | −199 | 16.8 | 2.35 | 0.08 |

In Table 1-1, the n-type thermoelectric conversion elements in Examples 1 to 6 have a half-Heusler structure represented by the formula (2), the n-type thermoelectric conversion elements in Examples 7 to 10 have a half-Heusler structure represented by the formula (3), the n-type thermoelectric conversion elements in Examples 11 to 14 have a half-Heusler structure represented by the formula (4), the n-type thermoelectric conversion elements in Examples 15 to 18 have a half-Heusler structure represented by the formula (5), and the n-type thermoelectric conversion elements in Examples 19 to 27 have a half-Heusler structure represented by the formula (6). The n-type thermoelectric conversion elements in Examples 28 to 31 in Table 1-1 and in Examples 32 to 37 in Table 1-2 have a half-Heusler structure represented by the formula (7).

As shown in Tables 1-1 and 1-2, the n-type thermoelectric conversion elements in Examples 1 to 37 have a larger thermoelectric figure of merit ZT than the n-type thermoelectric conversion element in Comparative Example 1 shown in Table 1-3. This is considered to be because the n-type thermoelectric conversion elements in Examples 1 to 37 have an electric resistivity of 0.98 to 1.45 mΩcm, which is significantly lower (by one digit or more) than the electric resistivity in Comparative Example 1, 16.8 mΩcm.

Figure 8:
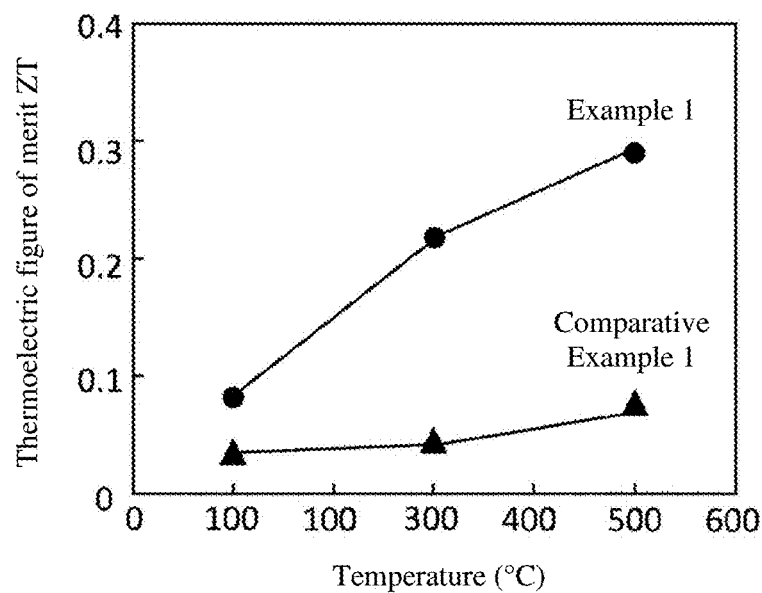
FIG. 8 is a graph showing temperature dependence of the thermoelectric figure of merit ZT in Example 1 and Comparative Example 1.

FIG. 8 is a graph showing temperature dependence of the thermoelectric figure of merit ZT in Example 1 and Comparative Example 1. In FIG. 8, the vertical axis represents the thermoelectric figure of merit ZT, and the horizontal axis represents the temperature. The black circles indicate the relation between the thermoelectric figure of merit ZT and the temperature in the n-type thermoelectric conversion element in Example 1, and the black triangles indicate the relation between the thermoelectric figure of merit ZT and the temperature in the n-type thermoelectric conversion element in Comparative Example 1.

With reference to FIG. 8, the thermoelectric figure of merit ZT of the n-type thermoelectric conversion element in Example 1 increases as the temperature increases in a temperature range of 100 to 500° C. More specifically, the thermoelectric figure of merit ZT of the n-type thermoelectric conversion element in Example 1 becomes about 2.7 times as the temperature increases from 100° C. to 300° C., and becomes about 3.6 times as the temperature increases from 100° C. to 500° C.

Meanwhile, the thermoelectric figure of merit ZT of the n-type thermoelectric conversion element in Comparative Example 1 increases, due to temperature increase, at a smaller increase rate than the thermoelectric figure of merit ZT of the n-type thermoelectric conversion element in Example 1 in a temperature range of 100 to 500° C. More specifically, the thermoelectric figure of merit ZT of the n-type thermoelectric conversion element in Comparative Example 1 becomes about 1.3 times as the temperature increases from 100° C. to 300° C., and becomes about 2.2 times as the temperature increases from 100° C. to 500° C.

The thermoelectric figure of merit ZT of the n-type thermoelectric conversion element in Example 1 is about 2.3 times the thermoelectric figure of merit ZT of the n-type thermoelectric conversion element in Comparative Example 1 at a temperature of 100° C., about 4.9 times the thermoelectric figure of merit ZT of the n-type thermoelectric conversion element in Comparative Example 1 at a temperature of 300° C., and about 3.7 times the thermoelectric figure of merit ZT of the n-type thermoelectric conversion element in Comparative Example 1 at a temperature of 500° C.

As described above, the thermoelectric figure of merit ZT of the n-type thermoelectric conversion element in Example 1 is 2.3 times or more the thermoelectric figure of merit ZT of the n-type thermoelectric conversion element in Comparative Example 1 in a temperature range of 100 to 500° C. Therefore, it has been found that the n-type thermoelectric conversion element in Example 1 has excellent thermoelectric conversion efficiency.

Figure 9:
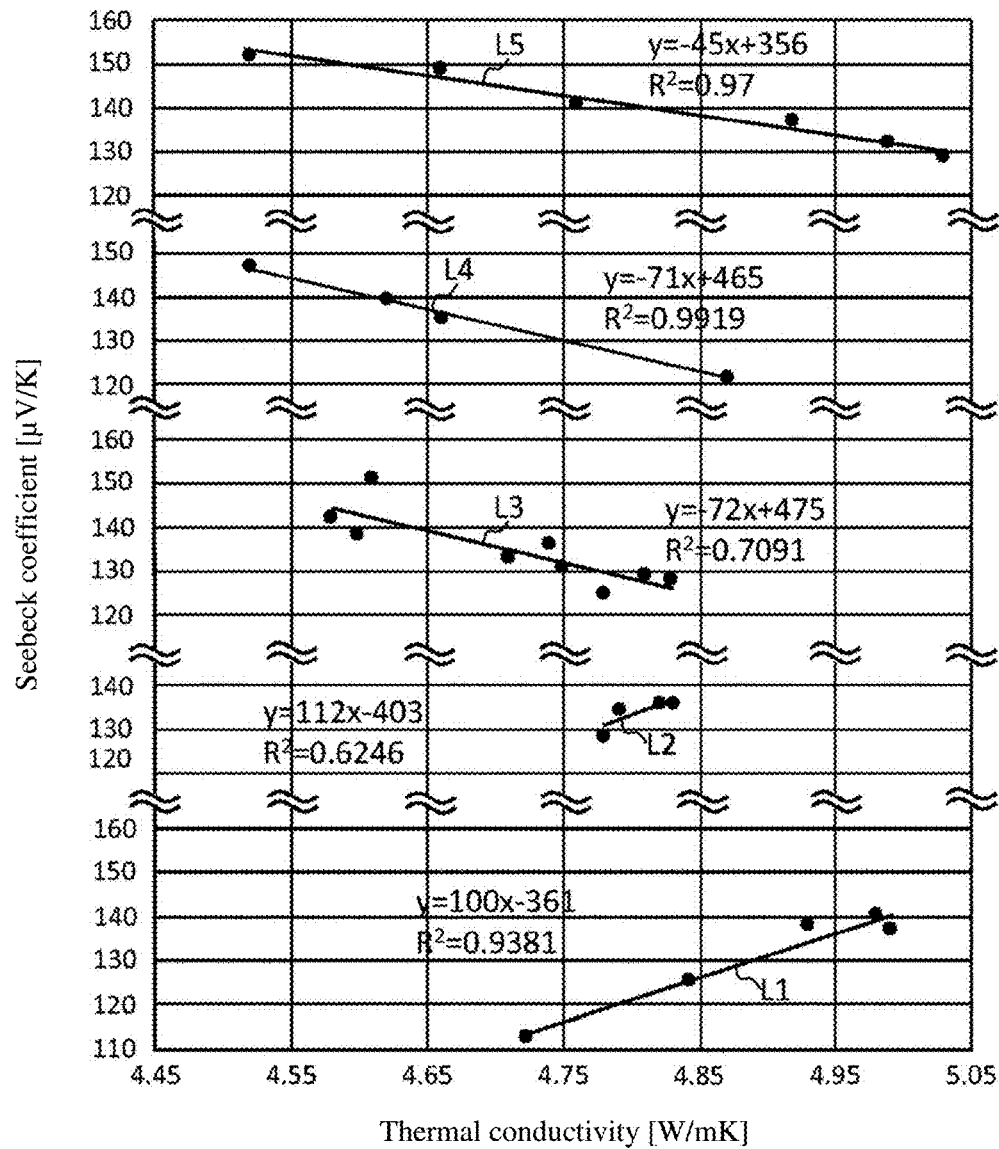
FIG. 9 is a graph showing relations between the Seebeck coefficient and the thermal conductivity in n-type thermoelectric conversion elements in Examples 1 and 3 to 6, in Examples 7 to 10, in Examples 19 to 27, in Examples 28 to 31, and in Examples 32 to 37.

FIG. 9 is a graph showing relations between the Seebeck coefficient and the thermal conductivity in the n-type thermoelectric conversion elements in Examples 1 and 3 to 6, in Examples 7 to 10, in Examples 19 to 27, in Examples 28 to 31, and in Examples 32 to 37. In FIG. 9, the vertical axis represents the absolute value of the Seebeck coefficient, and the horizontal axis represents the thermal conductivity.

In FIG. 9, the straight line L1 indicates the relation between the Seebeck coefficient and the thermal conductivity in the n-type thermoelectric conversion elements represented by a composition formula of $Ti_{1-a}Hf_aNiSn$ ($0.1 \leq a \leq 0.5$) in Examples 1 and 3 to 6, the straight line L2 indicates the relation between the Seebeck coefficient and the thermal conductivity in the n-type thermoelectric conversion elements represented by a composition formula of $Ti_{1-b}Zr_bNiSn$ ($0.1 \leq b \leq 0.5$) in Examples 7 to 10, the straight line L3 indicates the relation between the Seebeck coefficient and the thermal conductivity in the n-type thermoelectric conversion elements represented by a composition formula of $Zr_{1-e-f}Ti_eHf_fNiSn$ ($0.05 \leq e \leq 0.25$, $0.05 \leq f \leq 0.25$) in Examples 19 to 27, the straight line L4 indicates the relation between the Seebeck coefficient and the thermal conductivity in the n-type thermoelectric conversion elements represented by a composition formula of $Ti_{1-e-f}Zr_eHf_fNiSn$ ($0.05 \leq e \leq 0.25$, $0.05 \leq f \leq 0.25$) in Examples 28 to 31, and the straight line L5 indicates the relation between the Seebeck coefficient and the thermal conductivity in the n-type thermoelectric conversion elements represented by a composition formula of $Ti_{1-g-h}Zr_gHf_hNiSn$ ($0.05 \leq g \leq 0.25$, $0.05 \leq h \leq 0.25$) in Examples 32 to 37.

In the n-type thermoelectric conversion elements in Examples 1 and 3 to 6, the thermal conductivity tends to increase as the amount of the Ti component increases.

With reference to FIG. 9, the absolute value of the Seebeck coefficient in the n-type thermoelectric conversion elements in Examples 1 and 3 to 6 increases as the thermal conductivity increases. When the absolute value of the Seebeck coefficient is represented by y and the thermal conductivity is represented by x, the relation between x and y is expressed by the following formula.

$$y = 100x - 361 \quad (13)$$

The contribution ratio $R^2$ of the regression line expressed by the formula (13) is 0.9381, and the correlation coefficient between x and y is $(0.9381)^{1/2} = 0.97$. As the result, the absolute value of the Seebeck coefficient, y, in the n-type thermoelectric conversion elements in Examples 1 and 3 to 6 has a strong correlation with the thermal conductivity x.

As described above, the absolute value of the Seebeck coefficient in the n-type thermoelectric conversion elements in Examples 1 and 3 to 6 is characterized by increasing in proportion to the thermal conductivity.

The n-type thermoelectric conversion elements in Examples 1 and 3 to 6 are represented by a composition formula of $Ti_{1-a}Hf_aNiSn$ ($0.1 \leq a \leq 0.5$), and therefore an n-type thermoelectric conversion element having a half-Heusler structure represented by a composition formula of $Ti_{1-a}Hf_aNiSn$ ($0.1 \leq a \leq 0.5$) is characterized in that the absolute value of the Seebeck coefficient increases in proportion to the thermal conductivity (see the straight line L1).

The absolute value of the Seebeck coefficient in the n-type thermoelectric conversion elements in Examples 7 to 10 increases as the thermal conductivity increases. Therefore, when the absolute value of the Seebeck coefficient is represented by y and the thermal conductivity is represented by x, the relation between x and y is expressed by the following formula.

$$y = 112x - 403 \quad (14)$$

The contribution ratio $R^2$ of the regression line expressed by the formula (14) is 0.6246, and the correlation coefficient between x and y is $(0.6246)^{1/2} = 0.79$. As the result, the absolute value of the Seebeck coefficient, y, in the n-type thermoelectric conversion elements in Examples 7 to 10 has a strong correlation with the thermal conductivity x. Therefore, the absolute value of the Seebeck coefficient in the n-type thermoelectric conversion elements in Examples 7 to 10 is characterized by increasing as the thermal conductivity increases.

The n-type thermoelectric conversion elements in Examples 7 to 10 are represented by a composition formula of $Ti_{1-b}Zr_bNiSn$ ($0.1 \leq b \leq 0.5$), and therefore an n-type thermoelectric conversion element having a half-Heusler structure represented by a composition formula of $Ti_{1-b}Zr_bNiSn$ ($0.1 \leq b \leq 0.5$) is characterized in that the absolute value of the Seebeck coefficient increases as the thermal conductivity increases (see the straight line L2).

The absolute value of the Seebeck coefficient in the n-type thermoelectric conversion elements in Examples 19 to 27 decreases as the thermal conductivity increases. When the absolute value of the Seebeck coefficient is represented by y and the thermal conductivity is represented by x, the relation between x and y is expressed by the following formula.

$$y = -72x + 475 \quad (15)$$

The contribution ratio $R^2$ of the regression line expressed by the formula (15) is 0.7091, and the correlation coefficient between x and y is $(0.7091)^{1/2} = 0.84$. As the result, the absolute value of the Seebeck coefficient, y, in the n-type thermoelectric conversion elements in Examples 19 to 27 has a correlation with the thermal conductivity x.

As described above, the absolute value of the Seebeck coefficient in the n-type thermoelectric conversion elements in Examples 19 to 27 is characterized by decreasing as the thermal conductivity increases.

The n-type thermoelectric conversion elements in Examples 19 to 27 are represented by a composition formula of $Zr_{1-e-f}Ti_eHf_fNiSn$ ($0.05 \le e \le 0.25$, $0.05 \le f \le 0.25$), and therefore an n-type thermoelectric conversion element having a half-Heusler structure represented by a composition formula of $Ti_{1-e-f}Zr_eHf_fNiSn$ ($0.05 \le e \le 0.25$, $0.05 \le f \le 0.25$) is characterized in that the absolute value of the Seebeck coefficient decreases as the thermal conductivity increases (see the straight line L3).

The absolute value of the Seebeck coefficient in the n-type thermoelectric conversion elements in Examples 28 to 31 decreases as the thermal conductivity increases. When the absolute value of the Seebeck coefficient is represented by y and the thermal conductivity is represented by x, the relation between x and y is expressed by the following formula.

$$y = -71x + 465 \quad (16)$$

The contribution ratio $R^2$ of the regression line expressed by the formula (16) is 0.9919, and the correlation coefficient between x and y is $(0.9919)^{1/2} = 0.99$. As the result, the absolute value of the Seebeck coefficient, y, in the n-type thermoelectric conversion elements in Examples 19 to 22 has a strong correlation with the thermal conductivity x.

As described above, the absolute value of the Seebeck coefficient in the n-type thermoelectric conversion elements in Examples 28 to 31 is characterized by decreasing in proportion to the thermal conductivity.

The n-type thermoelectric conversion elements in Examples 28 to 31 are represented by a composition formula of $Ti_{1-e-f}Zr_eHf_fNiSn$ ($0.05 \le e \le 0.25$, $0.05 \le f \le 0.25$), and therefore an n-type thermoelectric conversion element having a half-Heusler structure represented by a composition formula of $Ti_{1-e-f}Zr_eHf_fNiSn$ ($0.05 \le e \le 0.25$, $0.05 \le f \le 0.25$) is characterized in that the absolute value of the Seebeck coefficient decreases in proportion to the thermal conductivity (see the straight line L4).

The absolute value of the Seebeck coefficient in the n-type thermoelectric conversion elements in Examples 32 to 37 decreases as the thermal conductivity increases. When the absolute value of the Seebeck coefficient is represented by y and the thermal conductivity is represented by x, the relation between x and y is expressed by the following formula.

$$y = -45x + 356 \quad (17)$$

The contribution ratio $R^2$ of the regression line expressed by the formula (17) is 0.97, and the correlation coefficient between x and y is $(0.97)^{1/2} = 0.98$. As the result, the absolute value of the Seebeck coefficient, y, in the n-type thermoelectric conversion elements in Examples 32 to 37 has a strong correlation with the thermal conductivity x. As described above, the absolute value of the Seebeck coefficient in the n-type thermoelectric conversion elements in Examples 32 to 37 is characterized by decreasing in proportion to the thermal conductivity.

The n-type thermoelectric conversion elements in Examples 32 to 37 are represented by a composition formula of $Ti_{1-g-h}Zr_gHf_hNiSn$ ($0.05 \le g \le 0.25$, $0.05 \le h \le 0.25$), and therefore an n-type thermoelectric conversion element having a half-Heusler structure represented by a composition formula of $Ti_{1-g-h}Zr_gHf_hNiSn$ ($0.05 \le g \le 0.25$, $0.05 \le h \le 0.25$) is characterized in that the absolute value of the Seebeck coefficient decreases in proportion to the thermal conductivity (see the straight line L5).

[Examples of Thermoelectric Conversion Module]

Example 38

A thermoelectric conversion module in Example 38 was prepared with the following method.

[Preparation of n-Type Thermoelectric Conversion Element]

The following method was used to prepare an n-type thermoelectric conversion element represented by the composition formula of $Ti_{0.75}Hf_{0.25}NiSn$.

First, granular metallic titanium (Ti), metallic hafnium (Hf), metallic nickel (Ni), and metallic tin (Sn) were weighed so that the ratio of the number of moles is Ti:Hf:Ni:Sn=0.75:0.25:1:1, and completely melted by arc melting to obtain a mother alloy. Next, the mother alloy was ground into a powder using a zirconia mortar and pestle.

This powder was put in an amount of 34 g into a carbon mold having a diameter of 30 mm, and fired with an electric current sintering method in vacuum under a uniaxial pressure of 30 MPa at 1,080° C. for 5 minutes. The resulting disk-shaped electrically-sintered body having a diameter of 30 mm was polished so as to have a thickness of 5 mm, and then cut so that the size of the pressed surface was 3.5 mm×3.5 mm, and thus a rectangular parallelepiped n-type thermoelectric conversion element was obtained that had a length, corresponding to the thickness direction, of 5 mm. The bonding surface to be bonded to a conductive member was the surface having a size of 3.5 mm×3.5 mm.

[Preparation of p-Type Thermoelectric Conversion Element]

The following method was used to prepare a p-type thermoelectric conversion element represented by a composition formula of $Ca_{2.7}Bi_{0.3}Co_4O_9$.

First, calcium carbonate ($CaCO_3$), bismuth oxide ($Bi_2O_3$), and cobalt oxide ($CO_3O_4$) were weighed so that the ratio of the number of moles is Ca:Bi:Co=2.7:0.3:4, and sufficiently mixed. The obtained mixture was put into an alumina crucible and fired in the air at 800° C. for 10 hours, and the obtained fired product was sufficiently mixed using an agate mortar and pestle. The resulting powder was press-molded into a disk shape having a diameter of 20 mm and a thickness of about 2 to 10 mm, a gold sheet was spread on an alumina sheet, and the molded body was placed on the gold sheet and fired in the air at 860° C. for 20 hours. Next, the obtained sintered body was ground using an agate mortar and pestle.

The obtained powder was press-molded into a disk shape having a diameter of 40 mm and a thickness of 5 mm, and hot-pressed and sintered in the air under a uniaxial pressure of 10 MPa at 880° C. for 20 hours. The obtained hot-pressed and sintered body was polished and cut to form a rectangular parallelepiped such that the size of the surface perpendicular to the pressed surface was 3.5 mm×3.5 mm and the length was 5 mm, and thus a p-type thermoelectric conversion element was obtained. The bonding surface to be bonded to a conductive member was the surface having a size of 3.5 mm×3.5 mm.

[Preparation of Silver Paste]

A silver paste was prepared using a commercially available silver paste manufactured by TANAKA Kikinzoku Kogyo K.K. (trade name: MH-108A, silver content: 85 wt %) without adding any powder of silver oxide ($Ag_2O$), titanium oxide ($TiO_2$), and a p-type thermoelectric oxide ($Ca_{2.7}Bi_{0.3}Co_4O_9$).

[Preparation of Thermoelectric Conversion Module]

As an insulating substrate, an aluminum oxide (alumina: $Al_2O_3$) plate having a size of 3.5 mm×7.5 mm and a thickness of 0.8 mm was used. As a conductive member, a silver sheet having a size of 3.2 mm×7 mm and a thickness of 0.1 mm was used.

Both bonding surfaces of one p-type thermoelectric conversion element and both bonding surfaces of one n-type thermoelectric conversion element were irradiated with ultraviolet rays using a mercury lamp for 30 minutes.

The silver paste prepared with the above-described method was applied to the bonding surface of the silver sheet. Here, screen printing was used to adjust the thickness of the conductive paste before solidification so that the thickness after solidification was 10 μm.

The bonding surface of the silver sheet to which the silver paste was applied was placed on one bonding surface of the p-type thermoelectric conversion element and one bonding surface of the n-type thermoelectric conversion element, and the silver sheet was attached to the one bonding surface of the p-type thermoelectric conversion element and the one bonding surface of the n-type thermoelectric conversion element to connect the one bonding surface of the p-type thermoelectric conversion element and the one bonding surface of the n-type thermoelectric conversion element. In this case, the gap between the p-type thermoelectric conversion element and the n-type thermoelectric conversion element was set to 0.5 mm.

Two silver sheets having a size of 3.2 mm×20 mm and a thickness of 0.1 mm were used, and the silver paste was applied to a region having a length of 3.5 mm from one end of each of the two silver sheets with the above-described method.

One of the two silver sheets to which the silver paste was applied was attached to the other bonding surface of the p-type thermoelectric conversion element, the other silver sheet was attached to the other bonding surface of the n-type thermoelectric conversion element, and two extraction electrodes were connected to the p-type thermoelectric conversion element and the n-type thermoelectric conversion element. The two extraction electrodes were placed on the insulating substrate to prepare a precursor of a thermoelectric conversion module.

Thereafter, the precursor of a thermoelectric conversion module was placed in a dryer, heated at 100° C. for 30 minutes, then placed in a hot press furnace for heating in the air under uniaxial pressure, heated from room temperature to 200° C. in 1 hour while a uniaxial pressure of 2.4 MPa was applied to the bonding surface, and maintained at 200° C. for 1 hour. Thereafter, the pressure was increased to 4.8 MPa, and the temperature was raised to 450° C. in 1 hour, maintained at 450° C. for 1 hour and 30 minutes, and then raised to 800° C. in 2 hours. In this case, the pressure was increased to 9.6 MPa when the temperature reached 625° C. 1 hour after the start of the temperature rise. After firing at 800° C. for 30 minutes while the pressure was maintained, the pressing was terminated, the inside of the furnace was naturally cooled, and thus a thermoelectric conversion module in Example 38 was prepared. The silver sheets (extraction electrodes) were attached to the alumina substrate (insulating substrate) by this heat treatment.

Example 39

A thermoelectric conversion module in Example 39 was prepared with the following method.

[Preparation of Silver Paste]

A silver paste was prepared using a commercially available silver paste manufactured by TANAKA Kikinzoku Kogyo K.K. (trade name: MH-108A, silver content: 85 wt %). This silver paste contained 85 wt % of a silver powder (particle size: 0.1 to 5 μm), 1 wt % of bismuth borosilicate glass, 5 wt % of ethyl cellulose, 4 wt % of terpineol, and 5 wt % of butyl carbitol acetate. The amount of this silver paste in a wet state was regarded to be 100 wt %, a silver oxide ($Ag_2O$) powder was classified with a sieve having a mesh size of 38 μm (JIS standard 390 mesh), the silver oxide ($Ag_2O$) powder that passed through the sieve was added in an amount of 0.5 wt %, and the resulting paste was sufficiently kneaded to obtain a silver paste.

A thermoelectric conversion module in Example 39 was prepared in the same manner as in Example 38 except that the silver paste was prepared with the above-described method.

Examples 40 to 247

Also in preparation of thermoelectric conversion modules in Examples 40 to 247, thermoelectric conversion modules in Examples 40 to 247 were prepared using the same method for forming a bond and using the same conditions for manufacture as in Example 39 although, as shown in Tables 2-1 to 2-14, the compositions, the firing conditions, and the shapes of the p-type thermoelectric conversion element and the n-type thermoelectric conversion element, the material and the shape of the conductive member, and the composition and the addition amount of the additive added to the silver paste were different from those in Example 39.

The prepared thermoelectric conversion modules in Examples 38 to 247 have the same structure as the thermoelectric conversion module 10 shown in FIGS. 1 to 4. As the additive added to the silver paste, titanium oxide ($TiO_2$) and a p-type thermoelectric oxide ($Ca_{2.7}Bi_{0.3}Co_4O_9$) were used in addition to silver oxide ($Ag_2O$). The powder of titanium oxide ($TiO_2$) and the p-type thermoelectric oxide ($Ca_{2.7}Bi_{0.3}Co_4O_9$) that passed through a sieve having a mesh size of 38 μm was added in an amount of 0.5 to 10 wt % based on 100 wt % of the silver paste in a wet state, and the resulting paste was sufficiently kneaded.

Comparative Example 2

A thermoelectric conversion module in Comparative Example 2 was prepared in the same manner as in Example 38 except for using $CaMn_{0.98}Mo_{0.02}O_3$ in Comparative Example 1 as an n-type thermoelectric conversion element.

Comparative Examples 3 to 9

As shown in Table 2-15, thermoelectric conversion modules in Comparative Examples 3 to 9 were prepared in the same manner as in Example 39 except for using $CaMn_{0.98}Mo_{0.02}O_3$ in Comparative Example 1 as an n-type thermoelectric conversion element.

Test Example 2

For the thermoelectric conversion modules in Examples 38 to 247 and Comparative Examples 2 to 9, the surface of the aluminum oxide substrate to which the thermoelectric conversion element was connected was heated to 100 to 500° C. in the air using a plate-type electric furnace, and the power extraction member (extraction electrode) at the opposite end was cooled with a copper jacket in which the surface was electrically insulated with a polyimide and water of 20° C. was circulating, thus causing a temperature difference.

The extraction electrode disposed on the low-temperature side of each of the p-type thermoelectric conversion element and the n-type thermoelectric conversion element was connected to an electric load device, the current and the voltage were measured while the external load resistance was changed, and thus the internal resistance and the output of the thermoelectric conversion module were obtained.

Figure 10:
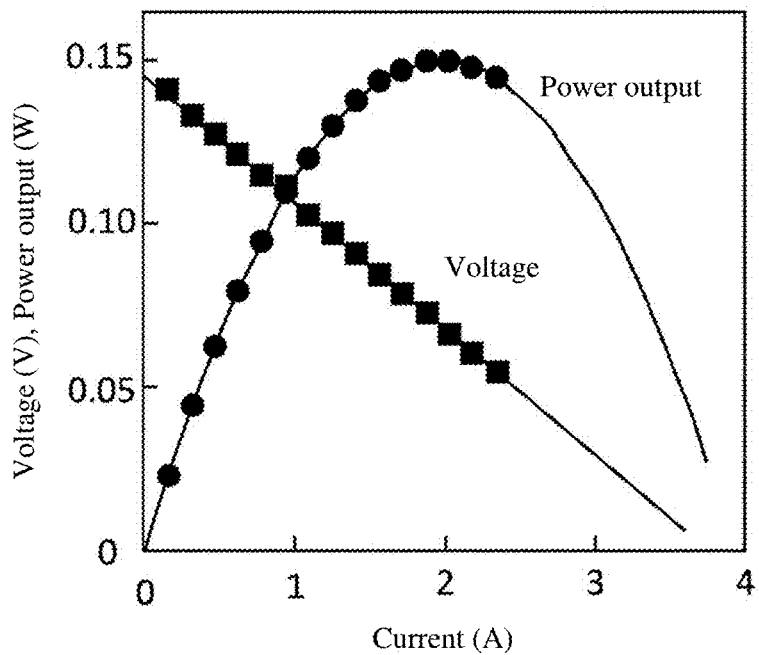
FIG. 10 is a graph showing a relation between the voltage and the current and a relation between the power output and the current in a thermoelectric conversion module.

FIG. 10 is a graph showing a relation between the voltage and the current and a relation between the power output and the current in a thermoelectric conversion module. In FIG. 10, the vertical axis represents the voltage and the power output, and the horizontal axis represents the current. The straight line indicates the relation between the voltage and the current, and the curve indicates the relation between the power output and the current.

With reference to FIG. 10, the voltage is proportional to the current. The slope of the straight line indicating the relation between the voltage and the current indicates the internal resistance of the thermoelectric conversion module.

The power output is obtained by multiplying the voltage and the current. As the result, the relation between the power output and the current is expressed by an upwardly convex curve indicating a quadratic function. Therefore, the regression curve (quadratic curve) between the power output and the current was obtained, and the maximum value of the obtained quadratic curve was taken as the maximum output.

The thermoelectric conversion module exhibits the maximum output when the external load resistance matches the internal resistance, and even when the regression curve was used to determine the maximum output, the maximum output was obtained at the point where the external load resistance matched the internal resistance.

Figure 11:
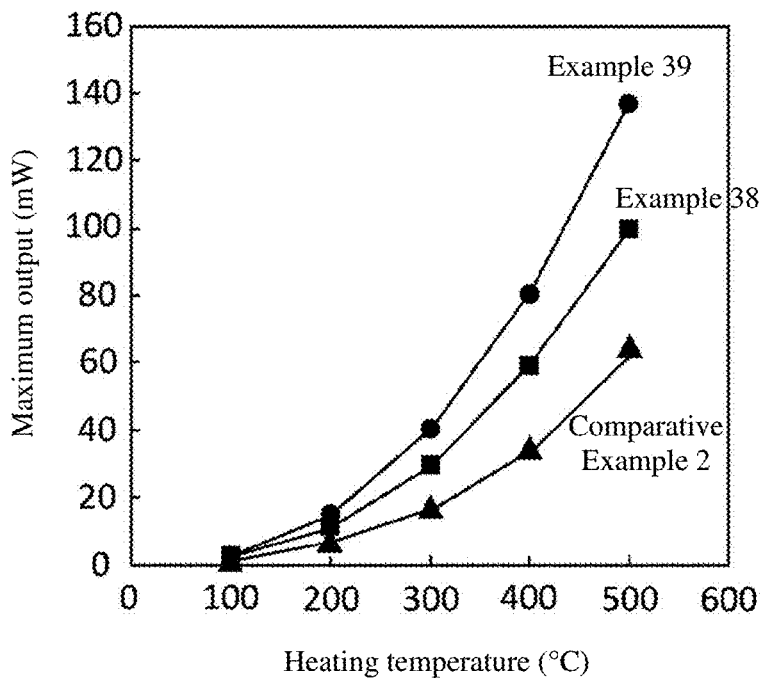
FIG. 11 is a graph showing relations between the maximum output and the heating temperature in Examples 38 and 39 and Comparative Example 2.

FIG. 11 is a graph showing relations between the maximum output and the heating temperature in Examples 38 and 39 and Comparative Example 2. In FIG. 11, the vertical axis represents the maximum output, and the horizontal axis represents the heating temperature. The black squares indicate the relation between the maximum output and the heating temperature in Example 38, the black circles indicate the relation between the maximum output and the heating temperature in Example 39, and the black triangles indicate the relation between the maximum output and the heating temperature in Comparative Example 2.

With reference to FIG. 11, the thermoelectric conversion module in Example 38 has larger maximum output than the thermoelectric conversion module in Comparative Example 2 in the temperature range of 100° C. to 500° C. The thermoelectric conversion module in Example 39 has a larger maximum output than the thermoelectric conversion module in Example 38 in the temperature range of 100° C. to 500° C.

The thermoelectric conversion module in Comparative Example 2 is prepared using an n-type thermoelectric conversion element including an oxide represented by the composition formula of $CaMn_{0.98}Mo_{0.02}O_3$, and a silver paste to which none of silver oxide ($Ag_2O$), titanium oxide ($TiO_2$), and a p-type thermoelectric oxide ($Ca_{2.7}Bi_{0.3}Co_4O_9$) is added.

The thermoelectric conversion module in Example 38 is prepared using an n-type thermoelectric conversion element having a half-Heusler structure represented by the composition formula of $Ti_{0.75}Hf_{0.25}NiSn$, and a silver paste to which none of silver oxide ($Ag_2O$), titanium oxide ($TiO_2$), and a p-type thermoelectric oxide ($Ca_{2.7}Bi_{0.3}Co_4O_9$) is added.

The thermoelectric conversion module in Example 39 is prepared using an n-type thermoelectric conversion element having a half-Heusler structure represented by the composition formula of $Ti_{0.75}Hf_{0.25}NiSn$, and a silver paste to which silver oxide ($Ag_2O$) is added.

As the result, it has been found that the maximum output of a thermoelectric conversion module is improved by using an n-type thermoelectric conversion element having a half-Heusler structure in the temperature range of 100° C. to 500° C. (see Example 38 and Comparative Example 2). In addition, it has been found that the maximum output of the thermoelectric conversion module is further improved by using a silver paste to which silver oxide ($Ag_2O$) is added in the temperature range of 100° C. to 500° C. (see Examples 38 and 39).

Therefore, the maximum output of a thermoelectric conversion module in which both the n-type thermoelectric conversion element and the p-type thermoelectric conversion element include a thermoelectric oxide material can be improved by changing the n-type thermoelectric conversion element in the thermoelectric conversion module to an n-type thermoelectric conversion element having a half-Heusler structure, and the maximum output of the thermoelectric conversion module including the n-type thermoelectric conversion element having a half-Heusler structure can be further improved by changing the silver paste in the thermoelectric conversion module to a silver paste to which silver oxide ($Ag_2O$) is added.

Tables 2-1 to 2-15 show the open circuit voltage, the internal resistance, and the maximum output when the heating temperature of the thermoelectric conversion modules in Examples 38 to 247 and Comparative Examples 2 to 9 is 500° C.

TABLE 2-1

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
| | | | $Ag_2O$ | $TiO_2$ | $Ca_{2.7}Bi_{0.3}Co_4O_9$ | | | | |
|---|---|---|---|---|---|---|---|---|---|
| 38 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | 0.0 | 0.0 | 0.0 | Silver 7.5 × 3.5 × 0.1 | 142 | 51.0 | 99 |
| 39 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 0.5 p-type 0.5 | n-type 0.0 p-type 0.0 | n-type 0.0 p-type 0.0 | Silver 7.5 × 3.5 × 0.1 | 138 | 35.3 | 135 |
| 40 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 1.0 p-type 1.0 | n-type 0.0 p-type 0.0 | n-type 0.0 p-type 0.0 | Silver 7.5 × 3.5 × 0.1 | 141 | 35.7 | 139 |

TABLE 2-1-continued

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | $Ag_2O$ | $TiO_2$ | $Ca_{2.7}Bi_{0.3}Co_4O_9$ | | | | |
| 41 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 136 | 36.8 | 126 |
| 42 | $Ti_{0.75}Hf_{0.25}NiSn$ 2.0 × 3.5 × 5.0 | $Ca_{2.7}Bi_{0.3}Co_4O_9$ 5.0 × 3.5 × 5.0 | n-type 3.0 p-type 3.0 | n-type 0.0 p-type 0.0 | n-type 0.0 p-type 0.0 | Silver 7.5 × 3.5 × 0.1 | 143 | 29.2 | 175 |
| 43 | $Ti_{0.75}Hf_{0.25}NiSn$ 2.0 × 3.5 × 5.0 | $Ca_{2.7}Bi_{0.3}Co_4O_9$ 5.0 × 3.5 × 5.0 | n-type 3.0 p-type 3.0 | n-type 0.0 p-type 0.0 | n-type 0.0 p-type 0.0 | Platinum 7.5 × 3.5 × 0.05 | 149 | 29.2 | 190 |
| 44 | $Ti_{0.75}Hf_{0.25}NiSn$ 2.0 × 3.5 × 5.0 | $Ca_{2.7}Bi_{0.3}Co_4O_9$ 5.0 × 3.5 × 5.0 | n-type 3.0 p-type 3.0 | n-type 0.0 p-type 0.0 | n-type 0.0 p-type 0.0 | Gold 7.5 × 3.5 × 0.05 | 151 | 28.4 | 201 |
| 45 | $Ti_{0.75}Hf_{0.25}NiSn$ 2.0 × 3.5 × 5.0 | $Ca_{2.7}Bi_{0.3}Co_4O_9$ 5.0 × 3.5 × 5.0 | n-type 3.0 p-type 3.0 | n-type 0.0 p-type 0.0 | n-type 0.0 p-type 0.0 | $LaNiO_3$ sintered body 7.5 × 3.5 × 0.5 | 128 | 39.2 | 105 |
| 46 | $Ti_{0.75}Hf_{0.25}NiSn$ 2.0 × 3.5 × 5.0 | $Ca_{2.7}Bi_{0.3}Co_4O_9$ 5.0 × 3.5 × 5.0 | n-type 3.0 p-type 3.0 | n-type 0.0 p-type 0.0 | n-type 0.0 p-type 0.0 | $RuO_3$ sintered body 7.5 × 3.5 × 0.5 | 131 | 36.0 | 119 |
| 47 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 5.0 p-type 5.0 | n-type 0.0 p-type 0.0 | n-type 0.0 p-type 0.0 | Silver 7.5 × 3.5 × 0.1 | 144 | 35.3 | 147 |
| 48 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 10 p-type 10 | n-type 0.0 p-type 0.0 | n-type 0.0 p-type 0.0 | Silver 7.5 × 3.5 × 0.1 | 146 | 36.8 | 145 |
| 49 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 0.5 p-type 0.5 | n-type 0.5 p-type 0.5 | Silver 7.5 × 3.5 × 0.1 | 138 | 35.3 | 135 |
| 50 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 1.0 p-type 1.0 | n-type 0.0 p-type 0.0 | Silver 7.5 × 3.5 × 0.1 | 142 | 38.7 | 130 |
| 51 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 140 | 35.3 | 139 |
| 52 | $Ti_{0.75}Hf_{0.25}NiSn$ 2.0 × 3.5 × 5.0 | $Ca_{2.7}Bi_{0.3}Co_4O_9$ 5.0 × 3.5 × 5.0 | n-type 0.0 p-type 0.0 | n-type 3.0 p-type 3.0 | n-type 0.0 p-type 0.0 | Silver 7.5 × 3.5 × 0.1 | 144 | 29.2 | 178 |

TABLE 2-2

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | $Ag_2O$ | $TiO_2$ | $Ca_{2.7}Bi_{0.3}Co_4O_9$ | | | | |
| 53 | $Ti_{0.75}Hf_{0.25}NiSn$ 2.0 × 3.5 × 5.0 | $Ca_{2.7}Bi_{0.3}Co_4O_9$ 5.0 × 3.5 × 5.0 | n-type 0.0 p-type 0.0 | n-type 3.0 p-type 3.0 | n-type 0.0 p-type 0.0 | Platinum 7.5 × 3.5 × 0.05 | 151 | 29.5 | 193 |
| 54 | $Ti_{0.75}Hf_{0.25}NiSn$ 2.0 × 3.5 × 5.0 | $Ca_{2.7}Bi_{0.3}Co_4O_9$ 5.0 × 3.5 × 5.0 | n-type 0.0 p-type 0.0 | n-type 3.0 p-type 3.0 | n-type 0.0 p-type 0.0 | Gold 7.5 × 3.5 × 0.05 | 149 | 39.2 | 142 |
| 55 | $Ti_{0.75}Hf_{0.25}NiSn$ 2.0 × 3.5 × 5.0 | $Ca_{2.7}Bi_{0.3}Co_4O_9$ 5.0 × 3.5 × 5.0 | n-type 0.0 p-type 0.0 | n-type 3.0 p-type 3.0 | n-type 0.0 p-type 0.0 | $LaNiO_3$ sintered body 7.5 × 3.5 × 0.5 | 129 | 37.1 | 112 |
| 56 | $Ti_{0.75}Hf_{0.25}NiSn$ 2.0 × 3.5 × 5.0 | $Ca_{2.7}Bi_{0.3}Co_4O_9$ 5.0 × 3.5 × 5.0 | n-type 0.0 p-type 0.0 | n-type 3.0 p-type 3.0 | n-type 0.0 p-type 0.0 | $RuO_3$ sintered body 7.5 × 3.5 × 0.5 | 132 | 34.0 | 128 |
| 57 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 5.0 p-type 5.0 | n-type 0.0 p-type 0.0 | Silver 7.5 × 3.5 × 0.1 | 140 | 35.3 | 139 |
| 58 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 10 p-type 10 | n-type 0.0 p-type 0.0 | Silver 7.5 × 3.5 × 0.1 | 139 | 42.4 | 114 |
| 59 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 0.5 p-type 0.5 | n-type 0.5 p-type 0.5 | n-type 0.0 p-type 0.0 | Silver 7.5 × 3.5 × 0.1 | 137 | 35.3 | 133 |
| 60 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 1.5 p-type 1.5 | n-type 1.5 p-type 1.5 | n-type 0.0 p-type 0.0 | Silver 7.5 × 3.5 × 0.1 | 142 | 34.2 | 147 |
| 61 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 2.0 p-type 2.0 | n-type 1.0 p-type 1.0 | n-type 0.0 p-type 0.0 | Silver 7.5 × 3.5 × 0.1 | 140 | 45.3 | 108 |
| 62 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 1.0 | n-type 0.0 p-type 0.0 | Silver 7.5 × 3.5 × 0.1 | 143 | 40.0 | 128 |
| 63 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 138 | 35.3 | 135 |
| 64 | $Ti_{0.75}Hf_{0.25}NiSn$ 2.0 × 3.5 × 5.0 | $Ca_{2.7}Bi_{0.3}Co_4O_9$ 5.0 × 3.5 × 5.0 | n-type 3.0 p-type 0.0 | n-type 0.0 p-type 3.0 | n-type 0.0 p-type 0.0 | Silver 7.5 × 3.5 × 0.1 | 150 | 29.2 | 193 |
| 65 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 3.0 | n-type 0.0 p-type 0.0 | Platinum 7.5 × 3.5 × 0.05 | 153 | 36.8 | 159 |
| 66 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 3.0 | n-type 0.0 p-type 0.0 | Gold 7.5 × 3.5 × 0.05 | 154 | 35.3 | 168 |
| 67 | $Ti_{0.75}Hf_{0.25}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 3.0 | n-type 0.0 p-type 0.0 | $LaNiO_3$ sintered body 7.5 × 3.5 × 0.5 | 146 | 44.1 | 121 |

TABLE 2-3

| Example | n-type element composition length × width × height (mm) | p-type element composition width × length × height (mm) | Addition amount to silver paste (wt %) Ag$_2$O | Addition amount to silver paste (wt %) TiO$_2$ | Addition amount to silver paste (wt %) Ca$_{2.7}$Bi$_{0.3}$Co$_4$O$_9$ | Conductive member length × width × thickness (mm) | Open circuit voltage (mV) | Internal resistance (mΩ) | Maximum output (mW) |
|---|---|---|---|---|---|---|---|---|---|
| 68 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 3.0 | n-type 0.0 p-type 0.0 | RuO$_3$ sintered body 7.5 × 3.5 × 0.5 | 141 | 38.7 | 128 |
| 69 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 6.0 | n-type 0.0 p-type 0.0 | Silver 7.5 × 3.5 × 0.1 | 139 | 35.3 | 137 |
| 70 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 0.0 p-type 3.0 | n-type 1.0 p-type 0.0 | n-type 0.0 p-type 0.0 | Silver 7.5 × 3.5 × 0.1 | 140 | 35.3 | 139 |
| 71 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 3.0 p-type 0.0 | n-type 0.0 p-type 0.0 | Silver 7.5 × 3.5 × 0.1 | 146 | 35.3 | 151 |
| 72 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 0.5 | Silver 7.5 × 3.5 × 0.1 | 144 | 35.3 | 147 |
| 73 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 1.0 | Silver 7.5 × 3.5 × 0.1 | 147 | 39.9 | 136 |
| 74 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 3.0 | Silver 7.5 × 3.5 × 0.1 | 140 | 36.8 | 133 |
| 75 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 141 | 35.2 | 141 |
| 76 | Ti$_{0.75}$Hf$_{0.25}$NiSn 2.0 × 3.5 × 5.0 | Ca$_{2.7}$Bi$_{0.3}$Co$_4$O$_9$ 5.0 × 3.5 × 5.0 | n-type 3.0 p-type 0.0 | n-type 0.0 p-type 0.0 | n-type 0.0 p-type 6.0 | Silver 7.5 × 3.5 × 0.1 | 146 | 29.6 | 180 |
| 77 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 6.0 | Platinum 7.5 × 3.5 × 0.05 | 145 | 35.7 | 147 |
| 78 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 6.0 | Gold 7.5 × 3.5 × 0.05 | 141 | 35.3 | 141 |
| 79 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 6.0 | LaNiO$_3$ sintered body 7.5 × 3.5 × 0.5 | 138 | 41.5 | 115 |
| 80 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 6.0 | RuO$_3$ sintered body 7.5 × 3.5 × 0.5 | 139 | 40.0 | 121 |
| 81 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 140 | 35.8 | 137 |
| 82 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 1.0 p-type 0.0 | n-type 0.0 p-type 0.0 | n-type 0.0 p-type 6.0 | Silver 7.5 × 3.5 × 0.1 | 134 | 37.7 | 119 |

TABLE 2-4

| Example | n-type element composition length × width × height (mm) | p-type element composition width × length × height (mm) | Addition amount to silver paste (wt %) Ag$_2$O | Addition amount to silver paste (wt %) TiO$_2$ | Addition amount to silver paste (wt %) Ca$_{2.7}$Bi$_{0.3}$Co$_4$O$_9$ | Conductive member length × width × thickness (mm) | Open circuit voltage (mV) | Internal resistance (mΩ) | Maximum output (mW) |
|---|---|---|---|---|---|---|---|---|---|
| 83 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 5.0 p-type 0.0 | n-type 0.0 p-type 0.0 | n-type 0.0 p-type 6.0 | Silver 7.5 × 3.5 × 0.1 | 142 | 35.3 | 143 |
| 84 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 8.0 p-type 0.0 | n-type 0.0 p-type 0.0 | n-type 0.0 p-type 6.0 | Silver 7.5 × 3.5 × 0.1 | 145 | 34.9 | 151 |
| 85 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 1.0 p-type 0.0 | n-type 0.0 p-type 0.0 | n-type 0.0 p-type 6.0 | Silver 7.5 × 3.5 × 0.1 | 140 | 35.3 | 139 |
| 86 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 0.0 | n-type 0.0 p-type 0.5 | Silver 7.5 × 3.5 × 0.1 | 135 | 35.5 | 128 |
| 87 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 0.0 | n-type 0.0 p-type 1.0 | Silver 7.5 × 3.5 × 0.1 | 152 | 36.0 | 160 |
| 88 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 0.0 | n-type 0.0 p-type 3.0 | Silver 7.5 × 3.5 × 0.1 | 148 | 35.3 | 155 |
| 89 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 141 | 37.7 | 132 |
| 90 | Ti$_{0.75}$Hf$_{0.25}$NiSn 2.0 × 3.5 × 5.0 | Ca$_{2.7}$Bi$_{0.3}$Co$_4$O$_9$ 5.0 × 3.5 × 5.0 | n-type 0.0 p-type 0.0 | n-type 3.0 p-type 0.0 | n-type 0.0 p-type 6.0 | Silver 7.5 × 3.5 × 0.1 | 137 | 30.5 | 154 |
| 91 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 0.0 | n-type 0.0 p-type 6.0 | Platinum 7.5 × 3.5 × 0.05 | 146 | 35.3 | 151 |
| 92 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 0.0 | n-type 0.0 p-type 6.0 | Gold 7.5 × 3.5 × 0.05 | 148 | 35.8 | 153 |
| 93 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 0.0 | n-type 0.0 p-type 6.0 | LaNiO$_3$ sintered body 7.5 × 3.5 × 0.5 | 140 | 35.3 | 139 |
| 94 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 0.0 | n-type 0.0 p-type 6.0 | RuO$_3$ sintered body 7.5 × 3.5 × 0.5 | 142 | 38.2 | 132 |
| 95 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 145 | 37.3 | 141 |

TABLE 2-4-continued

| Example | n-type element composition length × width × height (mm) | p-type element composition width × length × height (mm) | Addition amount to silver paste (wt %) Ag$_2$O | TiO$_2$ | Ca$_{2.7}$Bi$_{0.3}$Co$_4$O$_9$ | Conductive member length × width × thickness (mm) | Open circuit voltage (mV) | Internal resistance (mΩ) | Maximum output (mW) |
|---|---|---|---|---|---|---|---|---|---|
| 96 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 1.0 p-type 0.0 | n-type 0.0 p-type 6.0 | Silver 7.5 × 3.5 × 0.1 | 140 | 40.0 | 123 |
| 97 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 5.0 p-type 0.0 | n-type 0.0 p-type 6.0 | Silver 7.5 × 3.5 × 0.1 | 151 | 35.3 | 161 |

TABLE 2-5

| Example | n-type element composition length × width × height (mm) | p-type element composition width × length × height (mm) | Addition amount to silver paste (wt %) Ag$_2$O | TiO$_2$ | Ca$_{2.7}$Bi$_{0.3}$Co$_4$O$_9$ | Conductive member length × width × thickness (mm) | Open circuit voltage (mV) | Internal resistance (mΩ) | Maximum output (mW) |
|---|---|---|---|---|---|---|---|---|---|
| 98 | Ti$_{0.75}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 1.0 p-type 0.0 | n-type 0.0 p-type 6.0 | Silver 7.5 × 3.5 × 0.1 | 144 | 35.9 | 145 |
| 99 | Ti$_{0.75}$Hf$_{0.25}$NiSn 3.5 × 3.5 × 5.0 | Ca$_3$Co$_4$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 142 | 45.9 | 110 |
| 100 | Ti$_{0.75}$Hf$_{0.25}$NiSn 3.5 × 3.5 × 5.0 | Ca$_{2.5}$Bi$_{0.5}$Co$_4$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 131 | 40.1 | 107 |
| 101 | Ti$_{0.75}$Hf$_{0.25}$NiSn 3.5 × 3.5 × 5.0 | Ca$_{2.5}$Bi$_{0.5}$Co$_4$O$_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 133 | 40.6 | 109 |
| 102 | Ti$_{0.75}$Hf$_{0.25}$NiSn 3.5 × 3.5 × 5.0 | Ca$_{2.5}$Bi$_{0.5}$Co$_4$O$_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 138 | 41.3 | 116 |
| 103 | Ti$_{0.75}$Hf$_{0.25}$NiSn 3.5 × 3.5 × 5.0 | Ca$_{2.5}$Bi$_{0.5}$Co$_4$O$_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 128 | 40.5 | 102 |
| 104 | Ti$_{0.75}$Hf$_{0.25}$NiSn 3.5 × 3.5 × 5.0 | Ca$_{2.5}$Bi$_{0.5}$Co$_4$O9 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 131 | 40.2 | 106 |
| 105 | TiNiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 137 | 35.8 | 132 |
| 106 | TiNiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 138 | 35.7 | 133 |
| 107 | TiNiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 3.0 p-type 3.0 | n-type 0.0 p-type 0.0 | Silver 7.5 × 3.5 × 0.1 | 142 | 37.3 | 135 |
| 108 | TiNiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 3.0 p-type 0.0 | n-type 0.0 p-type 0.0 | Silver 7.5 × 3.5 × 0.1 | 140 | 38.8 | 126 |
| 109 | TiNiSn 3.5 × 3.5 × 5.0 | Ca$_{2.7}$Bi$_{0.3}$Co$_4$O$_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 138 | 37.7 | 125 |
| 110 | TiNiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 136 | 35.8 | 130 |
| 111 | TiNiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 131 | 37.3 | 115 |
| 112 | TiNiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 137 | 40.9 | 115 |

TABLE 2-6

| Example | n-type element composition length × width × height (mm) | p-type element composition width × length × height (mm) | Addition amount to silver paste (wt %) Ag$_2$O | TiO$_2$ | Ca$_{2.7}$Bi$_{0.3}$Co$_4$O$_9$ | Conductive member length × width × thickness (mm) | Open circuit voltage (mV) | Internal resistance (mΩ) | Maximum output (mW) |
|---|---|---|---|---|---|---|---|---|---|
| 113 | Ti$_{0.9}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 141 | 36.7 | 135 |
| 114 | Ti$_{0.9}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 140 | 38.4 | 128 |
| 115 | Ti$_{0.9}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 144 | 35.2 | 147 |
| 116 | Ti$_{0.9}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 0.0 p-type 3.0 | n-type 3.0 p-type 0.0 | n-type 0.0 p-type 0.0 | Silver 7.5 × 3.5 × 0.1 | 139 | 38.6 | 125 |
| 117 | Ti$_{0.9}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 140 | 35.6 | 138 |

TABLE 2-6-continued

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
| --- | --- | --- | --- | --- | --- | --- | --- | --- | --- |
| | | | $Ag_2O$ | $TiO_2$ | $Ca_{2.7}Bi_{0.3}Co_4O_9$ | | | | |
| 118 | $Ti_{0.9}Hf_{0.1}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 135 | 38.9 | 117 |
| 119 | $Ti_{0.9}Hf_{0.1}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 146 | 35.8 | 149 |
| 120 | $Ti_{0.9}Hf_{0.1}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 143 | 35.6 | 144 |
| 121 | $Ti_{0.8}Hf_{0.2}NiSn$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 139 | 35.4 | 137 |
| 122 | $Ti_{0.7}Hf_{0.3}NiSn$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 135 | 35.3 | 129 |
| 123 | $Ti_{0.5}Hf_{0.5}NiSn$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 130 | 35.4 | 119 |
| 124 | $Ti_{0.9}Zr_{0.1}NiSn$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 139 | 35.8 | 135 |
| 125 | $Ti_{0.9}Zr_{0.1}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 141 | 36.6 | 136 |
| 126 | $Ti_{0.9}Zr_{0.1}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 136 | 35.8 | 129 |
| 127 | $Ti_{0.9}Zr_{0.1}NiSn$ 3.5 × 3.5 × 5.0 | $Ca_{2.7}Bi_{0.3}Co_4O_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 139 | 35.8 | 135 |

TABLE 2-7

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
| --- | --- | --- | --- | --- | --- | --- | --- | --- | --- |
| | | | $Ag_2O$ | $TiO_2$ | $Ca_{2.7}Bi_{0.3}Co_4O_9$ | | | | |
| 128 | $Ti_{0.9}Zr_{0.1}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 147 | 38.8 | 139 |
| 129 | $Ti_{0.9}Zr_{0.1}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 139 | 40.8 | 119 |
| 130 | $Ti_{0.9}Zr_{0.1}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 140 | 37.6 | 130 |
| 131 | $Ti_{0.8}Zr_{0.2}NiSn$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 138 | 35.9 | 133 |
| 132 | $Ti_{0.8}Zr_{0.2}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 139 | 36.9 | 131 |
| 133 | $Ti_{0.8}Zr_{0.2}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 139 | 35.5 | 136 |
| 134 | $Ti_{0.8}Zr_{0.2}NiSn$ 3.5 × 3.5 × 5.0 | $Ca_{2.7}Bi_{0.3}Co_4O_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 143 | 39.3 | 129 |
| 135 | $Ti_{0.8}Zr_{0.2}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 139 | 35.9 | 134 |
| 136 | $Ti_{0.8}Zr_{0.2}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 137 | 37.9 | 123 |
| 137 | $Ti_{0.8}Zr_{0.2}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 139 | 40.9 | 118 |
| 138 | $Ti_{0.7}Zr_{0.3}NiSn$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 141 | 36.1 | 138 |
| 139 | $Ti_{0.7}Zr_{0.3}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 136 | 36.8 | 126 |
| 140 | $Ti_{0.5}Zr_{0.5}NiSn$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 138 | 35.9 | 133 |
| 141 | $Zr_{0.9}Hf_{0.1}NiSn$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 0.146 | 36.4 | 146 |
| 142 | $Zr_{0.8}Hf_{0.2}NiSn$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 148 | 36.9 | 148 |

TABLE 2-8

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | $Ag_2O$ | $TiO_2$ | $Ca_{2.7}Bi_{0.3}Co_4O_9$ | | | | |
| 143 | $Zr_{0.8}Hf_{0.2}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 145 | 39.7 | 132 |
| 144 | $Zr_{0.8}Hf_{0.2}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 149 | 41.9 | 133 |
| 145 | $Zr_{0.8}Hf_{0.2}NiSn$ 3.5 × 3.5 × 5.0 | $Ca_{2.7}Bi_{0.3}Co_4O_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 148 | 38.7 | 141 |
| 146 | $Zr_{0.8}Hf_{0.2}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 151 | 36.9 | 154 |
| 147 | $Zr_{0.8}Hf_{0.2}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 148 | 37.8 | 144 |
| 148 | $Zr_{0.8}Hf_{0.2}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 147 | 38.9 | 139 |
| 149 | $Zr_{0.7}Hf_{0.3}NiSn$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 144 | 40.1 | 130 |
| 150 | $Zr_{0.5}Hf_{0.5}NiSn$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 139 | 36.8 | 131 |
| 151 | $Zr_{0.9}Ti_{0.1}NiSn$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 140 | 35.8 | 137 |
| 152 | $Zr_{0.9}Ti_{0.1}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 143 | 36.8 | 139 |
| 153 | $Zr_{0.9}Ti_{0.1}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 142 | 37.4 | 135 |
| 154 | $Zr_{0.9}Ti_{0.1}NiSn$ 3.5 × 3.5 × 5.0 | $Ca_{2.7}Bi_{0.3}Co_4O_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 149 | 35.8 | 156 |
| 155 | $Zr_{0.9}Ti_{0.1}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 132 | 39.0 | 112 |
| 156 | $Zr_{0.9}Ti_{0.1}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 140 | 38.1 | 128 |
| 157 | $Zr_{0.9}Ti_{0.1}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 142 | 36.7 | 138 |

TABLE 2-9

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | $Ag_2O$ | $TiO_2$ | $Ca_{2.7}Bi_{0.3}Co_4O_9$ | | | | |
| 158 | $Zr_{0.8}Ti_{0.2}NiSn$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 141 | 35.9 | 139 |
| 159 | $Zr_{0.8}Ti_{0.2}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 144 | 38.9 | 134 |
| 160 | $Zr_{0.8}Ti_{0.2}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 142 | 39.2 | 129 |
| 161 | $Zr_{0.8}Ti_{0.2}NiSn$ 3.5 × 3.5 × 5.0 | $Ca_{2.7}Bi_{0.3}Co_4O_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 143 | 36.7 | 139 |
| 162 | $Zr_{0.8}Ti_{0.2}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 141 | 40.1 | 124 |
| 163 | $Zr_{0.8}Ti_{0.2}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 142 | 38.6 | 130 |
| 164 | $Zr_{0.8}Ti_{0.2}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 145 | 35.8 | 147 |
| 165 | $Zr_{0.8}Ti_{0.2}NiSn$ 3.5 × 3.5 × 5.0 | $Ca_3Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 144 | 46.5 | 111 |
| 166 | $Zr_{0.8}Ti_{0.2}NiSn$ 3.5 × 3.5 × 5.0 | $Ca_3Co_4O_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 148 | 48.5 | 113 |
| 167 | $Zr_{0.8}Ti_{0.2}NiSn$ 3.5 × 3.5 × 5.0 | $Ca_{2.5}Bi_{0.5}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 132 | 40.7 | 107 |
| 168 | $Zr_{0.8}Ti_{0.2}NiSn$ 3.5 × 3.5 × 5.0 | $Ca_{2.5}Bi_{0.5}Co_4O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 139 | 40.9 | 118 |
| 169 | $Zr_{0.8}Ti_{0.2}NiSn$ 3.5 × 3.5 × 5.0 | $Ca_{2.5}Bi_{0.5}Co_4O_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 132 | 41.2 | 106 |
| 170 | $Zr_{0.8}Ti_{0.2}NiSn$ 3.5 × 3.5 × 5.0 | $Ca_{2.5}Bi_{0.5}Co_4O_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 133 | 41.0 | 108 |

TABLE 2-9-continued

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | $Ag_2O$ | $TiO_2$ | $Ca_{2.7}Bi_{0.3}Co_4O_9$ | | | | |
| 171 | $Zr_{0.8}Ti_{0.2}NiSn$ 3.5 × 3.5 × 5.0 | $Ca_{2.5}Bi_{0.5}Co_4O_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 129 | 40.7 | 102 |
| 172 | $Zr_{0.8}Ti_{0.2}NiSn$ 3.5 × 3.5 × 5.0 | $Ca_{2.5}Bi_{0.5}Co_4O_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 138 | 40.7 | 117 |

TABLE 2-10

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | $Ag_2O$ | $TiO_2$ | $Ca_{2.7}Bi_{0.3}Co_4O_9$ | | | | |
| 173 | $Zr_{0.8}Ti_{0.2}NiSn$ 3.5 × 3.5 × 5.0 | $Ca_{2.5}Bi_{0.5}Co_4O_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 135 | 39.1 | 117 |
| 174 | $Zr_{0.7}Ti_{0.3}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 0.0 | n-type 0.0 p-type 0.0 | Silver 7.5 × 3.5 × 0.1 | 138 | 36.1 | 131 |
| 175 | $Zr_{0.7}Ti_{0.3}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 134 | 38.4 | 117 |
| 176 | $Zr_{0.5}Ti_{0.5}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 0.0 | n-type 0.0 p-type 0.0 | Silver 7.5 × 3.5 × 0.1 | 136 | 36.6 | 127 |
| 177 | $Zr_{0.5}Ti_{0.5}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 142 | 36.6 | 138 |
| 178 | $Zr_{0.9}Ti_{0.05}Hf_{0.05}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 0.0 | n-type 0.0 p-type 0.0 | Silver 7.5 × 3.5 × 0.1 | 148 | 38.5 | 142 |
| 179 | $Zr_{0.9}Ti_{0.05}Hf_{0.05}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 150 | 39.7 | 142 |
| 180 | $Zr_{0.8}Ti_{0.1}Hf_{0.1}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 0.0 | n-type 0.0 p-type 0.0 | Silver 7.5 × 3.5 × 0.1 | 149 | 39.7 | 140 |
| 181 | $Zr_{0.8}Ti_{0.1}Hf_{0.1}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 151 | 41.3 | 138 |
| 182 | $Zr_{0.8}Ti_{0.1}Hf_{0.1}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 153 | 41.4 | 141 |
| 183 | $Zr_{0.8}Ti_{0.1}Hf_{0.1}NiSn$ 3.5 × 3.5 × 5.0 | $Ca_{2.7}Bi_{0.3}Co_4O_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 148 | 40.3 | 136 |
| 184 | $Zr_{0.8}Ti_{0.1}Hf_{0.1}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 148 | 39.7 | 138 |
| 185 | $Zr_{0.8}Ti_{0.1}Hf_{0.1}NiSn$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 152 | 40.9 | 141 |
| 186 | $Zr_{0.8}Ti_{0.1}Hf_{0.1}NiSn$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 151 | 41.5 | 137 |
| 187 | $Zr_{0.8}Ti_{0.1}Hf_{0.1}NiSn$ 3.5 × 3.5 × 5.0 | $Ca_3Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 152 | 42.4 | 136 |

TABLE 2-11

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | $Ag_2O$ | $TiO_2$ | $Ca_{2.7}Bi_{0.3}Co_4O_9$ | | | | |
| 188 | $Zr_{0.8}Ti_{0.1}Hf_{0.1}NiSn$ 3.5 × 3.5 × 5.0 | $Ca_3Co_4O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 151 | 42.9 | 133 |
| 189 | $Zr_{0.8}Ti_{0.1}Hf_{0.1}NiSn$ 3.5 × 3.5 × 5.0 | $Ca_{2.5}Bi_{0.5}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 145 | 43.9 | 120 |
| 190 | $Zr_{0.8}Ti_{0.1}Hf_{0.1}NiSn$ 3.5 × 3.5 × 5.0 | $Ca_{2.5}Bi_{0.5}Co_4O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 142 | 42.1 | 120 |

TABLE 2-11-continued

| Example | n-type element composition length × width × height (mm) | p-type element composition width × length × height (mm) | Addition amount to silver paste (wt %) Ag$_2$O | TiO$_2$ | Ca$_{2.7}$Bi$_{0.3}$Co$_4$O$_9$ | Conductive member length × width × thickness (mm) | Open circuit voltage (mV) | Internal resistance (mΩ) | Maximum output (mW) |
|---|---|---|---|---|---|---|---|---|---|
| 191 | Zr$_{0.7}$Ti$_{0.15}$Hf$_{0.15}$NiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 146 | 39.4 | 135 |
| 192 | Zr$_{0.5}$Ti$_{0.25}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 141 | 38.9 | 128 |
| 193 | Zr$_{0.8}$Ti$_{0.15}$Hf$_{0.05}$NiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 144 | 38.8 | 133 |
| 194 | Zr$_{0.8}$Ti$_{0.15}$Hf$_{0.05}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 146 | 41.4 | 129 |
| 195 | Zr$_{0.8}$Ti$_{0.15}$Hf$_{0.05}$NiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 3.0 p-type 3.0 | n-type 0.0 p-type 0.0 | Silver 7.5 × 3.5 × 0.1 | 149 | 39.9 | 139 |
| 196 | Zr$_{0.8}$Ti$_{0.15}$Hf$_{0.05}$NiSn 3.5 × 3.5 × 5.0 | Ca$_{2.7}$Bi$_{0.3}$Co$_4$O$_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 149 | 39.8 | 139 |
| 197 | Zr$_{0.8}$Ti$_{0.15}$Hf$_{0.05}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 148 | 41.3 | 132 |
| 198 | Zr$_{0.8}$Ti$_{0.15}$Hf$_{0.05}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 147 | 40.9 | 132 |
| 199 | Zr$_{0.8}$Ti$_{0.15}$Hf$_{0.05}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 144 | 39.8 | 130 |
| 200 | Zr$_{0.8}$Ti$_{0.15}$Hf$_{0.05}$NiSn 3.5 × 3.5 × 5.0 | Ca$_3$Co$_4$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 150 | 43.4 | 130 |
| 201 | Zr$_{0.8}$Ti$_{0.15}$Hf$_{0.05}$NiSn 3.5 × 3.5 × 5.0 | Ca$_{2.5}$Bi$_{0.5}$Co$_4$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 148 | 44.5 | 123 |
| 202 | Zr$_{0.8}$Ti$_{0.15}$Hf$_{0.05}$NiSn 3.5 × 3.5 × 5.0 | Ca$_{2.5}$Bi$_{0.5}$Co$_4$O$_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 144 | 41.3 | 126 |

TABLE 2-12

| Example | n-type element composition length × width × height (mm) | p-type element composition width × length × height (mm) | Addition amount to silver paste (wt %) Ag$_2$O | TiO$_2$ | Ca$_{2.7}$Bi$_{0.3}$Co$_4$O$_9$ | Conductive member length × width × thickness (mm) | Open circuit voltage (mV) | Internal resistance (mΩ) | Maximum output (mW) |
|---|---|---|---|---|---|---|---|---|---|
| 203 | Zr$_{0.8}$Ti$_{0.05}$Hf$_{0.15}$NiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 152 | 42.6 | 135 |
| 204 | Zr$_{0.8}$Ti$_{0.05}$Hf$_{0.15}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 151 | 41.2 | 138 |
| 205 | Zr$_{0.8}$Ti$_{0.05}$Hf$_{0.15}$NiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 3.0 p-type 3.0 | n-type 0.0 p-type 0.0 | Silver 7.5 × 3.5 × 0.1 | 149 | 41.8 | 133 |
| 206 | Zr$_{0.8}$Ti$_{0.05}$Hf$_{0.15}$NiSn 3.5 × 3.5 × 5.0 | Ca$_{2.7}$Bi$_{0.3}$Co$_4$O$_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 151 | 42.4 | 134 |
| 207 | Zr$_{0.7}$Ti$_{0.2}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 149 | 40.6 | 137 |
| 208 | Zr$_{0.7}$Ti$_{0.2}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 141 | 40.2 | 124 |
| 209 | Zr$_{0.7}$Ti$_{0.2}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 148 | 41.3 | 133 |
| 210 | Zr$_{0.7}$Ti$_{0.2}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 150 | 41.9 | 134 |
| 211 | Zr$_{0.6}$Ti$_{0.25}$Hf$_{0.15}$NiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 147 | 41.7 | 130 |
| 212 | Zr$_{0.6}$Ti$_{0.15}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 147 | 43.0 | 126 |
| 213 | Ti$_{0.9}$Zr$_{0.05}$Hf$_{0.05}$NiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 140 | 36.7 | 134 |
| 214 | Ti$_{0.9}$Zr$_{0.05}$Hf$_{0.05}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 145 | 36.3 | 145 |
| 215 | Ti$_{0.8}$Zr$_{0.1}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 144 | 36.7 | 141 |
| 216 | Ti$_{0.8}$Zr$_{0.1}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 0.0 p-type 3.0 | n-type 3.0 p-type 0.0 | n-type 0.0 p-type 0.0 | Silver 7.5 × 3.5 × 0.1 | 144 | 39.7 | 130 |
| 217 | Ti$_{0.8}$Zr$_{0.1}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 146 | 36.7 | 145 |

TABLE 2-13

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | Ag$_2$O | TiO$_2$ | Ca$_{2.7}$Bi$_{0.3}$Co$_4$O$_9$ | | | | |
| 218 | Ti$_{0.8}$Zr$_{0.1}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 141 | 37.3 | 133 |
| 219 | Ti$_{0.8}$Zr$_{0.1}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 144 | 36.7 | 141 |
| 220 | Ti$_{0.8}$Zr$_{0.1}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 146 | 38.8 | 136 |
| 221 | Ti$_{0.8}$Zr$_{0.1}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 147 | 36.5 | 147 |
| 222 | Ti$_{0.8}$Zr$_{0.1}$Hf$_{0.1}$NiSn 3.5 × 3.5 × 5.0 | Ca$_3$Co$_4$O$_9$ 3.5 × 3.5 × 5.0 | n-type 3.0 p-type 0.0 | n-type 0.0 p-type 0.0 | n-type 0.0 p-type 0.0 | Silver 7.5 × 3.5 × 0.1 | 146 | 47.2 | 113 |
| 223 | Ti$_{0.8}$Zr$_{0.1}$Hf$_{0.1}$NiSn 3.5 × 3.5 × 5.0 | Ca$_3$Co$_4$O$_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 145 | 47.3 | 111 |
| 224 | Ti$_{0.8}$Zr$_{0.1}$Hf$_{0.1}$NiSn 3.5 × 3.5 × 5.0 | Ca$_{2.5}$Bi$_{0.5}$Co$_4$O$_9$ 3.5 × 3.5 × 5.0 | n-type 3.0 p-type 0.0 | n-type 0.0 p-type 0.0 | n-type 0.0 p-type 0.0 | Silver 7.5 × 3.5 × 0.1 | 134 | 43.5 | 104 |
| 225 | Ti$_{0.8}$Zr$_{0.1}$Hf$_{0.1}$NiSn 3.5 × 3.5 × 5.0 | Ca$_{2.5}$Bi$_{0.5}$Co$_4$O$_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 131 | 43.9 | 97.8 |
| 226 | Ti$_{0.7}$Zr$_{0.15}$Hf$_{0.15}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 139 | 35.2 | 137 |
| 227 | Ti$_{0.5}$Zr$_{0.25}$Hf$_{0.25}$NiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 134 | 34.9 | 128 |
| 228 | Ti$_{0.8}$Zr$_{0.15}$Hf$_{0.05}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 139 | 35.8 | 134 |
| 229 | Ti$_{0.8}$Zr$_{0.15}$Hf$_{0.05}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 137 | 38.4 | 123 |
| 230 | Ti$_{0.8}$Zr$_{0.15}$Hf$_{0.05}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 139 | 35.7 | 135 |
| 231 | Ti$_{0.8}$Zr$_{0.15}$Hf$_{0.05}$NiSn 3.5 × 3.5 × 5.0 | Ca$_{2.7}$Bi$_{0.3}$Co$_4$O$_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 142 | 35.8 | 141 |
| 232 | Ti$_{0.8}$Zr$_{0.15}$Hf$_{0.05}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 141 | 37.3 | 133 |

TABLE 2-14

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | Ag$_2$O | TiO$_2$ | Ca$_{2.7}$Bi$_{0.3}$Co$_4$O$_9$ | | | | |
| 233 | Ti$_{0.8}$Zr$_{0.15}$Hf$_{0.05}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 141 | 36.9 | 135 |
| 234 | Ti$_{0.8}$Zr$_{0.15}$Hf$_{0.05}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 139 | 35.8 | 135 |
| 235 | Ti$_{0.8}$Zr$_{0.15}$Hf$_{0.05}$NiSn 3.5 × 3.5 × 5.0 | Ca$_3$Co$_4$O$_9$ 3.5 × 3.5 × 5.0 | n-type 3.0 p-type 0.0 | n-type 0.0 p-type 0.0 | n-type 0.0 p-type 0.0 | Silver 7.5 × 3.5 × 0.1 | 144 | 46.4 | 111 |
| 236 | Ti$_{0.8}$Zr$_{0.15}$Hf$_{0.05}$NiSn 3.5 × 3.5 × 5.0 | Ca$_{2.5}$Bi$_{0.5}$Co$_4$O$_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 132 | 40.7 | 107 |
| 237 | Ti$_{0.8}$Zr$_{0.15}$Hf$_{0.05}$NiSn 3.5 × 3.5 × 5.0 | Ca$_{2.5}$Bi$_{0.5}$Co$_4$O$_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 137 | 45.3 | 104 |
| 238 | Ti$_{0.8}$Zr$_{0.05}$Hf$_{0.15}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 0.0 | Silver 7.5 × 3.5 × 0.1 | 146 | 36.6 | 145 |
| 239 | Ti$_{0.8}$Zr$_{0.05}$Hf$_{0.15}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 0.0 | Silver 7.5 × 3.5 × 0.1 | 146 | 36.7 | 144 |
| 240 | Ti$_{0.8}$Zr$_{0.05}$Hf$_{0.15}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 143 | 38.8 | 131 |
| 241 | Ti$_{0.8}$Zr$_{0.05}$Hf$_{0.15}$NiSn 3.5 × 3.5 × 5.0 | Ca$_{2.7}$Bi$_{0.3}$Co$_4$O$_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 146 | 39.4 | 135 |
| 242 | Ti$_{0.7}$Zr$_{0.2}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 140 | 35.5 | 137 |
| 243 | Ti$_{0.7}$Zr$_{0.2}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 139 | 38.2 | 126 |
| 244 | Ti$_{0.7}$Zr$_{0.2}$Hf$_{0.1}$NiSn 3.5 × 3.5 × 5.0 | Ca$_{2.7}$Bi$_{0.3}$Co$_4$O$_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 142 | 36.3 | 139 |
| 245 | Ti$_{0.7}$Zr$_{0.1}$Hf$_{0.2}$NiSn 3.5 × 3.5 × 5.0 | Ca$_{2.7}$Bi$_{0.3}$Co$_4$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 144 | 36.9 | 141 |

TABLE 2-14-continued

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | $Ag_2O$ | $TiO_2$ | $Ca_{2.7}Bi_{0.3}Co_4O_9$ | | | | |
| 246 | $Ti_{0.6}Zr_{0.25}Hf_{0.15}NiSn$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 136 | 36.7 | 127 |
| 247 | $Ti_{0.6}Zr_{0.15}Hf_{0.25}NiSn$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 138 | 40.0 | 118 |

TABLE 2-15

| Comparative Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | $Ag_2O$ | $TiO_2$ | $Ca_{2.7}Bi_{0.3}Co_4O_9$ | | | | |
| 2 | $CaMn_{0.98}Mo_{0.02}O_3$ 3.5 × 3.5 × 5.0 | $Ca_{2.7}Bi_{0.3}Co_4O_9$ 3.5 × 3.5 × 5.0 | n-type 0.0 p-type 0.0 | n-type 0.0 p-type 0.0 | n-type 0.0 p-type 0.0 | Silver 7.5 × 3.5 × 0.1 | 177 | 122 | 64.2 |
| 3 | $CaMn_{0.98}Mo_{0.02}O_3$ 3.5 × 3.5 × 5.0 | $Ca_{2.7}Bi_{0.3}Co_4O_9$ 3.5 × 3.5 × 5.0 | n-type 0.5 p-type 0.5 | n-type 0.0 p-type 0.0 | n-type 0.0 p-type 0.0 | Silver 7.5 × 3.5 × 0.1 | 175 | 118 | 64.8 |
| 4 | $CaMn_{0.98}Mo_{0.02}O_3$ 3.5 × 3.5 × 5.0 | $Ca_{2.7}Bi_{0.3}Co_4O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 189 | 179 | 50.0 |
| 5 | $CaMn_{0.98}Mo_{0.02}O_3$ 3.5 × 3.5 × 5.0 | $Ca_{2.7}Bi_{0.3}Co_4O_9$ 3.5 × 3.5 × 5.0 | n-type 0.0 p-type 0.0 | n-type 0.5 p-type 0.5 | n-type 0.0 p-type 0.0 | Silver 7.5 × 3.5 × 0.1 | 191 | 122 | 74.6 |
| 6. | $CaMn_{0.98}Mo_{0.02}O_3$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 201 | 194 | 52.1 |
| 7 | $CaMn_{0.98}Mo_{0.02}O_3$ 3.5 × 3.5 × 5.0 | $Ca_{2.7}Bi_{0.3}Co_4O_9$ 3.5 × 3.5 × 5.0 | n-type 0.0 p-type 0.0 | n-type 0.0 p-type 0.0 | n-type 6.0 p-type 6.0 | Silver 7.5 × 3.5 × 0.1 | 168 | 99.6 | 70.7 |
| 8 | $CaMn_{0.98}Mo_{0.02}O_3$ 3.5 × 3.5 × 5.0 | $Ca_{2.7}Bi_{0.3}Co_4O_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 175 | 132 | 58.0 |
| 9 | $CaMn_{0.98}Mo_{0.02}O_3$ 3.5 × 3.5 × 5.0 | $Ca_{2.7}Bi_{0.3}Co_4O_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 193 | 146 | 63.5 |

The thermoelectric conversion modules in Examples 38 to 123 are a thermoelectric conversion module including an n-type thermoelectric conversion element having a half-Heusler structure represented by the composition formula of the formula (2). The thermoelectric conversion modules in Examples 124 to 140 are a thermoelectric conversion module including an n-type thermoelectric conversion element having a half-Heusler structure represented by the composition formula of the formula (3). The thermoelectric conversion modules in Examples 141 to 150 are a thermoelectric conversion module including an n-type thermoelectric conversion element having a half-Heusler structure represented by the composition formula of the formula (4). The thermoelectric conversion modules in Examples 151 to 177 are a thermoelectric conversion module including an n-type thermoelectric conversion element having a half-Heusler structure represented by the composition formula of the formula (5). The thermoelectric conversion modules in Examples 178 to 212 are a thermoelectric conversion module including an n-type thermoelectric conversion element having a half-Heusler structure represented by the composition formula of the formula (6). The thermoelectric conversion modules in Examples 213 to 247 are a thermoelectric conversion module including an n-type thermoelectric conversion element having a half-Heusler structure represented by the composition formula of the formula (7).

The thermoelectric conversion modules in Examples 39 to 247 are characterized in that the silver paste for connection between the n-type thermoelectric conversion element and the conductive member contains a component (additive) including at least one of titanium oxide or silver oxide, and that the silver paste for connection between the p-type thermoelectric conversion element and the conductive member contains a component (additive) including at least one of titanium oxide or silver oxide or including an oxide used in the p-type thermoelectric conversion element.

The thermoelectric conversion modules in Examples 62 to 98, 102 to 104, 107 to 112, 115 to 120, 126 to 130, 133 to 137, 144 to 148, 153 to 157, 160 to 164, 169 to 173, 182 to 186, 195 to 199, 205 to 209, 217 to 221, 230 to 234, and 240 to 244 are characterized in that the silver paste for connection between the n-type thermoelectric conversion element and the conductive member contains a component (additive) different from that in the silver paste for connection between the p-type thermoelectric conversion element and the conductive member.

The thermoelectric conversion modules in Examples in 39 to 61, 99 to 101, 105, 106, 113, 114, 121 to 125, 131, 132, 138 to 143, 149 to 152, 158, 159, 165 to 168, 174 to 181, 187 to 194, 200 to 204, 210 to 216, 222 to 229, 235 to 239, and 245 to 247 are characterized in that the silver paste for connection between the n-type thermoelectric conversion element and the conductive member contains the same component (additive) as the silver paste for connection between the p-type thermoelectric conversion element and the conductive member.

The thermoelectric conversion modules in Examples 38 to 247 have a smaller internal resistance than the thermoelectric conversion modules in Comparative Examples 2 to 9. More specifically, the thermoelectric conversion module in Example 38 has an internal resistance of $0.0510\Omega$, which is smaller than the internal resistance of the thermoelectric conversion modules in Comparative Examples 2 to 9, $0.0996$ to $0.194\Omega$, and the thermoelectric conversion modules in Examples 39 to 247 have an internal resistance of $0.0284$ to $0.0473\Omega$, which is smaller than the internal resistance of the thermoelectric conversion module in Example 38, $0.0510\Omega$.

The fact that none of silver oxide ($Ag_2O$), titanium oxide ($TiO_2$), and a thermoelectric oxide ($Ca_{2.7}Bi_{0.3}Co_4O_9$) is added to the silver paste in the thermoelectric conversion module in Example 38 means that the reason why the thermoelectric conversion module in Example 38 has a smaller internal resistance than the thermoelectric conversion modules in Comparative Examples 2 to 9 is that the n-type thermoelectric conversion element used in the thermoelectric conversion module in Example 38 (n-type thermoelectric conversion element having a half-Heusler structure) has a lower electrical resistivity than $CaMn_{0.98}Mo_{0.02}O_3$.

Therefore, it has been found that the internal resistance can be lowered and the maximum output can be improved by the characteristics of the thermoelectric conversion module in Example 38.

The fact that the silver paste to which an additive such as silver oxide ($Ag_2O$), titanium oxide ($TiO_2$), or a thermoelectric oxide ($Ca_{2.7}Bi_{0.3}Co_4O_9$) is added is used in the thermoelectric conversion modules in Examples 39 to 247 means that the reason why the thermoelectric conversion modules in Examples 39 to 247 have a smaller internal resistance than the thermoelectric conversion module in Example 38 is that the silver paste to which an additive such as silver oxide ($Ag_2O$), titanium oxide ($TiO_2$), or a thermoelectric oxide ($Ca_{2.7}Bi_{0.3}Co_4O_9$) is added is used.

Therefore, from the characteristics of the thermoelectric conversion modules in Examples 39 to 247, it has been found that the maximum output of the thermoelectric conversion module can be improved by using a silver paste to which an additive such as silver oxide ($Ag_2O$), titanium oxide ($TiO_2$), or a thermoelectric oxide ($Ca_{2.7}Bi_{0.3}Co_4O_9$) is added.

The thermoelectric conversion modules in Comparative Examples 3 to 6, 8, and 9 have a maximum output of 64.8 mW, 50.0 mW, 74.6 mW, 52.1 mW, 58.0 mW, and 63.5 mW, respectively, and the thermoelectric conversion module in Comparative Example 2 has a maximum output of 64.2 mW. The thermoelectric conversion module in Comparative Example 2 uses a silver paste to which no additive is added, and the thermoelectric conversion modules in Comparative Examples 3 to 6, 8, and 9 use a silver paste to which an additive is added. As the result, the thermoelectric conversion modules prepared using a silver paste to which an additive is added in Comparative Examples 3 to 6, 8, and 9 have a maximum output of 1.01 times, 0.78 times, 1.16 times, 0.81 times, 0.90 times, and 0.99 times the maximum output of the thermoelectric conversion module prepared using a silver paste to which no additive is added in Comparative Example 2, respectively.

Meanwhile, the thermoelectric conversion modules in Examples 39, 41, 49, 51, 75, and 89 were prepared using the same silver paste (silver paste containing the same additive (one of $Ag_2O$, $TiO_2$, and $Ca_{2.7}Bi_{0.3}Co_4O_9$) in the same amount) as the silver paste in the thermoelectric conversion modules in Comparative Examples 3 to 6, 8, and 9, respectively. The thermoelectric conversion modules in Examples 39, 41, 49, 51, 75, and 89 have a maximum output of 135 mW, 126 mW, 135 mW, 139 mW, 141 mW, and 132 mW, respectively. The thermoelectric conversion module prepared using a silver paste to which no additive is added in Example 38 has a maximum output of 99 mW. As the result, the thermoelectric conversion modules prepared using a silver paste to which an additive is added in Examples 39, 41, 49, 51, 75, and 89 have a maximum output of 1.36 times, 1.27 times, 1.36 times, 1.40 times, 1.42 times, and 1.33 times the maximum output of the thermoelectric conversion module prepared using a silver paste to which no additive is added in Example 38, respectively.

As described above, in Examples 39, 41, 49, 51, 75, and 89, the effect of the combination of $Ti_{0.98}Hf_{0.02}NiSn$ having a half-Heusler structure as a material for an n-type thermoelectric conversion element and a silver paste to which an additive is added is 1.27 times to 1.42 times, whereas in Comparative Examples 3 to 6, 8, and 9, the effect of the combination of a thermoelectric oxide material ($CaMn_{0.98}Mo_{0.02}O_3$) as a material for an n-type thermoelectric conversion element and a silver paste to which an additive is added is 0.78 times to 1.16 times.

Therefore, it has been found that the combination of $Ti_{0.98}Hf_{0.02}NiSn$ having a half-Heusler structure as a material for an n-type thermoelectric conversion element and a silver paste to which an additive is added is effective for improving the maximum output of the thermoelectric conversion module.

As described above, the effect of the combination of $Ti_{0.98}Hf_{0.02}NiSn$ having a half-Heusler structure as a material for an n-type thermoelectric conversion element and a silver paste to which an additive is added is large because the n-type thermoelectric conversion element having a half-Heusler structure (n-type thermoelectric conversion element in Examples 1 to 37) has a higher ZT than $CaMn_{0.98}Mo_{0.02}O_3$ as shown in Tables 1-1 and 1-2.

The thermoelectric conversion modules in each group of Examples 42 to 44, Examples 52 to 54, Examples 64 to 66, Examples 76 to 78, and Examples 89, 91, and 92 are thermoelectric conversion modules using silver, platinum, and gold, respectively, as a conductive member, and the thermoelectric conversion modules in each group of Examples 45 and 46, Examples 55 and 56, Examples 67 and 68, Examples 79 and 80, and Examples 93 and 94 are thermoelectric conversion modules using a $LaNiO_3$ sintered body and a $RuO_3$ sintered body, respectively, as a conductive member. The thermoelectric conversion modules in Examples 42 to 44, Examples 52 to 54, Examples 64 to 66, Examples 76 to 78, and Examples 89, 91, and 92 have a larger maximum output than the thermoelectric conversion modules in Examples 45 and 46, Examples 55 and 56, Examples 67 and 68, Examples 79 and 80, and Examples 93 and 94, respectively.

Therefore, any one of gold, silver, and platinum is preferably used as the conductive member.

The thermoelectric conversion modules in Examples 42, 52, 64, 76, and 90 are a thermoelectric conversion module in which a plane, in the p-type thermoelectric conversion element, parallel to the surface in contact with the conductive member has a larger area than a plane, in the n-type thermoelectric conversion element, parallel to the surface in contact with the conductive member, and the thermoelectric conversion modules in Examples 41, 51, 63, 75, and 89 are a thermoelectric conversion module in which a plane, in the p-type thermoelectric conversion element, parallel to the surface in contact with the conductive member has the same area as a plane, in the n-type thermoelectric conversion element, parallel to the surface in contact with the conductive member. The thermoelectric conversion modules in Examples 42, 52, 64, 76, and 90 have a larger maximum output than the thermoelectric conversion modules in Examples 41, 51, 63, 75, and 89, respectively. Note that the thermoelectric conversion modules in Examples 41, 51, 63, 75, and 89 are compared with the thermoelectric conversion modules in Examples 42, 52, 64, 76, and 90, respectively, to compare the thermoelectric conversion modules using the same silver paste. Therefore, a plane, in the p-type thermoelectric conversion element, parallel to the surface in contact with the conductive member preferably has a larger area than a plane, in the n-type thermoelectric conversion element, parallel to the surface in contact with the conductive member.

As described above, the maximum output of a thermoelectric conversion module can be improved by using an n-type thermoelectric conversion element having a half-Heusler structure having the composition formula represented by any one of the formulae (2) to (7).

Example 248

A thermoelectric conversion module in Example 248 was prepared with the following method in the same manner as the thermoelectric conversion module in Example 38 except that the p-type thermoelectric conversion element was prepared as follows.
[Preparation of p-Type Thermoelectric Conversion Element]

The following method was used to prepare a p-type thermoelectric conversion material having a composition formula represented by $Bi_2Sr_2Co_2O_9$. First, bismuth oxide ($Bi_2O_3$), strontium carbonate ($SrCO_3$), and cobalt oxide ($Co_3O_4$) were weighed so that the ratio of the number of moles is Bi:Sr:Co=2:2:2, and sufficiently mixed.

The obtained mixture was put into an alumina crucible and fired in the air at 800° C. for 10 hours, and the obtained fired product was sufficiently mixed using an agate mortar and pestle. The resulting powder was press-molded into a disk shape having a diameter of 20 mm and a thickness of about 2 to 10 mm, a gold sheet was spread on an alumina boat, and the molded body was placed on the gold sheet and fired in the air at 840° C. for 20 hours. Next, the obtained sintered body was ground using an agate mortar and pestle.

The obtained powder was press-molded into a disk shape having a diameter of 40 mm and a thickness of 5 mm, and hot-pressed and sintered in the air under a uniaxial pressure of 10 MPa at 860° C. for 20 hours. The obtained hot-pressed and sintered body was ground and cut to form a rectangular parallelepiped such that the size of the surface perpendicular to the pressed surface was 3.5 mm×3.5 mm and the length was 5 mm, and thus a p-type thermoelectric conversion material was obtained. The bonding surface was the surface having a size of 3.5 mm×3.5 mm.
[Preparation of Thermoelectric Conversion Module]

A thermoelectric conversion module in Example 248 was prepared using the same conditions and the same method as in Example 38 except that a different material of the p-type thermoelectric conversion element was used.

Example 249

A thermoelectric conversion module in Example 249 was prepared in the same manner as in Example 248 except for using a silver paste to which an additive was added.

Examples 250 to 270

Thermoelectric conversion modules in Examples 250 to 270 were prepared under the same conditions of the method for forming a bond and the same conditions for manufacture as in Example 249 although, as shown in Tables 3-1 and 3-2, the compositions, the firing conditions, and the shapes of the thermoelectric conversion materials, the composition and the shape of the conductive member, and the composition and the addition amount of the additive added to the silver paste were different from those in Example 249.

Comparative Example 10

A thermoelectric conversion module in Comparative Example 10 was prepared in the same manner as in Example 248 except for using $CaMn_{0.98}Mo_{0.02}O_3$ in Comparative Example 1 as an n-type thermoelectric conversion element.

Comparative Examples 11 to 17

As shown in Table 3-3, thermoelectric conversion modules in Comparative Examples 11 to 17 were prepared in the same manner as in Example 249 except for using an n-type thermoelectric conversion element including $CaMn_{0.98}Mo_{0.02}O_3$.

For the thermoelectric conversion modules in Examples 248 to 270 and Comparative Examples 10 to 17, the open circuit voltage, the internal resistance, and the maximum output were measured in accordance with Test Example 2 described above.

Tables 3-1 to 3-3 show the open circuit voltage, the internal resistance, and the maximum output when the heating temperature of the thermoelectric conversion modules in Examples 248 to 270 and Comparative Examples 10 to 17 is 500° C.

TABLE 3-1

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | $Ag_2O$ | $TiO_2$ | $Bi_2Sr_2Co_2O_9$ | | | | |
| 248 | $Ti_{0.75}Hf_{0.25}NiSn$ 3.5 × 3.5 × 5.0 | $Bi_2Sr_2Co_2O_9$ 3.5 × 3.5 × 5.0 | 0.0 | 0.0 | 0.0 | Silver 7.5 × 3.5 × 0.1 | 126 | 45.0 | 88.0 |
| 249 | $Ti_{0.75}Hf_{0.25}NiSn$ 3.5 × 3.5 × 5.0 | $Bi_2Sr_2Co_2O_9$ 3.5 × 3.5 × 5.0 | n-type 0.5 p-type 0.5 | n-type 0.0 p-type 0.0 | n-type 0.0 p-type 0.0 | Silver 7.5 × 3.5 × 0.1 | 124 | 37.4 | 103 |
| 250 | $Ti_{0.75}Hf_{0.25}NiSn$ 3.5 × 3.5 × 5.0 | $Bi_2Sr_2Co_2O_9$ 3.5 × 3.5 × 5.0 | n-type 1.0 p-type 1.0 | n-type 0.0 p-type 0.0 | n-type 0.0 p-type 0.0 | Silver 7.5 × 3.5 × 0.1 | 135 | 37.9 | 120 |

TABLE 3-1-continued

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | $Ag_2O$ | $TiO_2$ | $Bi_2Sr_2Co_2O_9$ | | | | |
| 251 | $Ti_{0.75}Hf_{0.25}NiSn$ 3.5 × 3.5 × 5.0 | $Bi_2Sr_2Co_2O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 123 | 39.4 | 96.8 |
| 252 | $Ti_{0.75}Hf_{0.25}NiSn$ 3.5 × 3.5 × 5.0 | $Bi_2Sr_2Co_2O_9$ 3.5 × 3.5 × 5.0 | n-type 0.0 p-type 0.0 | n-type 0.5 p-type 0.5 | n-type 0.0 p-type 0.0 | Silver 7.5 × 3.5 × 0.1 | 132 | 40.4 | 109 |
| 253 | $Ti_{0.75}Hf_{0.25}NiSn$ 3.5 × 3.5 × 5.0 | $Bi_2Sr_2Co_2O_9$ 3.5 × 3.5 × 5.0 | n-type 0.0 p-type 0.0 | n-type 1.0 p-type 1.0 | n-type 0.0 p-type 0.0 | Silver 7.5 × 3.5 × 0.1 | 128 | 41.8 | 98.4 |
| 254 | $Ti_{0.75}Hf_{0.25}NiSn$ 3.5 × 3.5 × 5.0 | $Bi_2Sr_2Co_2O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 127 | 39.5 | 102 |
| 255 | $Ti_{0.75}Hf_{0.25}NiSn$ 3.5 × 3.5 × 5.0 | $Bi_2Sr_2Co_2O_9$ 3.5 × 3.5 × 5.0 | n-type 0.5 p-type 0.5 | n-type 0.5 p-type 0.5 | n-type 0.0 p-type 0.0 | Silver 7.5 × 3.5 × 0.1 | 134 | 37.4 | 120 |
| 256 | $Ti_{0.75}Hf_{0.25}NiSn$ 3.5 × 3.5 × 5.0 | $Bi_2Sr_2Co_2O_9$ 3.5 × 3.5 × 5.0 | n-type 2.0 p-type 2.0 | n-type 1.0 p-type 1.0 | n-type 0.0 p-type 0.0 | Silver 7.5 × 3.5 × 0.1 | 130 | 37.8 | 111 |
| 257 | $Ti_{0.75}Hf_{0.25}NiSn$ 3.5 × 3.5 × 5.0 | $Bi_2Sr_2Co_2O_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 122 | 40.9 | 91.5 |
| 258 | $Ti_{0.75}Hf_{0.25}NiSn$ 3.5 × 3.5 × 5.0 | $Bi_2Sr_2Co_2O_9$ 3.5 × 3.5 × 5.0 | n-type 0.0 p-type 3.0 | n-type 3.0 p-type 0.0 | n-type 0.0 p-type 0.0 | Silver 7.5 × 3.5 × 0.1 | 125 | 42.6 | 91.4 |
| 259 | $Ti_{0.75}Hf_{0.25}NiSn$ 3.5 × 3.5 × 5.0 | $Bi_2Sr_2Co_2O_9$ 3.5 × 3.5 × 5.0 | n-type 3.0 p-type 0.0 | n-type 0.0 p-type 0.0 | n-type 0.0 p-type 3.0 | Silver 7.5 × 3.5 × 0.1 | 138 | 38.2 | 124 |
| 260 | $Ti_{0.75}Hf_{0.25}NiSn$ 3.5 × 3.5 × 5.0 | $Bi_2Sr_2Co_2O_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 129 | 39.5 | 106 |
| 261 | $Ti_{0.75}Hf_{0.25}NiSn$ 3.5 × 3.5 × 5.0 | $Bi_2Sr_2Co_2O_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 127 | 38.9 | 103 |
| 262 | $Ti_{0.75}Hf_{0.25}NiSn$ 3.5 × 3.5 × 5.0 | $Bi_2Sr_2Co_2O_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 125 | 39.5 | 99.1 |

TABLE 3-2

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | $Ag_2O$ | $TiO_2$ | $Bi_2Sr_2Co_2O_9$ | | | | |
| 263 | $Ti_{0.75}Hf_{0.25}NiSn$ 3.5 × 3.5 × 5.0 | $Bi_2Sr_2Co_2O_9$ 3.5 × 3.5 × 5.0 | n-type 0.0 p-type 0.0 | n-type 3.0 p-type 0.0 | n-type 0.0 p-type 1.0 | Silver 7.5 × 3.5 × 0.1 | 120 | 37.4 | 96.3 |
| 264 | $Ti_{0.75}Hf_{0.25}NiSn$ 3.5 × 3.5 × 5.0 | $Bi_2Sr_2Co_2O_9$ 3.5 × 3.5 × 5.0 | n-type 0.0 p-type 0.0 | n-type 3.0 p-type 0.0 | n-type 0.0 p-type 3.0 | Silver 7.5 × 3.5 × 0.1 | 122 | 37.8 | 99.0 |
| 265 | $Ti_{0.75}Hf_{0.25}NiSn$ 3.5 × 3.5 × 5.0 | $Bi_2Sr_2Co_2O_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 131 | 39.8 | 108 |
| 266 | $Ti_{0.75}Hf_{0.25}NiSn$ 3.5 × 3.5 × 5.0 | $Bi_2Sr_2Co_2O_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 128 | 41.2 | 100 |
| 267 | $Ti_{0.75}Hf_{0.25}NiSn$ 3.5 × 3.5 × 5.0 | $Bi_2Sr_2Co_2O_9$ 3.5 × 3.5 × 5.0 | n-type 0.0 p-type 0.0 | n-type 1.0 p-type 0.0 | n-type 0.0 p-type 6.0 | Silver 7.5 × 3.5 × 0.1 | 127 | 38.2 | 105 |
| 268 | $Ti_{0.75}Hf_{0.25}NiSn$ 3.5 × 3.5 × 5.0 | $Bi_2Sr_2Co_2O_9$ 3.5 × 3.5 × 5.0 | n-type 0.0 p-type 0.0 | n-type 5.0 p-type 0.0 | n-type 0.0 p-type 6.0 | Silver 7.5 × 3.5 × 0.1 | 132 | 39.8 | 110 |
| 269 | $Ti_{0.75}Hf_{0.25}NiSn$ 3.5 × 3.5 × 5.0 | $Bi_{1.8}Sr_{1.8}Co_2O_9$ 3.5 × 3.5 × 5.0 | n-type 3.0 p-type 0.0 | n-type 0.0 p-type 0.0 | n-type 0.0 p-type 0.0 | Silver 7.5 × 3.5 × 0.1 | 124 | 33.8 | 115 |
| 270 | $Ti_{0.75}Hf_{0.25}NiSn$ 3.5 × 3.5 × 5.0 | $Bi_{2.2}Sr_{2.2}Co_2O_9$ 3.5 × 3.5 × 5.0 | n-type 3.0 p-type 0.0 | n-type 0.0 p-type 0.0 | n-type 0.0 p-type 0.0 | Silver 7.5 × 3.5 × 0.1 | 128 | 37.8 | 108 |

TABLE 3-3

| Comparative Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | $Ag_2O$ | $TiO_2$ | $Bi_2Sr_2Co_2O_9$ | | | | |
| 10 | $CaMn_{0.98}Mo_{0.02}O_3$ 3.5 × 3.5 × 5.0 | $Bi_2Sr_2Co_2O_9$ 3.5 × 3.5 × 5.0 | n-type 0.0 p-type 0.0 | n-type 0.0 p-type 0.0 | n-type 0.0 p-type 0.0 | Silver 7.5 × 3.5 × 0.1 | 151 | 143 | 39.9 |
| 11 | $CaMn_{0.98}Mo_{0.02}O_3$ 3.5 × 3.5 × 5.0 | $Bi_2Sr_2Co_2O_9$ 3.5 × 3.5 × 5.0 | n-type 0.5 p-type 0.5 | n-type 0.0 p-type 0.0 | n-type 0.0 p-type 0.0 | Silver 7.5 × 3.5 × 0.1 | 146 | 147 | 36.1 |

TABLE 3-3-continued

| Comparative Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | $Ag_2O$ | $TiO_2$ | $Bi_2Sr_2Co_2O_9$ | | | | |
| 12 | $CaMn_{0.98}Mo_{0.02}O_3$ 3.5 × 3.5 × 5.0 | $Bi_2Sr_2Co_2O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 145 | 169 | 31.0 |
| 13 | $CaMn_{0.98}Mo_{0.02}O_3$ 3.5 × 3.5 × 5.0 | $Bi_2Sr_2Co_2O_9$ 3.5 × 3.5 × 5.0 | n-type 0.0 p-type 0.0 | n-type 0.5 p-type 0.5 | n-type 0.0 p-type 0.0 | Silver 7.5 × 3.5 × 0.1 | 153 | 149 | 38.9 |
| 14 | $CaMn_{0.98}Mo_{0.02}O_3$ 3.5 × 3.5 × 5.0 | $Bi_2Sr_2Co_2O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 150 | 179 | 31.3 |
| 15 | $CaMn_{0.98}Mo_{0.02}O_3$ 3.5 × 3.5 × 5.0 | $Bi_2Sr_2Co_2O_9$ 3.5 × 3.5 × 5.0 | n-type 0.0 p-type 0.0 | n-type 0.0 p-type 0.0 | n-type 6.0 p-type 6.0 | Silver 7.5 × 3.5 × 0.1 | 151 | 114 | 49.9 |
| 16 | $CaMn_{0.98}Mo_{0.02}O_3$ 3.5 × 3.5 × 5.0 | $Bi_2Sr_2Co_2O_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 149 | 137 | 40.3 |
| 17 | $CaMn_{0.98}Mo_{0.02}O_3$ 3.5 × 3.5 × 5.0 | $Bi_2Sr_2Co_2O_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 152 | 175 | 33.2 |

The thermoelectric conversion modules in Examples 248 to 270 are a thermoelectric conversion module including an n-type thermoelectric conversion element having a half-Heusler structure represented by the composition formula of the formula (2).

In the thermoelectric conversion modules in Example 248 and Comparative Example 10, the silver paste for connection between the n-type thermoelectric conversion element and the conductive member contains none of titanium oxide, silver oxide, and the oxide used in the p-type thermoelectric conversion element.

The thermoelectric conversion module in Example 248 has a larger maximum output than the thermoelectric conversion module in Comparative Example 10.

Therefore, it has been found that even in a case where $Bi_{2.2}Sr_{2.2}Co_2O_9$ is used as a material of the p-type thermoelectric conversion element, the maximum output of the thermoelectric conversion module can be improved by using $Ti_{0.75}Hf_{0.25}NiSn$ having a half-Heusler structure as a material of the n-type thermoelectric conversion element.

The thermoelectric conversion modules in Examples 249 to 270 are characterized in that the silver paste for connection between the n-type thermoelectric conversion element and the conductive member contains a component (additive) including at least one of titanium oxide or silver oxide, and that the silver paste for connection between the p-type thermoelectric conversion element and the conductive member contains a component (additive) including at least one of titanium oxide or silver oxide or including an oxide used in the p-type thermoelectric conversion element.

The thermoelectric conversion modules in Examples 257 to 268 are characterized in that the silver paste for connection between the n-type thermoelectric conversion element and the conductive member contains a component (additive) different from that in the silver paste for connection between the p-type thermoelectric conversion element and the conductive member.

The thermoelectric conversion modules in Examples 248 to 256, 269, and 270 are characterized in that the silver paste for connection between the n-type thermoelectric conversion element and the conductive member contains the same component (additive) as the silver paste for connection between the p-type thermoelectric conversion element and the conductive member.

The thermoelectric conversion module in Example 248 has a maximum output of 88.0 mW, which is larger than those of the thermoelectric conversion modules in Comparative Examples 2 to 9 shown in Table 2-15, 50.0 to 74.6 mW. Therefore, it has been found that even in a case where a thermoelectric oxide material having a composition of $Bi_2Sr_2Co_2O_9$ is applied to the p-type thermoelectric conversion element, the maximum output of the thermoelectric conversion module can be improved by using an n-type thermoelectric conversion element ($Ti_{0.75}Hf_{0.25}NiSn$) having a half-Heusler structure.

As shown in Tables 3-1 and 3-2, the thermoelectric conversion modules in Examples 249 to 270 have a maximum output of 91.4 to 124 mW, which is larger than that of the thermoelectric conversion module in Example 248, 88.0 mW. This is because the use of the silver paste to which an additive (single body of $Ag_2O$, $TiO_2$, or $Bi_2Sr_2Co_2O_9$, or combination thereof) is added reduces the electric resistance in bond between the n-type thermoelectric conversion element and the conductive member (silver sheet) and between the p-type thermoelectric conversion element and the conductive member (silver sheet). Therefore, it has been found that the maximum output of the thermoelectric conversion module can be improved by changing the silver paste in the thermoelectric conversion module in Example 248 to a silver paste to which an additive (single body of $Ag_2O$, $TiO_2$, or $Bi_2Sr_2Co_2O_9$, or combination thereof) is added.

The thermoelectric conversion modules in Examples 249 to 270 have a maximum output of 91.4 to 124 mW, which is larger than those of the thermoelectric conversion modules in Comparative Examples 10 to 17, 31.0 to 49.9 mW. This is because the thermoelectric conversion modules in Examples 249 to 270 are different from the thermoelectric conversion modules in Comparative Examples 10 to 17 in that an n-type thermoelectric conversion element ($Ti_{0.75}Hf_{0.25}NiSn$) having a half-Heusler structure is used. Therefore, it has been found that even if the same p-type thermoelectric conversion element and the same silver paste are used, the maximum output of the thermoelectric conversion module can be improved by using $Ti_{0.75}Hf_{0.25}NiSn$ having a half-Heusler structure to constitute the n-type thermoelectric conversion element. This is because the n-type thermoelectric generation element having a half-Heusler structure has a higher ZT than $CaMn_{0.98}Mo_{0.02}O_3$.

Examples 248 to 270 described above show improvement in the maximum output of the thermoelectric conversion module using an n-type thermoelectric conversion element having a half-Heusler structure represented by the composition formula shown in the formula (2) described above. Meanwhile, similarly to the above improvement, improvement in the maximum output is possible also in the thermoelectric conversion module using an n-type thermoelectric conversion element having a half-Heusler structure represented by the composition formula shown in any one of the formulae (3) to (7) described above. This is because, as shown in Tables 1-1 to 1-3, the n-type thermoelectric conversion elements having a half-Heusler structure in Examples 1 to 37 have a larger ZT than the n-type thermoelectric conversion element in Comparative Example 1. Therefore, if there is experimental data showing improvement in the maximum output of the thermoelectric conversion module using an n-type thermoelectric conversion element having a half-Heusler structure represented by the composition formula of the formula (2), those skilled in the art can understand, without experimental data, that improvement in the maximum output is possible also in the thermoelectric conversion module using an n-type thermoelectric conversion element having a half-Heusler structure represented by the composition formula shown in any one of the formulae (3) to (7) described above.

Example 271

A thermoelectric conversion module in Example 271 was prepared with the following method in the same manner as the thermoelectric conversion module in Example 38 except that the p-type thermoelectric conversion element was prepared as follows.
[Preparation of p-Type Thermoelectric Conversion Element]
The following method was used to prepare a p-type thermoelectric conversion element having the composition formula represented by $Bi_2Ca_2Co_2O_9$. First, bismuth oxide ($Bi_2O_3$), calcium carbonate ($CaCO_3$), and cobalt oxide ($Co_3O_4$) were weighed so that the ratio of the number of moles is Bi:Ca:Co=2:2:2, and sufficiently mixed. The obtained mixture was put into an alumina crucible and fired in the air at 800° C. for 10 hours, and the obtained fired product was sufficiently mixed using an agate mortar and pestle. The resulting powder was press-molded into a disk shape having a diameter of 20 mm and a thickness of about 2 to 10 mm, a gold sheet was spread on an alumina boat, and the molded body was placed on the gold sheet and fired in the air at 840° C. for 20 hours. Next, the obtained sintered body was ground using an agate mortar and pestle.
The obtained powder was press-molded into a disk shape having a diameter of 40 mm and a thickness of 5 mm, and hot-pressed and sintered in the air under a uniaxial pressure of 10 MPa at 860° C. for 20 hours. The obtained hot-pressed and sintered body was ground and cut to form a rectangular parallelepiped such that the size of the surface perpendicular to the pressed surface was 3.5 mm×3.5 mm and the length was 5 mm, and thus a p-type thermoelectric conversion material was obtained. The bonding surface was the surface having a size of 3.5 mm×3.5 mm, which was cut out from the surface perpendicular to the pressed surface.
[Preparation of Thermoelectric Conversion Module]
A thermoelectric conversion module in Example 271 was prepared using the same conditions and the same method as in Example 38 except that a different material of the p-type thermoelectric conversion element was used as shown in Table 4-1.

Example 272

As shown in Table 4-1, a thermoelectric conversion module in Example 272 was prepared in the same manner as in Example 271 except for using a silver paste to which an additive was added.

Examples 273 to 293

Thermoelectric conversion modules in Examples 273 to 293 were prepared under the same conditions of the method for forming a bond and the same conditions for manufacture as in Example 272 although, as shown in Tables 4-1 and 4-2, the compositions, the firing conditions, and the shapes of the thermoelectric conversion materials, the composition and the shape of the conductive member, and the composition and the addition amount of the additive added to the silver paste were different from those in Example 272.

For the thermoelectric conversion modules in Examples 271 to 293, the open circuit voltage, the internal resistance, and the maximum output were measured in accordance with Test Example 2 described above.

Tables 4-1 and 4-2 show the open circuit voltage, the internal resistance, and the maximum output when the heating temperature of the thermoelectric conversion modules in Examples 271 to 293 is 500° C.

TABLE 4-1

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | $Ag_2O$ | $TiO_2$ | $Bi_2Ca_2Co_4O_9$ | | | | |
| 271 | $Ti_{0.75}Hf_{0.25}NiSn$ 3.5 × 3.5 × 5.0 | $Bi_2Ca_2Co_2O_9$ 3.5 × 3.5 × 5.0 | 0.0 | 0.0 | 0.0 | Silver 7.5 × 3.5 × 0.1 | 128 | 48.2 | 84.9 |
| 272 | $Ti_{0.75}Hf_{0.25}NiSn$ 3.5 × 3.5 × 5.0 | $Bi_2Ca_2Co_2O_9$ 3.5 × 3.5 × 5.0 | n-type 0.5 p-type 0.5 | n-type 0.0 p-type 0.0 | n-type 0.0 p-type 0.0 | Silver 7.5 × 3.5 × 0.1 | 126 | 35.8 | 112 |
| 273 | $Ti_{0.75}Hf_{0.25}NiSn$ 3.5 × 3.5 × 5.0 | $Bi_2Ca_2Co_2O_9$ 3.5 × 3.5 × 5.0 | n-type 1.0 p-type 1.0 | n-type 0.0 p-type 0.0 | n-type 0.0 p-type 0.0 | Silver 7.5 × 3.5 × 0.1 | 130 | 34.8 | 121 |
| 274 | $Ti_{0.75}Hf_{0.25}NiSn$ 3.5 × 3.5 × 5.0 | $Bi_2Ca_2Co_2O_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 135 | 37.9 | 120 |
| 275 | $Ti_{0.75}Hf_{0.25}NiSn$ 3.5 × 3.5 × 5.0 | $Bi_2Ca_2Co_2O_9$ 3.5 × 3.5 × 5.0 | n-type 0.0 p-type 0.0 | n-type 0.5 p-type 0.5 | n-type 0.0 p-type 0.0 | Silver 7.5 × 3.5 × 0.1 | 127 | 35.8 | 112 |
| 276 | $Ti_{0.75}Hf_{0.25}NiSn$ 3.5 × 3.5 × 5.0 | $Bi_2Ca_2Co_2O_9$ 3.5 × 3.5 × 5.0 | n-type 0.0 p-type 0.0 | n-type 1.0 p-type 1.0 | n-type 0.0 p-type 0.0 | Silver 7.5 × 3.5 × 0.1 | 126 | 34.8 | 115 |
| 277 | $Ti_{0.75}Hf_{0.25}NiSn$ 3.5 × 3.5 × 5.0 | $Bi_2Ca_2Co_2O_9$ 3.5 × 3.5 × 5.0 | n-type 0.0 p-type 0.0 | n-type 3.0 p-type 3.0 | n-type 0.0 p-type 0.0 | Silver 7.5 × 3.5 × 0.1 | 136 | 33.8 | 136 |
| 278 | $Ti_{0.75}Hf_{0.25}NiSn$ 3.5 × 3.5 × 5.0 | $Bi_2Ca_2Co_2O_9$ 3.5 × 3.5 × 5.0 | n-type 0.5 p-type 0.5 | n-type 0.5 p-type 0.5 | n-type 0.0 p-type 0.0 | Silver 7.5 × 3.5 × 0.1 | 134 | 34.0 | 133 |

TABLE 4-1-continued

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | Ag$_2$O | TiO$_2$ | Bi$_2$Ca$_2$Co$_4$O$_9$ | | | | |
| 279 | Ti$_{0.75}$Hf$_{0.25}$NiSn 3.5 × 3.5 × 5.0 | Bi$_2$Ca$_2$Co$_2$O$_9$ 3.5 × 3.5 × 5.0 | n-type 2.0 p-type 2.0 | n-type 1.0 p-type 1.0 | n-type 0.0 p-type 0.0 | Silver 7.5 × 3.5 × 0.1 | 126 | 35.6 | 112 |
| 280 | Ti$_{0.75}$Hf$_{0.25}$NiSn 3.5 × 3.5 × 5.0 | Bi$_2$Ca$_2$Co$_2$O$_9$ 3.5 × 3.5 × 5.0 | n-type 3.0 p-type 0.0 | n-type 0.0 p-type 3.0 | n-type 0.0 p-type 0.0 | Silver 7.5 × 3.5 × 0.1 | 135 | 34.9 | 131 |
| 281 | Ti$_{0.75}$Hf$_{0.25}$NiSn 3.5 × 3.5 × 5.0 | Bi$_2$Ca$_2$Co$_2$O$_9$ 3.5 × 3.5 × 5.0 | n-type 0.0 p-type 3.0 | n-type 3.0 p-type 0.0 | n-type 0.0 p-type 0.0 | Silver 7.5 × 3.5 × 0.1 | 137 | 35.7 | 131 |
| 282 | Ti$_{0.75}$Hf$_{0.25}$NiSn 3.5 × 3.5 × 5.0 | Bi$_2$Ca$_2$Co$_2$O$_9$ 3.5 × 3.5 × 5.0 | n-type 3.0 p-type 0.0 | n-type 0.0 p-type 0.0 | n-type 0.0 p-type 3.0 | Silver 7.5 × 3.5 × 0.1 | 128 | 37.9 | 109 |
| 283 | Ti$_{0.75}$Hf$_{0.25}$NiSn 3.5 × 3.5 × 5.0 | Bi$_2$Ca$_2$Co$_2$O$_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 126 | 36.4 | 110 |
| 284 | Ti$_{0.75}$Hf$_{0.25}$NiSn 3.5 × 3.5 × 5.0 | Bi$_2$Ca$_2$Co$_2$O$_9$ 3.5 × 3.5 × 5.0 | n-type 0.5 p-type 0.0 | n-type 0.0 p-type 0.0 | n-type 0.0 p-type 6.0 | Silver 7.5 × 3.5 × 0.1 | 139 | 34.2 | 141 |
| 285 | Ti$_{0.75}$Hf$_{0.25}$NiSn 3.5 × 3.5 × 5.0 | Bi$_2$Ca$_2$Co$_2$O$_9$ 3.5 × 3.5 × 5.0 | n-type 3.0 p-type 0.0 | n-type 0.0 p-type 0.0 | n-type 0.0 p-type 6.0 | Silver 7.5 × 3.5 × 0.1 | 125 | 33.8 | 116 |

TABLE 4-2

| Example | n-type element composition length × width × height (mm) | p-type element composition width × length × height (mm) | Addition amount to silver paste (wt %) | | | Conductive member length × width × thickness (mm) | Open circuit voltage (mV) | Internal resistance (mΩ) | Maximum output (mW) |
|---|---|---|---|---|---|---|---|---|---|
| | | | Ag$_2$O | TiO$_2$ | Bi$_2$Ca$_2$Co$_4$O$_9$ | | | | |
| 286 | Ti$_{0.75}$Hf$_{0.25}$NiSn 3.5 × 3.5 × 5.0 | Bi$_2$Ca$_2$Co$_2$O$_9$ 3.5 × 3.5 × 5.0 | n-type 0.0 p-type 0.0 | n-type 3.0 p-type 0.0 | n-type 0.0 p-type 1.0 | Silver 7.5 × 3.5 × 0.1 | 128 | 38.4 | 108 |
| 287 | Ti$_{0.75}$Hf$_{0.25}$NiSn 3.5 × 3.5 × 5.0 | Bi$_2$Ca$_2$Co$_2$O$_9$ 3.5 × 3.5 × 5.0 | n-type 0.0 p-type 0.0 | n-type 3.0 p-type 0.0 | n-type 0.0 p-type 3.0 | Silver 7.5 × 3.5 × 0.1 | 130 | 35.2 | 119 |
| 288 | Ti$_{0.75}$Hf$_{0.25}$NiSn 3.5 × 3.5 × 5.0 | Bi$_2$Ca$_2$Co$_2$O$_9$ 3.5 × 3.5 × 5.0 | n-type 0.0 p-type 0.0 | n-type 3.0 p-type 0.0 | n-type 0.0 p-type 6.0 | Silver 7.5 × 3.5 × 0.1 | 134 | 37.4 | 121 |
| 289 | Ti$_{0.75}$Hf$_{0.25}$NiSn 3.5 × 3.5 × 5.0 | Bi$_2$Ca$_2$Co$_2$O$_9$ 3.5 × 3.5 × 5.0 | n-type 0.0 p-type 0.0 | n-type 0.5 p-type 0.0 | n-type 0.0 p-type 6.0 | Silver 7.5 × 3.5 × 0.1 | 135 | 33.8 | 135 |
| 290 | Ti$_{0.75}$Hf$_{0.25}$NiSn 3.5 × 3.5 × 5.0 | Bi$_2$Ca$_2$Co$_2$O$_9$ 3.5 × 3.5 × 5.0 | n-type 0.0 p-type 0.0 | n-type 1.0 p-type 0.0 | n-type 0.0 p-type 6.0 | Silver 7.5 × 3.5 × 0.1 | 125 | 34.3 | 114 |
| 291 | Ti$_{0.75}$Hf$_{0.25}$NiSn 3.5 × 3.5 × 5.0 | Bi$_2$Ca$_2$Co$_2$O$_9$ 3.5 × 3.5 × 5.0 | n-type 0.0 p-type 0.0 | n-type 5.0 p-type 0.0 | n-type 0.0 p-type 6.0 | Silver 7.5 × 3.5 × 0.1 | 131 | 35.5 | 122 |
| 292 | Ti$_{0.75}$Hf$_{0.25}$NiSn 3.5 × 3.5 × 5.0 | Bi$_{1.8}$Ca$_{1.8}$Co$_2$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 122 | 36.1 | 102 |
| 293 | Ti$_{0.75}$Hf$_{0.25}$NiSn 3.5 × 3.5 × 5.0 | Bi$_{2.2}$Ca$_{2.2}$Co$_2$O$_9$ 3.5 × 3.5 × 5.0 | n-type 3.0 p-type 3.0 | n-type 0.0 p-type 0.0 | n-type 0.0 p-type 0.0 | Silver 7.5 × 3.5 × 0.1 | 133 | 41.5 | 107 |

The thermoelectric conversion modules in Examples 271 to 293 are a thermoelectric conversion module including an n-type thermoelectric conversion element having a half-Heusler structure represented by the composition formula of the formula (2).

The thermoelectric conversion modules in Examples 272 to 293 are characterized in that the silver paste for connection between the n-type thermoelectric conversion element and the conductive member contains a component (additive) including at least one of titanium oxide or silver oxide, and that the silver paste for connection between the p-type thermoelectric conversion element and the conductive member contains a component (additive) including at least one of titanium oxide or silver oxide or including an oxide used in the p-type thermoelectric conversion element.

The thermoelectric conversion modules in Examples 280 to 291 are characterized in that the silver paste for connection between the n-type thermoelectric conversion element and the conductive member contains a component (additive) different from that in the silver paste for connection between the p-type thermoelectric conversion element and the conductive member.

The thermoelectric conversion modules in Examples 271 to 279, 292, and 293 are characterized in that the silver paste for connection between the n-type thermoelectric conversion element and the conductive member contains the same component (additive) as the silver paste for connection between the p-type thermoelectric conversion element and the conductive member.

The thermoelectric conversion module in Example 271 has a maximum output of 84.9 mW, which is larger than those of the thermoelectric conversion modules in Comparative Examples 2 to 9 shown in Table 2-15, 50.0 to 74.6 mW. Therefore, it has been found that even in a case where a thermoelectric oxide material having a composition of Bi$_2$Ca$_2$Co$_2$O$_9$ is applied to the p-type thermoelectric conversion element, the maximum output of the thermoelectric conversion module can be improved by using an n-type thermoelectric conversion element (Ti$_{0.75}$Hf$_{0.25}$NiSn) having a half-Heusler structure.

As shown in Tables 4-1 and 4-2, the thermoelectric conversion modules in Examples 272 to 293 have a maximum output of 102 to 141 mW, which is larger than that of the thermoelectric conversion module in Example 271, 84.9 mW. This is because the use of the silver paste to which an additive (single body of $Ag_2O$, $TiO_2$, or $Bi_2Sr_2Co_2O_9$, or combination thereof) is added reduces the electric resistance in bond between the n-type thermoelectric conversion element and the conductive member (silver sheet) and between the p-type thermoelectric conversion element and the conductive member (silver sheet). Therefore, it has been found that the maximum output of the thermoelectric conversion module can be improved by changing the silver paste in the thermoelectric conversion module in Example 271 to a silver paste to which an additive (single body of $Ag_2O$, $TiO_2$, or $Bi_2Sr_2Co_2O_9$, or combination thereof) is added.

Tables 4-1 and 4-2 does not show the maximum output of the thermoelectric conversion module in which both the n-type thermoelectric conversion element and the p-type thermoelectric conversion element include an oxide and in which the silver paste to which an additive (single body of $Ag_2O$, $TiO_2$, or $Bi_2Sr_2Co_2O_9$, or combination thereof) is not added is used. However, $Bi_2Ca_2Co_2O_9$ (the p-type thermoelectric conversion element) in Examples 271 to 293 has almost the same characteristics as $Bi_2Sr_2Co_2O_9$ (the p-type thermoelectric conversion element) in Examples 248 to 270. Therefore, if comparison between the maximum output of the thermoelectric conversion module in Example 248 and the maximum output of the thermoelectric conversion module in Comparative Example 10 show that the use of the n-type thermoelectric conversion element having a half-Heusler structure ($Ti_{0.75}Hf_{0.25}NiSn$) can improve the maximum output of the thermoelectric conversion module, those skilled in the art can appreciate that the maximum output of the thermoelectric conversion module in Example 271 (84.9 mW) is larger than the maximum output of the thermoelectric conversion module using the n-type thermoelectric conversion element including $CaMn_{0.98}Mo_{0.02}NiSn$, the p-type thermoelectric conversion element including $Bi_2Ca_2Co_2O_9$, and the silver paste to which an additive (single body of $Ag_2O$, $TiO_2$, or $Bi_2Sr_2Co_2O_9$, or combination thereof) is not added.

Example 294

A thermoelectric conversion module in Example 294 was prepared with the following method.
[Preparation of n-Type Thermoelectric Conversion Element]
An n-type thermoelectric conversion element was prepared with the same method as the n-type thermoelectric conversion element in Example 38.
[Preparation of p-Type Thermoelectric Conversion Element]
The following method was used to prepare a p-type thermoelectric conversion element having the composition formula represented by $Ca_{2.7}Bi_{0.3}Co_4O_9$. First, calcium carbonate ($CaCO_3$), bismuth oxide ($Bi_2O_3$), and cobalt oxide ($Co_3O_4$) were weighed so that the ratio of the number of moles is Ca:Bi:Co=2.7:0.3:4, and sufficiently mixed. The obtained mixture was put into an alumina crucible and fired in the air at 800° C. for 10 hours, and the obtained fired product was sufficiently mixed using an agate mortar and pestle. The resulting powder was press-molded into a disk shape having a diameter of 20 mm and a thickness of about 2 to 10 mm, a gold sheet was spread on an alumina boat, and the molded body was placed on the gold sheet and fired in the air at 860° C. for 20 hours. Next, the obtained sintered body was ground using an agate mortar and pestle.

The obtained powder was press-molded into a disk shape having a diameter of 40 mm and a thickness of 5 mm, and hot-pressed and sintered in the air under a uniaxial pressure of 10 MPa at 880° C. for 20 hours. The obtained hot-pressed and sintered body was ground and cut to form a rectangular parallelepiped such that the size of the surface perpendicular to the pressed surface was 3.5 mm×3.5 mm and the length was 5 mm, and thus a p-type thermoelectric conversion material was obtained. As the bonding surface, the surface perpendicular to the pressed surface was formed into a surface having a size of 3.5 mm×3.5 mm.
[Preparation of Silver Paste]
A silver paste having the same composition was prepared with the same method as the silver paste in Example 39.
[Preparation of Thermoelectric Conversion Module]
As a conductive member, a silver sheet having a size of 3.2 mm×7.5 mm and a thickness of 0.1 mm was used. Both bonding surfaces of one p-type thermoelectric conversion element and both bonding surfaces of one n-type thermoelectric conversion element were irradiated with ultraviolet rays using a mercury lamp for 30 minutes.

The silver paste prepared with the above-described method was applied to the bonding surface of the silver sheet. Here, screen printing was used to adjust the thickness of the silver paste before solidification so that the thickness after solidification was 10 μm.

The bonding surface of the silver sheet to which the silver paste was applied was placed on one bonding surface of the p-type thermoelectric conversion element and one bonding surface of the n-type thermoelectric conversion element, and the silver sheet was pressed and attached to the one bonding surface of the p-type thermoelectric conversion element and the one bonding surface of the n-type thermoelectric conversion element to connect the one bonding surface of the p-type thermoelectric conversion element and the one bonding surface of the n-type thermoelectric conversion element. In this case, the interval between the p-type thermoelectric conversion element and the n-type thermoelectric conversion element was set to 0.5 mm.

The above-described alumina insulating substrate was further placed on the silver sheet. Fifteen module precursors each including a pair of thermoelectric conversion elements were prepared, placed in a dryer, and heated at 100° C. for about 30 minutes. The module precursors were inverted and arranged at the positions of elements of the thermoelectric conversion module, respectively. A silver sheet having a bonding surface to which a silver paste was applied in the same manner as described above and having a size of 3.2 mm×7 mm and a thickness of 0.1 mm was placed on the bonding surfaces of the n-type thermoelectric conversion element and the p-type thermoelectric conversion element adjacent to each other so as to connect the thermoelectric conversion elements. As a result, 15 pairs of n-type thermoelectric conversion elements and p-type thermoelectric conversion elements were alternately connected in series. On each of the bonding surfaces of the n-type thermoelectric conversion element and the p-type thermoelectric conversion element disposed, respectively, at both ends of the 15 pairs of n-type thermoelectric conversion elements and p-type thermoelectric conversion elements, a silver sheet having a size of 3.2 mm×30 mm and a thickness of 0.1 mm to which a silver paste was applied as described above was placed so that the silver sheet served as a power extraction member (extraction electrode).

An aluminum oxide (alumina: $Al_2O_3$) plate having a size of 35 mm×35 mm and a thickness of 0.8 mm as an insulating substrate was further placed on the silver sheet. The resulting product was placed in a dryer again, heated at 100° C. for about 30 minutes, then placed in a hot press furnace for heating in the air under uniaxial pressure, heated from room temperature to 200° C. in 1 hour while a uniaxial pressure of 2.4 MPa was applied to the bonding surface, and maintained at 200° C. for 1 hour.

Thereafter, the pressure was increased to 4.8 MPa, and the temperature was raised to 450° C. in 1 hour. The temperature was maintained at 450° C. for 1 hour and 30 minutes, and then raised to 800° C. in 2 hours. The pressure was increased to 9.6 MPa when the temperature reached 625° C. 1 hour after the start of the temperature rise. After firing at 800° C. for 30 minutes while the pressure was maintained, the pressing was terminated, the inside of the furnace was naturally cooled, and thus a thermoelectric conversion module having 15 pairs of n-type thermoelectric conversion elements and p-type thermoelectric conversion elements was manufactured. By this heat treatment, the silver sheet was also attached to the alumina substrate.

The thermoelectric conversion module in Example 294 has the same structure as the thermoelectric conversion module 300 shown in FIG. 7.

Example 295

A thermoelectric conversion module in Example 295 was prepared with the following method under the same conditions, such as the dimensions and the number of pairs of the n-type thermoelectric conversion elements and the p-type thermoelectric conversion elements, the electrode member, the dimension of the electrode member, application of the silver paste, and the heat treatment conditions for bond formation, as in Example 294 except that a different additive was added to the silver paste.
[Preparation of Silver Paste]

A silver paste was prepared using a commercially available silver paste manufactured by TANAKA Kikinzoku Kogyo K.K. (trade name: MH-108A, silver content: 85 wt %). This silver paste contained 75 wt % of a silver powder (particle size: 0.1 to 5 μm), 1 wt % of bismuth borosilicate glass, 5 wt % of ethyl cellulose, 4 wt % of terpineol, and 5 wt % of butyl carbitol acetate. The amount of this silver paste in a wet state was regarded to be 100 wt %, a silver oxide ($Ag_2O$) powder was classified with a sieve having a mesh size of 38 μm (JIS standard 390 mesh), the silver oxide ($Ag_2O$) powder that passed through the sieve was added in an amount of 8 wt %, and the resulting paste was sufficiently kneaded to obtain a silver paste. This was used as a silver paste for bonding of the n-type thermoelectric element.

The amount of a commercially available silver paste manufactured by TANAKA Kikinzoku Kogyo K.K. (trade name: MH-108A, silver content: 85 wt %) in a wet state was regarded to be 100 wt %, an oxide powder ($Ca_{2.7}Bi_{0.3}Ca_{2.7}Co_4O_9$) was classified with a sieve having a mesh size of 38 μm (JIS standard 390 mesh), the oxide powder ($Ca_{2.7}Bi_{0.3}Ca_{2.7}Co_4O_9$) that passed through the sieve was added in an amount of 6 wt %, and the resulting paste was sufficiently kneaded to obtain a silver paste. This was used as a silver paste for bonding of the p-type thermoelectric conversion element.

Test Example 3

For the thermoelectric conversion module in Example 294, the surface of the aluminum oxide substrate was heated to 100 to 500° C. in the air using a plate-type electric furnace, and the opposite end was cooled with a copper jacket in which water of 20° C. was circulating, thus causing a temperature difference.

The extraction electrode (silver sheet) disposed on the high-temperature side of each of the p-type thermoelectric conversion element and the n-type thermoelectric conversion element that were both ends of the thermoelectric conversion module was connected to an electric load device, the current and the voltage were measured while the external load resistance was changed, and thus the internal resistance and the output of the thermoelectric conversion module were obtained.

In this measurement, the current-voltage characteristic is obtained as a straight line, and the absolute value of the slope of the straight line (having a negative value) is the value of the internal resistance of the thermoelectric conversion module.

The output is obtained by multiplying the current and the voltage, and is a quadratic function with respect to the current. The measured values were regressed to a quadratic function, and the maximum value of the quadratic curve obtained from the function was taken as the maximum output.

The thermoelectric conversion module exhibits the maximum output when the external load resistance matches the internal resistance, and even when the regression curve was used to determine the maximum output, the maximum output was obtained at the point where the external load resistance matched the internal resistance.

Figure 12:
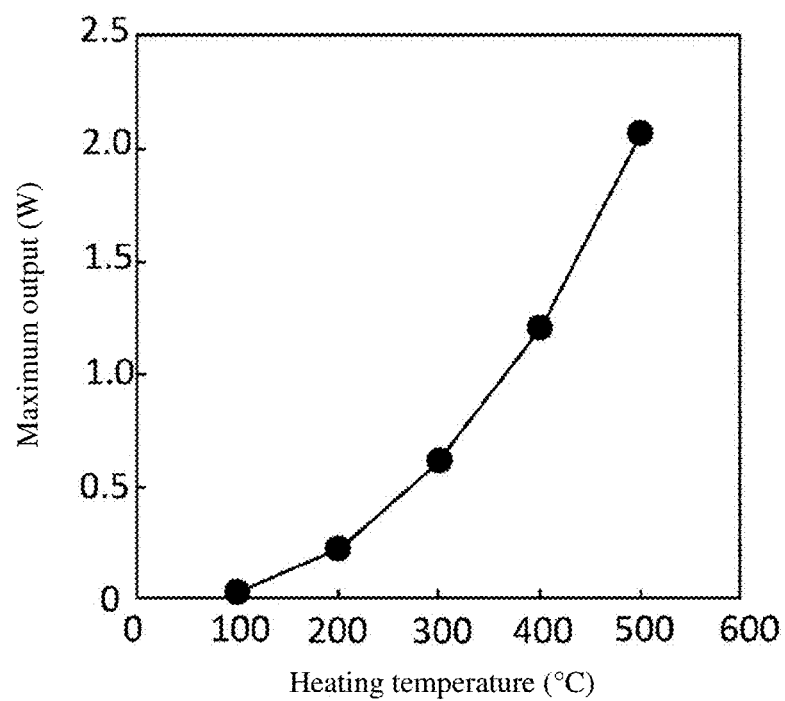
FIG. 12 is a graph showing a relation between the maximum output and the heating temperature in a thermoelectric conversion module in Example 294.

FIG. 12 is a graph showing the relation between the maximum output and the heating temperature in the thermoelectric conversion module in Example 294. In FIG. 12, the vertical axis represents the maximum output, and the horizontal axis represents the heating temperature.

With reference to FIG. 12, the maximum output of the thermoelectric conversion module in Example 294 is about 15 times the maximum output of the thermoelectric conversion module in Example 39 in the temperature range of 100° C. to 500° C., and even in the thermoelectric conversion module having a plurality of pairs of the p-type thermoelectric conversion elements and the n-type thermoelectric conversion elements, good bonding characteristics (electric resistance in the bonding portion) can be obtained between the p-type thermoelectric conversion element and the conductive member and between the n-type thermoelectric conversion element and the conductive member.

In addition, the external load resistance was adjusted so that a current of 1 A was output from the thermoelectric conversion module while the heating temperature was maintained at 500° C., and continuous power generation was performed for about 1,000 hours in the air.

Figure 13:
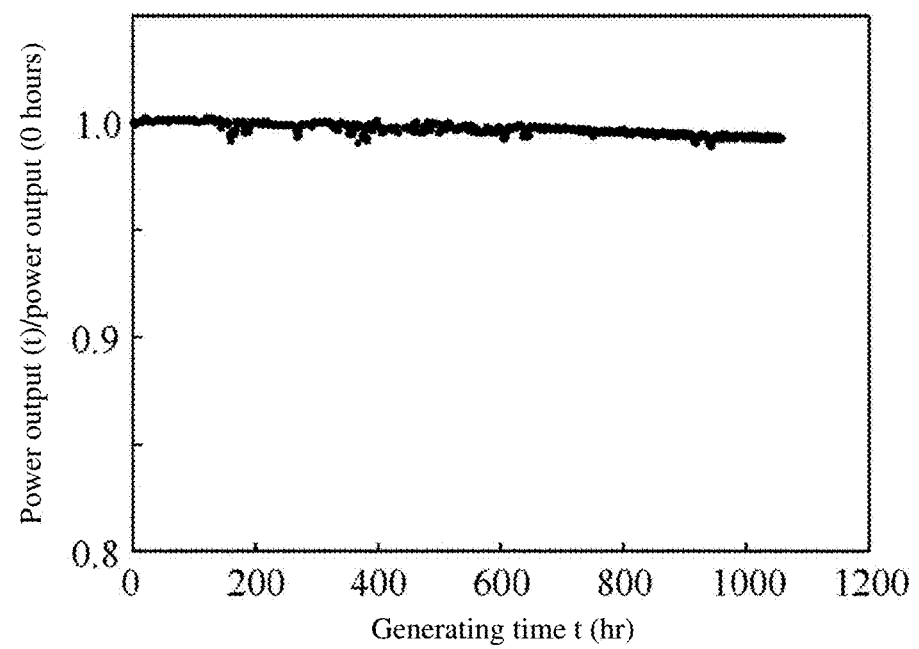
FIG. 13 shows graphs showing relations between the power output and the generating time in a thermoelectric conversion module in Examples 294 and 295.
Figure 13:
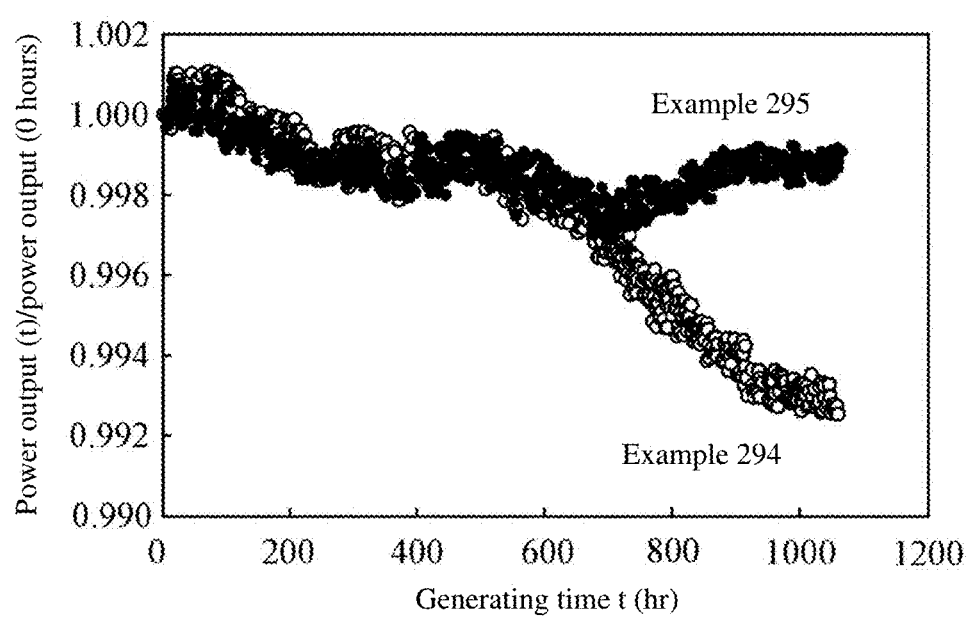

FIG. 13 shows graphs showing relations between the power output and the generating time in the thermoelectric conversion module in Examples 294 and 295. In FIG. 13, the vertical axis represents the ratio of the power output (t) at the time t to the power output (0 hours) at the start of power generation (power output (t)/power output (0 hours)), and the horizontal axis represents the generating time t. FIG. 13(*b*) shows the relations, between the power output and the generating time, in which the vertical axis of FIG. 13(*a*) is enlarged.

With reference to FIG. 13, the ratio (power output (t)/power output (0 hours)) decreased by about 0.7% in Example 294 after a lapse of 1,000 hours, but in Example 295, decreased only by 0.2%. No remarkable deterioration was observed in Examples 294 and 295, but it has been found that a silver paste to which silver oxide is added is more preferably used as a silver paste in the n-type thermoelectric conversion element and that a silver paste to which an oxide powder is added is more preferably used as a silver paste in the p-type thermoelectric conversion element.

Therefore, the thermoelectric conversion module according to an embodiment of the present invention has excellent durability at a high temperature in the air, and has higher power generation efficiency than an oxide thermoelectric module in which high durability has been demonstrated.

From these results, a thermoelectric conversion module using a silver paste to which a specific amount of additive ($Ag_2O$, $TiO_2$, or a thermoelectric conversion material for a p-type thermoelectric conversion element) is added and using an n-type thermoelectric conversion element having a half-Heusler structure has durability equivalent to that of an oxide thermoelectric conversion module having high durability at a high temperature in the air, and has power generation performance superior to that of the oxide thermoelectric conversion module. Therefore, the thermoelectric conversion module according to an embodiment of the present invention can effectively use high temperature exhaust heat from factories, automobiles, and waste incineration plants.

Examples 271 to 295 described above show improvement in the maximum output of the thermoelectric conversion module using an n-type thermoelectric conversion element having a half-Heusler structure represented by the composition formula shown in the formula (2) described above. Meanwhile, similarly to the above improvement, improvement in the maximum output is possible also in the thermoelectric conversion module using an n-type thermoelectric conversion element having a half-Heusler structure represented by the composition formula shown in any one of the formulae (3) to (7) described above. This is because, as shown in Tables 1-1 to 1-3, the n-type thermoelectric conversion elements in Examples 1 to 37 have a larger ZT than the n-type thermoelectric conversion element in Comparative Example 1. Therefore, if there is experimental data showing improvement in the maximum output of the thermoelectric conversion module using an n-type thermoelectric conversion element having a half-Heusler structure represented by the composition formula of the formula (2), those skilled in the art can understand, without experimental data, that improvement in the maximum output is possible also in the thermoelectric conversion module using an n-type thermoelectric conversion element having a half-Heusler structure represented by the composition formula shown in any one of the formulae (3) to (7) described above.

The n-type thermoelectric conversion element having a half-Heusler structure represented by the composition formula of any one of the formulae (2) to (7) is generally represented by the composition formula of the formula (1), and therefore those skilled in the art can understand that the maximum output is improved in the thermoelectric conversion module including an n-type thermoelectric conversion element having a half-Heusler structure represented by the composition formula of the formula (1).

The content of the additive added to the silver paste will be described. Hereinafter, the silver paste used for attachment between the n-type thermoelectric conversion element and the conductive member is denoted by "n-type silver paste", and the silver paste used for attachment between the p-type thermoelectric conversion element and the conductive member is denoted by "p-type silver paste".

Figure 14:
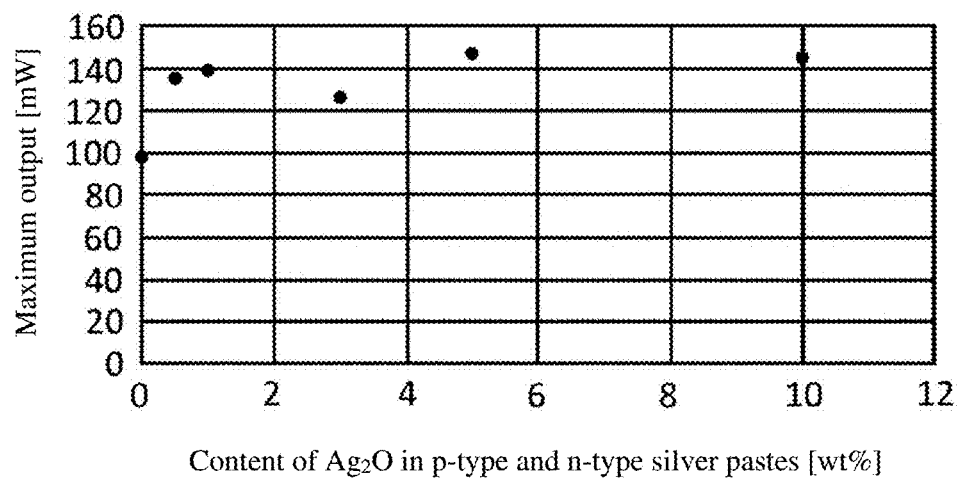
FIG. 14 is a graph showing a relation between the maximum output and the content of $Ag_2O$ added to a p-type silver paste and an n-type silver paste in a thermoelectric conversion module in Examples 38 to 41, 47, and 48.

FIG. 14 is a graph showing the relation between the maximum output and the content of $Ag_2O$ added to the p-type silver paste and the n-type silver paste in the thermoelectric conversion module in Examples 38 to 41, 47, and 48. In FIG. 14, the vertical axis represents the maximum output of the thermoelectric conversion module, and the horizontal axis represents the content of $Ag_2O$ in the p-type silver paste and the n-type silver paste. The p-type silver paste refers to the silver paste for attachment between the p-type thermoelectric conversion element and the conductive member, and the n-type silver paste refers to the silver paste for attachment between the n-type thermoelectric conversion element and the conductive member (the same applies hereinafter).

With reference to FIG. 14, the maximum output is maintained at 126 [mW] or more in the range where the content of $Ag_2O$ is 0.5 [wt %] to 10 [wt %]. Meanwhile, if the content of $Ag_2O$ is 0.0 [wt %], the maximum output is 99 [mW]. Therefore, the maximum output of the thermoelectric conversion module can be improved by using a p-type silver paste and an n-type silver paste to which 0.5 [wt %] to 10 [wt %] of $Ag_2O$ is added. Therefore, in a case where $Ag_2O$ is added to the p-type silver paste and the n-type silver paste, the content of $Ag_2O$ is preferably 0.5 [wt %] to 10 [wt %].

Figure 15:
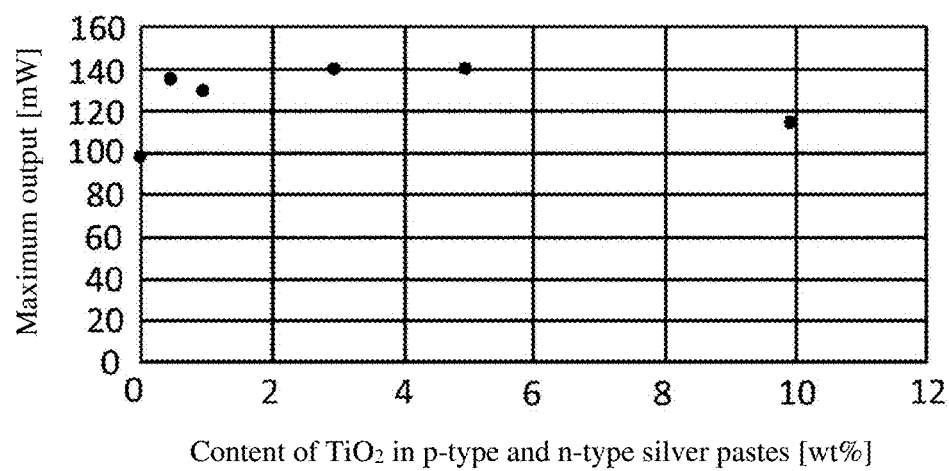
FIG. 15 is a graph showing a relation between the maximum output and the content of $TiO_2$ added to a p-type silver paste and an n-type silver paste in a thermoelectric conversion module in Examples 38, 49 to 51, 57, and 58.

FIG. 15 is a graph showing the relation between the maximum output and the content of $TiO_2$ added to the p-type silver paste and the n-type silver paste in the thermoelectric conversion module in Examples 38, 49 to 51, 57, and 58. In FIG. 15, the vertical axis represents the maximum output of the thermoelectric conversion module, and the horizontal axis represents the content of $TiO_2$ in the p-type silver paste and the n-type silver paste.

With reference to FIG. 15, the maximum output is maintained at 114 [mW] or more in the range where the content of $TiO_2$ is 0.5 [wt %] to 10 [wt %]. Meanwhile, if the content of $TiO_2$ is 0.0 [wt %], the maximum output is 99 [mW]. Therefore, the maximum output of the thermoelectric conversion module can be improved by using a p-type silver paste and an n-type silver paste to which 0.5 [wt %] to 10 [wt %] of $TiO_2$ is added. Therefore, in a case where $TiO_2$ is added to the p-type silver paste and the n-type silver paste, the content of $TiO_2$ is preferably 0.5 [wt %] to 10 [wt %].

Figure 16:
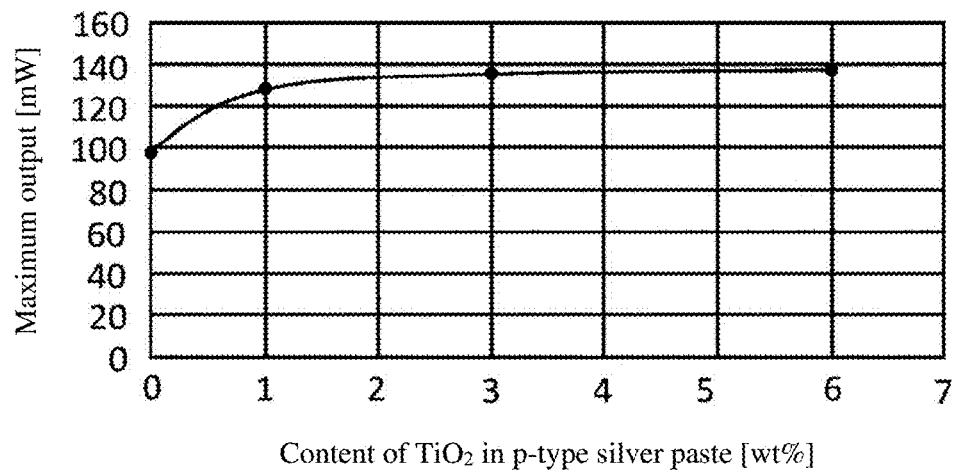
FIG. 16 is a graph showing a relation between the maximum output and the content of $TiO_2$ added to a p-type silver paste in a thermoelectric conversion module in Examples 38, 62, 63, and 69.

FIG. 16 is a graph showing the relation between the maximum output and the content of $TiO_2$ added to the p-type silver paste in the thermoelectric conversion module in Examples 38, 62, 63, and 69. In FIG. 16, the vertical axis represents the maximum output of the thermoelectric conversion module, and the horizontal axis represents the content of $TiO_2$ in the p-type silver paste. To the n-type silver paste, 3 [wt %] of $Ag_2O$ was added.

With reference to FIG. 16, the maximum output is maintained at 128 [mW] or more in the range where the content of $TiO_2$ is 1.0 [wt %] to 6.0 [wt %]. Meanwhile, if the content of $TiO_2$ is 0.0 [wt %], the maximum output is 99 [mW]. Therefore, the maximum output of the thermoelectric conversion module can be improved by maintaining the content of $Ag_2O$ added to the n-type silver paste at 3.0 [wt %] and using a p-type silver paste to which 1.0 [wt %] to 6.0 [wt %] of $TiO_2$ is added. Therefore, in a case where the content of $Ag_2O$ added to the n-type silver paste is maintained at 3.0 [wt %] and $TiO_2$ is added to the p-type silver paste, the content of $TiO_2$ is preferably 1.0 [wt %] to 6.0 [wt %].

If the content of $TiO_2$ is 1.0 [wt %] to 6.0 [wt %], the maximum output of the thermoelectric conversion module is 128 [mW] to 137 [mW]. As the result, adding 1.0 [wt %] of $TiO_2$ gives a rate of increase in the maximum output of 128/99=1.29 times, and in the range where the content of $TiO_2$ is 1.0 [wt %] to 6 [wt %], the rate of increase in the maximum output is 137/128=1.07 times. Therefore, the rate of increase in the maximum output with a content of $TiO_2$ of 1.0 [wt %] to 6.0 [wt %] is smaller than the rate of increase in the maximum output with a content of $TiO_2$ of 1.0 [wt %] or less, and is almost constant. Therefore, the content of $TiO_2$ of 1.0 [wt %] has a critical significance for maintaining the maximum output of the thermoelectric conversion module at an almost constant output of 128 [mW] or more.

Figure 17:
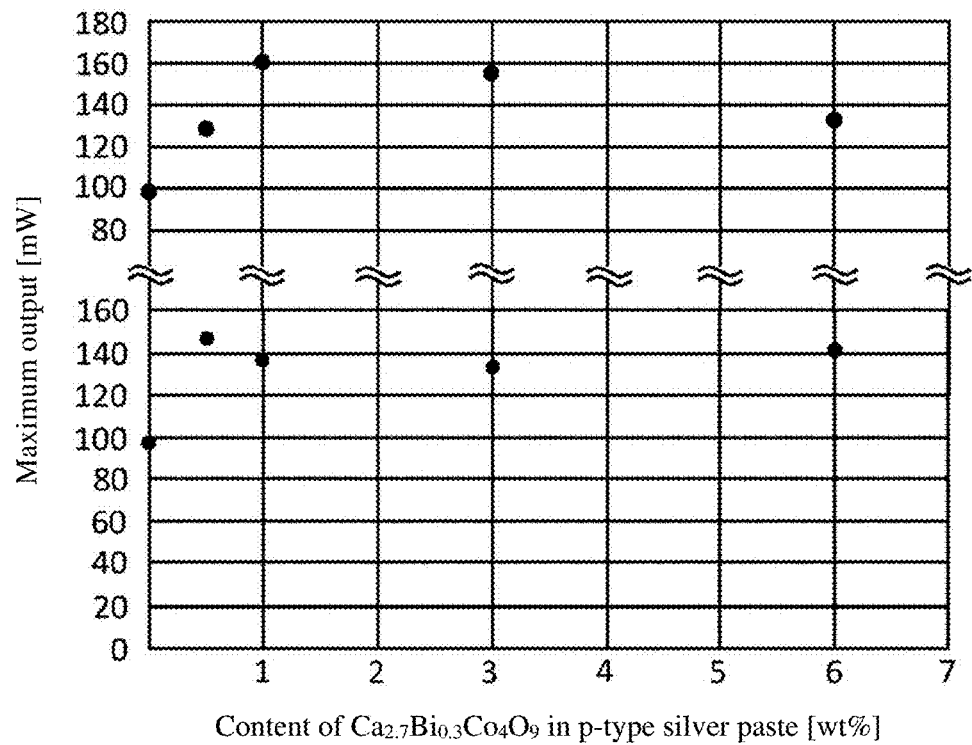
FIG. 17 is a graph showing relations between the maximum output and the content of $Ca_{2.7}Bi_{0.3}Co_4O_9$ added to a p-type silver paste in a thermoelectric conversion module in Examples 38 and 72 to 75 and in a thermoelectric conversion module in Examples 38 and 86 to 89.

FIG. 17 is a graph showing the relations between the maximum output and the content of $Ca_{2.7}Bi_{0.3}Co_4O_9$ added to the p-type silver paste in the thermoelectric conversion module in Examples 38 and 72 to 75 and in the thermoelectric conversion module in Examples 38 and 86 to 89. In FIG. 17, the vertical axis represents the maximum output of the thermoelectric conversion module, and the horizontal axis represents the content of $Ca_{2.7}Bi_{0.3}Co_4O_9$ in the p-type silver paste. In FIG. 17, the relation between the maximum output and the content of $Ca_{2.7}Bi_{0.3}Co_4O_9$ in the lower part indicates the relation between the maximum output and the content of $Ca_{2.7}Bi_{0.3}Co_4O_9$ added to the p-type silver paste in the thermoelectric conversion modules in Examples 38 and 72 to 75, and the relation between the maximum output and the content of $Ca_{2.7}Bi_{0.3}Co_4O_9$ in the upper part indicates the relation between the maximum output and the content of $Ca_{2.7}Bi_{0.3}Co_4O_9$ added to the p-type silver paste in the thermoelectric conversion modules in Examples 38 and 86 to 89. Note that $Ca_{2.7}Bi_{0.3}Co_4O_9$ is an oxide for a p-type thermoelectric conversion element.

With reference to FIG. 17, the maximum output in the thermoelectric conversion modules in Examples 38 and 72 to 75 is maintained at 133 [mW] or more in the range where the content of $Ca_{2.7}Bi_{0.3}Co_4O_9$ is 0.5 [wt %] to 6.0 [wt %]. Meanwhile, if the content of $Ca_{2.7}Bi_{0.3}Co_4O_9$ is 0.0 [wt %], the maximum output is 99 [mW]. Therefore, the maximum output of the thermoelectric conversion module can be improved by maintaining the content of $Ag_2O$ added to the n-type silver paste at 3.0 [wt %] and using a p-type silver paste to which 0.5 [wt %] to 6.0 [wt %] of $Ca_{2.7}Bi_{0.3}Co_4O_9$ is added. Therefore, in a case where the content of $Ag_2O$ added to the n-type silver paste is maintained at 3.0 [wt %] and $Ca_{2.7}Bi_{0.3}Co_4O_9$ is added to the p-type silver paste, the content of $Ca_{2.7}Bi_{0.3}Co_4O_9$ is preferably 0.5 [wt %] to 6.0 [wt %] (see the lower part of FIG. 17).

The maximum output in the thermoelectric conversion modules in Examples 38 and 86 to 89 is maintained at 128 [mW] or more in the range where the content of $Ca_{2.7}Bi_{0.3}Co_4O_9$ is 0.5 [wt %] to 6.0 [wt %]. Meanwhile, if the content of $Ca_{2.7}Bi_{0.3}Co_4O_9$ is 0.0 [wt %], the maximum output is 99 [mW]. Therefore, the maximum output of the thermoelectric conversion module can be improved by maintaining the content of $TiO_2$ added to the n-type silver paste at 3.0 [wt %] and using a p-type silver paste to which 0.5 [wt %] to 6.0 [wt %] of $Ca_{2.7}Bi_{0.3}Co_4O_9$ is added. Therefore, in a case where the content of $TiO_2$ added to the n-type silver paste is maintained at 3.0 [wt %] and $Ca_{2.7}Bi_{0.3}Co_4O_9$ is added to the p-type silver paste, the content of $Ca_{2.7}Bi_{0.3}Co_4O_9$ is preferably 0.5 [wt %] to 6 [wt %] (see the upper part of FIG. 17).

Figure 18:
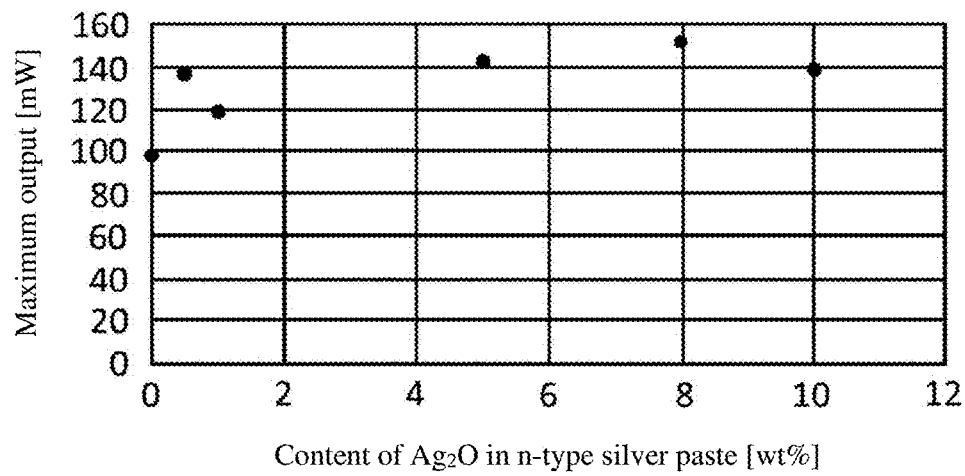
FIG. 18 is a graph showing a relation between the maximum output and the content of $Ag_2O$ added to an n-type silver paste in a thermoelectric conversion module in Examples 38 and 81 to 85.

FIG. 18 is a graph showing the relation between the maximum output and the content of $Ag_2O$ added to the n-type silver paste in the thermoelectric conversion module in Examples 38 and 81 to 85. In FIG. 18, the vertical axis represents the maximum output of the thermoelectric conversion module, and the horizontal axis represents the content of $Ag_2O$ in the n-type silver paste. To the p-type silver paste, 6 [wt %] of $Ca_{2.7}Bi_{0.3}Co_4O_9$ was added.

With reference to FIG. 18, the maximum output is maintained at 119 [mW] or more in the range where the content of $Ag_2O$ is 0.5 [wt %] to 10 [wt %]. Meanwhile, if the content of $Ag_2O$ is 0.0 [wt %], the maximum output is 99 [mW]. Therefore, the maximum output of the thermoelectric conversion module can be improved by maintaining the content of $Ca_{2.7}Bi_{0.3}Co_4O_9$ added to the p-type silver paste at 6.0 [wt %] and using an n-type silver paste to which 0.5 [wt %] to 10 [wt %] of $Ag_2O$ is added. Therefore, in a case where the content of $Ca_{2.7}Bi_{0.3}Co_4O_9$ added to the p-type silver paste is maintained at 6.0 [wt %] and $Ag_2O$ is added to the n-type silver paste, the content of $Ag_2O$ is preferably 0.5 [wt %] to 10 [wt %].

Figure 19:
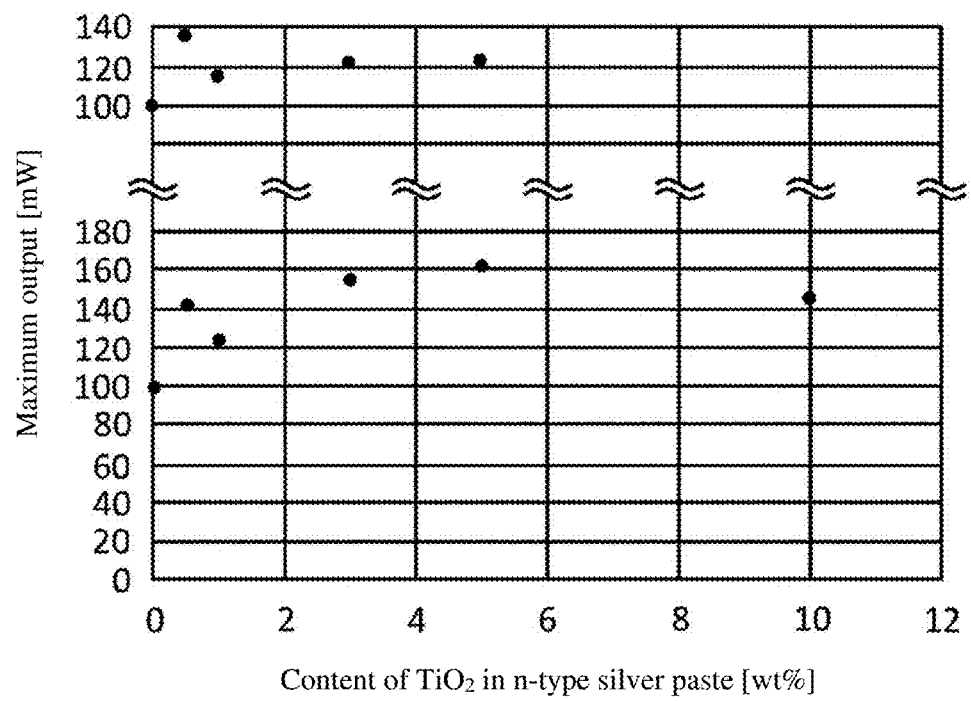
FIG. 19 is a graph showing relations between the maximum output and the content of $TiO_2$ added to an n-type silver paste in a thermoelectric conversion module in Examples 38, 90, and 95 to 98 and in Examples 271 and 288 to 291.

FIG. 19 is a graph showing the relations between the maximum output and the content of $TiO_2$ added to the n-type silver paste in the thermoelectric conversion module in Examples 38, 90, and 95 to 98 and in Examples 271 and 288 to 291. In FIG. 19, the vertical axis represents the maximum output of the thermoelectric conversion module, and the horizontal axis represents the content of $TiO_2$ in the n-type silver paste. The lower part of FIG. 19 represents the relation between the maximum output and the content of $TiO_2$ added to the n-type silver paste in the thermoelectric conversion modules in Examples 38, 90, and 95 to 98 when 6 [wt %] of $Ca_{2.7}Bi_{0.3}Co_4O_9$ is added to the p-type silver paste, and the upper part of FIG. 19 shows the relation between the maximum output and the content of $TiO_2$ added to the n-type silver paste in the thermoelectric conversion modules in Examples 271 and 288 to 291 when 6 [wt %] of $Bi_2Ca_2Co_4O_9$ is added to the p-type silver paste.

With reference to FIG. 19, the maximum output in the thermoelectric conversion modules in Examples 38, 90, and 95 to 98 is maintained at 123 [mW] or more in the range where the content of $TiO_2$ is 0.5 [wt %] to 10 [wt %]. Meanwhile, if the content of $TiO_2$ is 0.0 [wt %], the maximum output is 99 [mW]. Therefore, the maximum output of the thermoelectric conversion module can be improved by maintaining the content of $Ca_{2.7}Bi_{0.3}Co_4O_9$ added to the p-type silver paste at 6.0 [wt %] and using an n-type silver paste to which 0.5 [wt %] to 10 [wt %] of $TiO_2$ is added. Therefore, in a case where the content of $Ca_{2.7}Bi_{0.3}Co_4O_9$ added to the p-type silver paste is maintained at 6.0 [wt %] and $TiO_2$ is added to the n-type silver paste, the content of $TiO_2$ is preferably 0.5 [wt %] to 10 [wt %] (see the lower part of FIG. 19).

The maximum output in the thermoelectric conversion modules in Examples 271 and 288 to 291 is maintained at 114 [mW] or more in the range where the content of $TiO_2$ is 0.5 [wt %] to 5.0 [wt %]. Meanwhile, if the content of $TiO_2$ is 0.0 [wt %], the maximum output is 84.9 [mW]. Therefore, the maximum output of the thermoelectric conversion module can be improved by maintaining the content of $Bi_{02}Ca_2Co_4O_9$ added to the p-type silver paste at 6.0 [wt %] and using an n-type silver paste to which 0.5 [wt %] to 5.0 [wt %] of $TiO_2$ is added. Therefore, in a case where the content of $Bi_{02}Ca_2Co_4O_9$ added to the p-type silver paste is maintained at 6.0 [wt %] and $TiO_2$ is added to the n-type silver paste, the content of $TiO_2$ is preferably 0.5 [wt %] to 5.0 [wt %] (see the upper part of FIG. 19).

Figure 20:
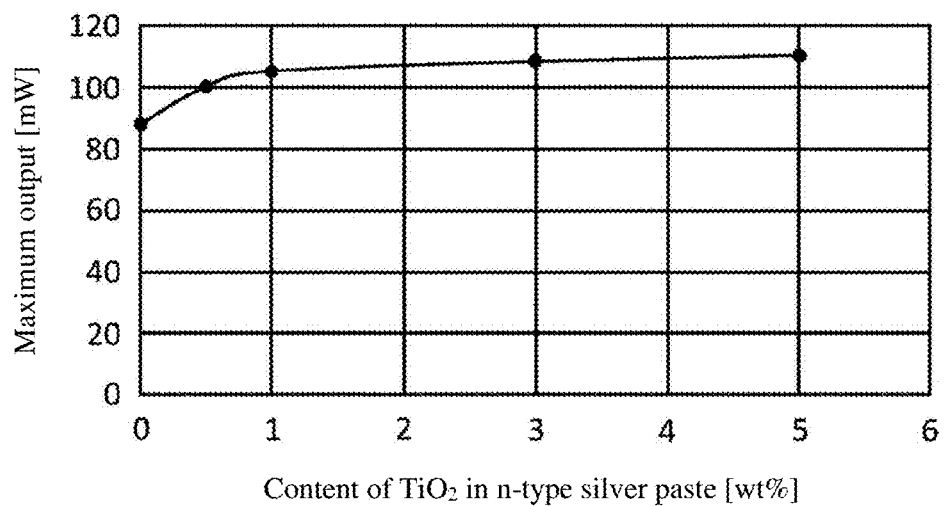
FIG. 20 is a graph showing a relation between the maximum output and the content of $TiO_2$ added to an n-type silver paste in a thermoelectric conversion module in Examples 248 and 265 to 268.

FIG. 20 is a graph showing the relation between the maximum output and the content of $TiO_2$ added to the n-type silver paste in the thermoelectric conversion module in Examples 248 and 265 to 268. In FIG. 20, the vertical axis represents the maximum output of the thermoelectric conversion module, and the horizontal axis represents the content of $TiO_2$ in the n-type silver paste. To the p-type silver paste, 6.0 [wt %] of $Bi_2Sr_2Co_4O_9$ was added.

With reference to FIG. 20, the maximum output is maintained at 114 [mW] or more in the range where the content of $TiO_2$ is 0.5 [wt %] to 5.0 [wt %]. Meanwhile, if the content of $TiO_2$ is 0.0 [wt %], the maximum output is 88 [mW]. Therefore, the maximum output of the thermoelectric conversion module can be improved by maintaining the content of $Bi_{0.2}Ca_2Co_4O_9$ added to the p-type silver paste at 6.0 [wt %] and using an n-type silver paste to which 0.5 [wt %] to 5.0 [wt %] of $TiO_2$ is added. Therefore, in a case where the content of $Bi_{0.2}Ca_2Co_4O_9$ added to the p-type silver paste is maintained at 6.0 [wt %] and $TiO_2$ is added to the n-type silver paste, the content of $TiO_2$ is preferably 0.5 [wt %] to 5.0 [wt %].

As shown in FIG. 20, the rate of increase in the maximum output of the thermoelectric conversion module with a content of $TiO_2$ of 0.5 [wt %] to 5.0 [wt %] is smaller than the rate of increase in the maximum output of the thermoelectric conversion module with a content of $TiO_2$ of 0.5 [wt %] or less, and is almost constant. Therefore, the content of $TiO_2$ of 0.5 [wt %] has a critical significance for maintaining the maximum output of the thermoelectric conversion module at an almost constant output of 100 [mW] or more.

As shown in FIGS. 14 and 15, in the case of changing the content of the additive ($Ag_2O$ or $TiO_2$) added to the n-type silver paste and the p-type silver paste simultaneously, the maximum output of the thermoelectric conversion module can be improved by setting the content of the additive ($Ag_2O$ or $TiO_2$) in the above-described range, as compared with the case where no additive is added to the silver paste.

Furthermore, as shown in FIGS. 16 to 20, the maximum output of the thermoelectric conversion module can be improved by maintaining the content of the additive added to any one of the n-type silver paste and the p-type silver paste at a constant content and setting the content of the additive added to the other silver paste in the above-described range, as compared with the case where no additive is added to the silver paste.

Therefore, the maximum output of the thermoelectric conversion module can be improved by adding any one of $Ag_2O$, $TiO_2$, and $Ca_{2.7}Bi_{0.3}Co_4O_9$ to the silver paste.

The resistivity of the silver paste used in Examples described above will be described. The resistivity of the silver paste was measured with the following method.

(1) Applying silver paste to alumina ($Al_2O_3$) substrate by screen printing (2) Firing silver paste at temperature of 860° C. for 2 hours (3) Measuring resistivity of silver paste with four probe method In measuring the resistivity with a four probe method, four gold-plated probes having a diameter of 1 mmφ were prepared, the four probes were linearly disposed on the silver paste at an interval of 2 mm, a constant current was caused to flow while the current value was changed using the two outer probes (including change of the current polarity), the voltage between the two inner probes was measured, and the slope of the relation between the current and the voltage was measured as the resistivity of the silver paste.

The resistivity was measured with the above-described measurement method for a silver paste to which no additive was added (silver paste with the trade name of MH-108A), a silver paste to which $Ag_2O$ was added (silver paste obtained by adding $Ag_2O$ to a silver paste with the trade name of MH-108A), a silver paste to which $TiO_2$ was added (silver paste obtained by adding $TiO_2$ to a silver paste with the trade name of MH-108A), a silver paste to which $Ca_{2.7}Bi_{0.3}Co_4O_9$ was added (silver paste obtained by adding $Ca_{2.7}Bi_{0.3}Co_4O_9$ to a silver paste with the trade name of MH-108A), and a silver paste to which $Ag_2O$ and $TiO_2$ were added (silver paste obtained by adding $Ag_2O$ and $TiO_2$ to a silver paste with the trade name of MH-108A). Table 5 shows the results.

TABLE 5

| Additive | Content of additive [wt %] | Thickness of silver paste [μm] | Width of silver paste [mm] | Resistivity [μΩcm] |
|---|---|---|---|---|
| $Ag_2O$ | 0.0 | 40 | 1.880 | 2.86 |
|  | 0.5 | 41 | 1.885 | 2.65 |
|  | 10 | 43 | 1.806 | 2.66 |
| $TiO_2$ | 0.0 | 40 | 1.880 | 2.86 |
|  | 0.5 | 38 | 1.973 | 2.90 |
|  | 8.0 | 95 | 1.858 | 12.8 |
| $Ca_{2.7}Bi_{0.3}Co_4O_9$ | 0.0 | 40 | 1.880 | 2.86 |
|  | 0.5 | 37 | 1.847 | 2.97 |
|  | 10 | 51 | 2.038 | 5.58 |
| $Ag_2O$ + $TiO_2$ | 0.5 / 0.5 | 41 | 1.881 | 2.77 |
| $Ag_2O$ + $TiO_2$ | 1.5 / 1.5 | 40 | 1.882 | 3.33 |
| $Ag_2O$ + $TiO_2$ | 2.0 / 1.0 | 41 | 1.880 | 2.93 |

The resistivity of the silver paste shown in Table 5 for each additive of $Ag_2O$ and $Ca_{2.7}Bi_{0.3}Co_4O_9$ is the average resistivity of four samples prepared at each content of 0, 0.5, and 10 wt %, the resistivity for the additive of $TiO_2$ is the average resistivity of four samples prepared at each content of 0, 0.5, and 8 wt %, and the resistivity for the additive of $Ag_2O$ and $TiO_2$ is the average resistivity of four samples prepared at each content of ($Ag_2O$, $TiO_2$)=(0.5 wt %, 0.5 wt %), (1.5 wt %, 1.5 wt %), and (2.0 wt %, 1.0 wt %). The thickness and the width of the silver paste in each sample are as shown in Table 5.

As described in FIGS. 19 and 20, the preferred content of $Ag_2O$ is 0.2 [wt %] to 10 [wt %], and the preferred content of $TiO_2$ is 0.14 [wt %] to 10 [wt %], and as described in FIG. 17, the preferred content of $Ca_{2.7}Bi_{0.3}Co_4O_9$ is 0.12 [wt %] to 6 [wt %]. Therefore, in the case of adding one additive in Table 5, the addition amount of each of $Ag_2O$ and $Ca_{2.7}Bi_{0.3}Co_4O_9$ was set to 0.5 [wt %] and 10 [wt %], and the addition amount of $TiO_2$ was set to 0.5 [wt %] and 8 [wt %]. In the case of adding two additives, the addition amounts of $Ag_2O$ and $TiO_2$ were set to ($Ag_2O$, $TiO_2$)=(0.5 wt %, 0.5 wt %), (1.5 wt %, 1.5 wt %), and (2.0 wt %, 1.0 wt %).

With reference to Table 5, the silver pastes used in Examples have a resistivity in the range of 2.60 μΩcm to 13.0 μΩcm. The resistivity of the silver paste is decreased by adding $Ag_2O$, and is increased by adding $TiO_2$ or $Ca_{2.7}Bi_{0.3}Co_4O_9$. Thus, the resistivity of the silver paste is decreased or increased by adding $Ag_2O$ and $TiO_2$ according to the contents of $Ag_2O$ and $TiO_2$. However, with reference to Examples described above, it has been found that the maximum output of the thermoelectric conversion module can be improved by using a silver paste having a resistivity in the range of 2.60 μΩcm to 13.0 μΩcm. Therefore, the silver paste used in the thermoelectric conversion module is to have a resistivity in the range of 2.60 μΩcm to 13.0 μΩcm.

In Examples described above, the silver paste disposed between the n-type thermoelectric conversion element and the conductive member is the "first silver paste", and the silver paste disposed between the p-type thermoelectric conversion element and the conductive member is the "second silver paste".

DESCRIPTION OF REFERENCE SIGNS 1, 12, 290, 430: Insulating substrate
2, 3, 11, 102 to 116, 271 to 286, 301 to 315, 412 to 425: Conductive member
4, 5, 8, 9, 191 to 222, 231 to 262, 351 to 310: Connection layer
6, 123, 124, 127, 128, 131, 132, 135, 136, 139, 140, 143, 144, 147, 148, 151, 152, 155, 156, 159, 160, 163, 164, 167, 168, 171, 172, 175, 176, 179, 180, 183, 184, 322, 324, 326, 328, 330, 332, 334, 336, 338, 340, 342, 344, 346, 348, 350: n-Type thermoelectric conversion element
7, 121, 122, 125, 126, 129, 130, 133, 134, 137, 138, 141, 142, 145, 146, 149, 150, 153, 154, 157, 158, 161, 162, 165, 166, 169, 170, 173, 174, 177, 178, 181, 182, 321, 323, 325, 327, 329, 331, 333, 335, 337, 339, 341, 343, 345, 347, 349: p-Type thermoelectric conversion element
10, 100, 300: Thermoelectric conversion module
101, 117, 411, 426: Extraction electrode

The invention claimed is:

1. A thermoelectric conversion module comprising:
an n-type thermoelectric conversion element having a half-Heusler structure with a negative Seebeck coefficient;
a p-type thermoelectric conversion element comprising an oxide having a positive Seebeck coefficient at a temperature of 25° C. or higher;
a conductive member connecting one end of the n-type thermoelectric conversion element and one end of the p-type thermoelectric conversion element electrically;
a connection layer comprising a conductive metal comprising silver, the connection layer interposed between the n-type thermoelectric conversion element and the conductive member; and
a connection layer comprising a conductive metal comprising silver, the connection layer interposed between the p-type thermoelectric conversion element and the conductive member, wherein
the conductive member is connected to the n-type thermoelectric conversion element via the connection layer interposed between the n-type thermoelectric conversion element and the conductive member and is connected to the p-type thermoelectric conversion element via the connection layer interposed between the p-type thermoelectric conversion element and the conductive member, and
the connection layer interposed between the n-type thermoelectric conversion element and the conductive member and/or the connection layer interposed between the p-type thermoelectric conversion element and the conductive member further comprise an oxide so as to reduce a bond resistance between the n-type thermoelectric conversion element and the connection layer interposed between the n-type thermoelectric conversion element and the conductive member and/or between the p-type thermoelectric conversion element and the connection layer interposed between the p-type thermoelectric conversion element and the conductive member,
wherein the p-type thermoelectric conversion element is represented by $Ca_{3-j}Bi_jCo_4O_9$, wherein $0.0 \leq j \leq 0.5$; and the n-type thermoelectric conversion element is represented by: $A_xB_yNiSn$, wherein A is Ti or Zr, B is at least one of Hf or Zr when A is Ti and is at least one of Hf or Ti when A is Zr, and wherein $0.5 \leq x \leq 1$ and $0.0 \leq y \leq 0.5$.

2. The thermoelectric conversion module according to claim 1, wherein the oxide included in the connection layer interposed between the p-type thermoelectric conversion element and the conductive member is at least one of titanium oxide or silver oxide, or is the oxide included in the p-type thermoelectric conversion element.

3. The thermoelectric conversion module according to claim 1, wherein the oxide included in the connection layer interposed between the n-type thermoelectric conversion element and the conductive member is at least one of titanium oxide or silver oxide.

4. The thermoelectric conversion module according to claim 1, wherein the connection layer interposed between the n-type thermoelectric conversion element and the conductive member and the connection layer interposed between the p-type thermoelectric conversion element and the conductive member comprise a sintered body of a silver powder.

5. The thermoelectric conversion module according to claim 1, wherein the connection layer interposed between the n-type thermoelectric conversion element and the conductive member and the connection layer interposed between the p-type thermoelectric conversion element and the conductive member comprise the oxide so as to have a resistivity of 2.60 μΩcm to 13.0 μΩcm as measured with a four probe method.

6. The thermoelectric conversion module according to claim 1, wherein a plane, in the p-type thermoelectric conversion element, parallel to a surface in contact with the conductive member has a larger area than a plane, in the n-type thermoelectric conversion element, parallel to a surface in contact with the conductive member.

7. The thermoelectric conversion module according to claim 1, wherein the conductive member comprises a metal substrate or a conductive ceramic substrate.

8. The thermoelectric conversion module according to claim 7, wherein the metal substrate comprises gold, silver, or platinum.

9. The thermoelectric conversion module according to claim 1, wherein the n-type thermoelectric conversion element is represented by $Ti_{0.75}Hf_{0.25}NiSn$ and the p-type thermoelectric conversion element is represented by $Ca_{2.7}Bi_{0.3}Co_4O_9$.

10. The thermoelectric conversion module according to claim 1, wherein the width:length:height dimensions of the n-type thermoelectric conversion element are 2.0:3.5:5.0 and the width:length:height dimensions of the p-type thermoelectric conversion are 5.0:3.5:5.0.

11. A thermoelectric conversion module comprising:
an n-type thermoelectric conversion element having a half-Heusler structure with a negative Seebeck coefficient;
a p-type thermoelectric conversion element comprising an oxide having a positive Seebeck coefficient at a temperature of 25° C. or higher;
a conductive member connecting one end of the n-type thermoelectric conversion element and one end of the p-type thermoelectric conversion element electrically;
a connection layer comprising a conductive metal comprising silver, the connection layer interposed between the n-type thermoelectric conversion element and the conductive member; and
a connection layer comprising a conductive metal comprising silver, the connection layer interposed between the p-type thermoelectric conversion element and the conductive member, wherein the conductive member is connected to the n-type thermoelectric conversion element via the connection layer interposed between the n-type thermoelectric conversion element and the conductive member and is connected to the p-type thermoelectric conversion element via the connection layer interposed between the p-type thermoelectric conversion element and the conductive member, and the connection layer interposed between the n-type thermoelectric conversion element and the conductive member and/or the connection layer interposed between the p-type thermoelectric conversion element and the conductive member further comprise an oxide so as to reduce a bond resistance between the n-type thermoelectric conversion element and the connection layer interposed between the n-type thermoelectric conversion element and the conductive member and/or between the p-type thermoelectric conversion element and the connection layer interposed between the p-type thermoelectric conversion element and the conductive member, wherein the oxide included in the connection layer interposed between the p-type thermoelectric conversion element and the conductive member is at least one of titanium oxide or silver oxide, wherein the titanium oxide is $TiO_2$ and wherein the silver oxide is $Ag_2O$.

12. The thermoelectric conversion module according to claim 11, wherein:

the p-type thermoelectric conversion element is represented by $Ca_{3-j}Bi_jCo_4O_9$, wherein $0.0 \leq j \leq 0.5$.

13. The thermoelectric conversion module according to claim 11, wherein:

the p-type thermoelectric conversion element is represented by:

$Bi_{2.0+k}M_{2.0+m}Co_2O_9$ wherein M is at least one of Ca or Sr, $-0.2 \leq k \leq 0.2$, and $-0.2 \leq m \leq 0.2$.

14. The thermoelectric conversion module according to claim 11, wherein the oxide included in the connection layer interposed between the n-type thermoelectric conversion element and the conductive member is at least one of titanium oxide or silver oxide.

15. The thermoelectric conversion module according to claim 11, wherein:

the n-type thermoelectric conversion element is represented by:

$A_xB_yNiSn$ wherein A is Ti or Zr, B is at least one of Hf or Zr when A is Ti, and is at least one of Hf or Ti when A is Zr, and wherein $0.5 \leq x \leq 1$ and $0.0 \leq y \leq 0.5$.

16. The thermoelectric conversion module according to claim 11, wherein the connection layer interposed between the n-type thermoelectric conversion element and the conductive member and the connection layer interposed between the p-type thermoelectric conversion element and the conductive member comprise a sintered body of a silver powder.

17. The thermoelectric conversion module according to claim 11, wherein the connection layer interposed between the n-type thermoelectric conversion element and the conductive member and the connection layer interposed between the p-type thermoelectric conversion element and the conductive member comprise the oxide so as to have a resistivity of 2.60 μΩcm to 13.0 μΩcm as measured with a four probe method.

18. The thermoelectric conversion module according to claim 11, wherein a plane, in the p-type thermoelectric conversion element, parallel to a surface in contact with the conductive member has a larger area than a plane, in the n-type thermoelectric conversion element, parallel to a surface in contact with the conductive member.

19. The thermoelectric conversion module according to claim 11, wherein the conductive member comprises a metal substrate or a conductive ceramic substrate.

20. The thermoelectric conversion module according to claim 19, wherein the metal substrate comprises gold, silver, or platinum.

* * * * *

UNITED STATES PATENT AND TRADEMARK OFFICE
CERTIFICATE OF CORRECTION

PATENT NO. : 12,102,007 B2
APPLICATION NO. : 17/759843
DATED : September 24, 2024
INVENTOR(S) : Ryoji Funahashi It is certified that error appears in the above-identified patent and that said Letters Patent is hereby corrected as shown below:

In the Specification

In Column 13, Line 14, delete "$Zr_{1-a}Ti_aNiSn$" and insert --$Zr_{1-d}Ti_dNiSn$--.

In Column 20, Line 35, delete "is Ti:Hf:Ni Sn" and insert --is Ti:Hf:Ni:Sn--.

In Column 25, Line 64, delete "$Zr_{1-e-f}Ti_cHf_fNiSn$" and insert --$Zr_{1-e-f}Ti_eHf_fNiSn$--.

In Column 28, Line 46, delete "oxide ($CO_3O_4$) were" and insert --oxide ($Co_3O_4$) were--.

In the Claims

In Column 75, Claim 12, Line 33 (Approx.), delete "$Ca^{3-j}Bi_jCo_4O_9$," and insert --$Ca_{3-j}Bi_jCo_4O_9$,--.

Signed and Sealed this
Twenty-fourth Day of December, 2024

Derrick Brent
*Acting Director of the United States Patent and Trademark Office*